United States Patent
Tada et al.

(10) Patent No.: US 9,029,825 B2
(45) Date of Patent: May 12, 2015

(54) SEMICONDUCTOR DEVICE AND MANUFACTURING METHOD FOR SEMICONDUCTOR DEVICE

(75) Inventors: Munehiro Tada, Tokyo (JP); Makoto Miyamura, Tokyo (JP); Hiromitsu Hada, Tokyo (JP)

(73) Assignee: NEC Corporation, Tokyo (JP)

(*) Notice: Subject to any disclaimer, the term of this patent is extended or adjusted under 35 U.S.C. 154(b) by 63 days.

(21) Appl. No.: 13/704,223

(22) PCT Filed: Jun. 14, 2011

(86) PCT No.: PCT/JP2011/063567
§ 371 (c)(1),
(2), (4) Date: Dec. 13, 2012

(87) PCT Pub. No.: WO2011/158821
PCT Pub. Date: Dec. 22, 2011

(65) Prior Publication Data
US 2013/0082231 A1    Apr. 4, 2013

(30) Foreign Application Priority Data
Jun. 16, 2010   (JP) .................. 2010-137369

(51) Int. Cl.
*H01L 47/00* (2006.01)
*H01L 45/00* (2006.01)
(Continued)

(52) U.S. Cl.
CPC ........ *H01L 45/1253* (2013.01); *G11C 13/0007* (2013.01); *G11C 13/0014* (2013.01); *G11C 13/003* (2013.01); *G11C 13/0069* (2013.01); *G11C 2013/0073* (2013.01);
(Continued)

(58) Field of Classification Search
CPC . H01L 45/1675; H01L 45/1233; H01L 27/85; H01L 27/2472; H01L 27/2463
USPC ............................................. 257/4
See application file for complete search history.

(56) References Cited

U.S. PATENT DOCUMENTS 7,978,499 B2    7/2011  Hosono et al.
2004/0174732 A1*  9/2004  Morimoto .................. 365/148
(Continued)

FOREIGN PATENT DOCUMENTS

JP   2004-272975 A   9/2004
JP   2006-140224 A   6/2006
(Continued)

OTHER PUBLICATIONS

International Patent Application Publication No. PCT/JP2011/063567 dated Aug. 23, 2011 (English Translation Thereof).
(Continued)

*Primary Examiner* — Long K Tran
(74) *Attorney, Agent, or Firm* — McGinn IP Law Group, PLLC

(57) ABSTRACT

A semiconductor device includes multilayer interconnects and two variable resistance elements (22a, 22b) that are provided among the multilayer interconnects and that include first electrodes (5), second electrodes (10a, 10b), and variable resistance element films (9a, 9b) that are each interposed between first electrodes (5) and respective second electrodes (10a, 10b). Either the first electrodes (5) or the second electrodes (10a, 10b) of the two variable resistance elements (22a, 22b) are unified.

18 Claims, 27 Drawing Sheets

(51) Int. Cl.
*G11C 13/00* (2006.01)
*H01L 23/532* (2006.01)
*H01L 27/10* (2006.01)
*H01L 27/24* (2006.01)

(52) U.S. Cl.
CPC ....... *H01L 23/53238* (2013.01); *H01L 27/101* (2013.01); *H01L 27/2436* (2013.01); *H01L 45/085* (2013.01); *H01L 45/1233* (2013.01); *H01L 45/146* (2013.01); *H01L 45/16* (2013.01); *H01L 45/1266* (2013.01); *H01L 45/1675* (2013.01); *H01L 27/2472* (2013.01); *H01L 2924/0002* (2013.01)

(56) References Cited

U.S. PATENT DOCUMENTS

| | | | |
|---|---|---|---|
| 2006/0098473 | A1 | 5/2006 | Yasuda |
| 2008/0025070 | A1 | 1/2008 | Horii et al. |
| 2008/0170428 | A1 | 7/2008 | Kinoshita |
| 2009/0166603 | A1* | 7/2009 | Lung ................................ 257/4 |
| 2009/0309088 | A1* | 12/2009 | Sakamoto ........................ 257/2 |
| 2009/0321711 | A1 | 12/2009 | Takagi et al. |
| 2010/0065807 | A1 | 3/2010 | Takagi et al. |

FOREIGN PATENT DOCUMENTS

| | | |
|---|---|---|
| JP | 2008-034057 A | 2/2008 |
| JP | 2009/105383 A | 5/2009 |
| JP | 2009/260052 A | 11/2009 |
| JP | 2010-092568 A | 4/2010 |
| WO | WO2007/023569 A1 | 3/2007 |
| WO | WO2008/047530 A1 | 4/2008 |
| WO | WO2008/062734 A1 | 5/2008 |
| WO | WO2008/149808 A1 | 12/2008 |
| WO | WO2009/084514 A1 | 7/2009 |

OTHER PUBLICATIONS

Shunichi Kaeriyama et al., "A Nonvolatile Programmable Solid-Electrolyte Nanometer Switch," IEEE Journal of Solid-State Circuits, vol. 40, No. 1, pp. 168-176, Jan. 2005.

Japanese Office Action dated Mar. 24, 2015, with a partial English translation.

* cited by examiner

SEMICONDUCTOR DEVICE AND MANUFACTURING METHOD FOR SEMICONDUCTOR DEVICE

TECHNICAL FIELD

The present invention relates to a semiconductor device and a manufacturing method for the semiconductor device, and more particularly relates to a semiconductor device that has variable resistance-type nonvolatile elements (hereinbelow referred to as variable resistance elements) and to a manufacturing method of the semiconductor device.

BACKGROUND ART

The greater integration and lower power consumption of semiconductor devices (in particular, silicon devices) has advanced due to miniaturization (scaling law: Moore's law), and the development of greater integration and lower power consumption has been advancing at a pace of quadrupling every three years. In recent years, MOSFETs (Metal Oxide Semiconductor Field-Effect Transistors) having a gate length of just 20 nm and less have been achieved, but due to the increase in prices of lithographic processes (prices of apparatus and mask set prices) and the physical limits of device dimensions (operational limits and variation limits), improvements in device performance are now being sought by approaches that differ from the scaling law that has served to present.

In recent years, rewritable programmable logic devices referred to as FPGA (Field Programmable Gate Array) have been developed as an intermediate rank between gate arrays and standard cells. FPGA enable clients themselves to implement any circuit configuration after manufacture of the chip. FPGA have variable resistance elements and are arranged to enable clients themselves to electrically connect any interconnects. The use of a semiconductor device in which an FPGA of this type is mounted enables an improvement in the degree of freedom of circuits. Variable resistance elements include ReRAM (Resistance Random Access Memory) that uses transition-metal oxides or NanoBridge (NEC trademark) that uses ion-conductors.

The operation characteristics of a variable resistance element include two types: unipolar and bipolar. The resistance of a unipolar variable resistance element is changed by the applied voltage level regardless of the polarity of the applied voltage. The resistance of a bipolar variable resistance element is changed by the applied voltage level and the polarity of the applied voltage. A bipolar variable resistance element can be used in ReRAM and NanoBridge (trademark), and a unipolar variable resistance element can be used in ReRAM.

First, regarding the operation of a unipolar variable resistance element, FIGS. 1A-1D show the operation characteristics of a unipolar variable resistance element. Here, the unipolar variable resistance element is of a configuration that includes a first electrode, a second electrode, and a variable resistance element that is interposed between these two electrodes.

When a positive voltage is applied to the first electrode, the variable resistance element transitions from the OFF state to the ON state with a desired set voltage as a threshold voltage, as shown in FIG. 1A. The OFF state signifies a state in which the resistance value between the two electrodes is high (high resistance state), and the ON state signifies a state in which the resistance value between the two electrodes is low (low resistance state). The threshold voltage depends on factors such as the film thickness, the composition, and density of the variable resistance layer.

Next, when a positive voltage is again applied to the first electrode in the variable resistance element in the ON state, the variable resistance element transitions from the ON state to the OFF state at a desired threshold voltage (reset voltage), as shown in FIG. 1B. When the application of the positive voltage is further continued to the first electrode, a set voltage is attained and the variable resistance element again transitions from the OFF state to the ON state.

On the other hand, when a negative voltage is applied to the first electrode, the variable resistance element transitions from the OFF state (high resistance state) to the ON state (low resistance state) with a desired set voltage as the threshold voltage, as shown in FIG. 1C. If a negative voltage is again applied to the first electrode in the variable resistance element in the ON state, the variable resistance element transitions from the ON state to the OFF state at a desired threshold voltage (reset voltage), as shown in FIG. 1D.

The operation of this variable resistance element in FIGS. 1A-1B is thus symmetrical to the operation of FIGS. 1C-1D, and a resistance-change characteristic is exhibited that depends only on the level of the voltage and that does not depend on the application direction (polarity) of the voltage. This type of element is defined as a unipolar variable resistance element.

Next, regarding the operation of a bipolar variable resistance element, FIGS. 2A-2D show the operation characteristics of a bipolar variable resistance element. Here, for the sake of comparison, the configuration of the bipolar variable resistance element is similar to that of the unipolar variable resistance element described hereinabove, and the voltage-current characteristic is shown when the same voltage is applied to the bipolar variable resistance element as in the case of the unipolar variable resistance element.

When a positive voltage is applied to the first electrode, the variable resistance element transitions from the OFF state (high resistance state) to the ON state (low resistance state) with a desired set voltage as the threshold voltage, as shown in FIG. 2A. Next, when a positive voltage is again applied to the first electrode in the variable resistance element in the ON state, the variable resistance element exhibits an ohmic current-voltage characteristic as shown in FIG. 2B without the occurrence of a change in resistance that was seen in the unipolar variable resistance element.

On the other hand, when a negative voltage is applied to the first electrode (FIG. 2C), the variable resistance element transitions from the ON state (low resistance state) to the OFF state (high resistance state) with a desired set voltage as the threshold voltage. Next, when a positive voltage is again applied to the first electrode in the variable resistance element that is in the OFF state, the variable resistance element transitions from the OFF state to the ON state at a desired threshold voltage (set voltage) as shown in FIG. 2D.

This variable resistance element thus transitions from the OFF state to the ON state only when positive voltage is applied to the first electrode and exhibits a transition from the ON state to the OFF state only when a negative voltage is applied to the first electrode. This type of element is defined as a bipolar variable resistance element.

The electrodes that are used in a bipolar variable resistance element are defined as follows. As described in FIGS. 2A-2D, the electrode that transitions from the OFF state to the ON state when a positive voltage is applied is defined as the "first electrode" or the "active electrode." In contrast, the electrode that transitions from the ON state to the OFF state when a positive voltage is applied is defined as the "second electrode" of the "inactive electrode."

Based on the above-described definitions of electrodes, the modes of connection of the electrodes when two variable resistance elements are connected in series are defined as follows. When electrically interconnecting two variable resistance elements, "interconnection of electrodes of the same polarity" is defined as electrically connecting together the active electrodes or the inactive electrodes, or alternatively, unifying these two electrodes.

On the other hand, "connection of electrodes of different polarities" is defined as a mode of connecting electrodes in which the active electrode of one variable resistance element is connected to the inactive electrode of the other variable resistance element.

An example of a bipolar variable resistance element having a high potential of exhibiting the above-described characteristics is disclosed in Non-Patent Document 1. Non-Patent Document 1 discloses a switching element that uses electrochemical reactions and metal ion movement in an ion conductor (a solid that allows free movement of ions through the application of an electric field). The switching element disclosed in Non-Patent Document 1 is of a configuration having an ionic conduction layer, and a first electrode and a second electrode provided opposite each other with the ionic conduction layer interposed. Of this configuration, the first electrode serves the role of supplying metal ions to the ion-conduction layer. Metal ions are not supplied to the ion-conduction layer from the second electrode.

The operation of this switching element is next described simply. When a negative voltage is applied to the second electrode with the first electrode grounded, the metal of the first electrode becomes metal ions and dissolves into the ionic conduction layer. The metal ions in the ionic conduction layer then become metal in the ionic conduction layer and precipitate, and a metal bridge that connects the first electrode and second electrodes is formed by the precipitated metal. The switch enters the ON state through the electrical connection of the first electrode and the second electrode by the metal bridge. On the other hand, when a positive voltage is applied to the second electrode with the first electrode grounded in the above-described ON state, a portion of the metal bridge is cut, whereby the electrical connection between the first electrode and the second electrode is cut, and the switch enters the OFF state. The electrical characteristics undergo changes starting from the stage preceding the complete cutting of the electrical connection with the resistance between the first electrode and the second electrode becoming great and the inter-electrode capacitance changing, finally culminating in the cutting of the electrical connection. To alter from the above-described OFF state to the ON state, a negative voltage should again be applied to the second electrode with the first electrode grounded.

Non-Patent Document 1 discloses a configuration and operation for the case of a two-terminal switching element in which two electrodes are arranged with an ionic conduction layer interposed between them and in which the conductive state between these electrodes is controlled.

This type of switching element features smaller size and lower ON resistance than a semiconductor switch (such as a MOSFET). As a result, this switching element is believed to hold promise as a switch applicable to programmable logic devices. In addition, because the conduction state (ON or OFF) in this switching element is maintained even when the applied voltage is turned off, it can also be considered that this switching element is applied to a nonvolatile memory element. For example, taking as a basic unit a memory cell that includes one selection element such as a transistor and one switching element, these memory cells are arranged aligned in a plurality of rows in each of the vertical and horizontal directions. By means of this arrangement, any memory cell can be selected from among the plurality of memory cells by word lines and bit lines. A nonvolatile memory can then be realized that can sense the conduction state of the switching element of the selected memory cell and read from the ON or OFF state of the switching element which information, "1" or "0," is stored.

The above-described. Non-Patent Document 1 is shown below.

LITERATURE OF THE PRIOR ART

Non-Patent Documents

Non-Patent Document 1: Shunichi Kaeriyama et al., "A Nonvolatile Programmable Solid-Electrolyte Nanometer Switch," IEEE Journal of Solid-State Circuits, Vol. 40, No. 1, pp. 168-176, January 2005.

SUMMARY OF THE INVENTION

When the above-described two-terminal variable resistance element is provided on the same substrate as a semiconductor element, the number of years of guaranteed operation that is required of a typical element is equal to that of the semiconductor element: ten years or more. However, in a two-terminal variable resistance element, the problem of malfunctioning in which the element transitions to another state due to deterioration with the passage of time occurs even when the voltage applied is no greater than the threshold value. The problem resulting from this malfunctioning is referred to as a disturb fault.

A disturb fault is next described using a specific example. For example, in order to transition from the OFF state to the ON state in FIG. 2A, a voltage equal to or greater than the set voltage (threshold voltage) must be applied to the variable resistance element. It is here assumed that the threshold voltage is 5V. In addition, the typical ULSI operating voltage is in the neighborhood of 0.9-1.2V. Despite the application of voltage of approximately 1V as the ULSI operating voltage to a variable resistance element that has transitioned to the OFF state at the time of starting use of the semiconductor device, the variable resistance element does not transition from the OFF state to the ON state. Nevertheless, malfunctioning occurs in which a variable resistance element in the OFF state to which a voltage of approximately 1V is continuously applied transitions from the OFF state to the ON state due to deterioration with the passage of time that is less than the guaranteed number of years of the semiconductor element (for example, about 5 years).

An exemplary object of the invention is to provide a semiconductor device on which is mounted a variable resistance element that enables high reliability and high density and a manufacturing method of the semiconductor device.

A semiconductor device according to an exemplary aspect of the invention is characterized by a configuration that includes multilayer interconnects and two variable resistance elements that are provided among the multilayer interconnects and that each includes a first electrode, a second electrode, and a variable resistance element film interposed between these electrodes, wherein either the electrode types of the first electrodes or the electrode types of the second electrodes of the above-described two variable resistance elements are unified.

A manufacturing method according to an exemplary aspect of the invention is a manufacturing method of a semiconductor device having multilayer interconnects, the manufacturing method including: a step of forming an insulating barrier film on two first interconnects provided in one interconnect layer of the interconnect layers included in the multilayer interconnects; an opening forming step in the insulating barrier film a first opening that exposes at least a portion of the upper surfaces of two first interconnects, this opening being provided in its wall surfaces with tapered surfaces that widen as distance increases in a perpendicular direction from the above-described two first interconnects; a variable resistance element film forming step of forming a variable resistance element film on surfaces that include at least the bottom surface and wall surfaces of the first opening; a second electrode forming step of forming second electrodes on said variable resistance element film; and a step of forming a second interconnect for connecting second electrodes by, from among multilayer interconnects, an interconnect layer that differs from the interconnect layer in which the above-described two first interconnects are formed.

BEST MODE FOR CARRYING OUT THE INVENTION

First Exemplary Embodiment

The configuration of a variable resistance element used in the semiconductor device of the present exemplary embodiment is next described.

Figure 1A:
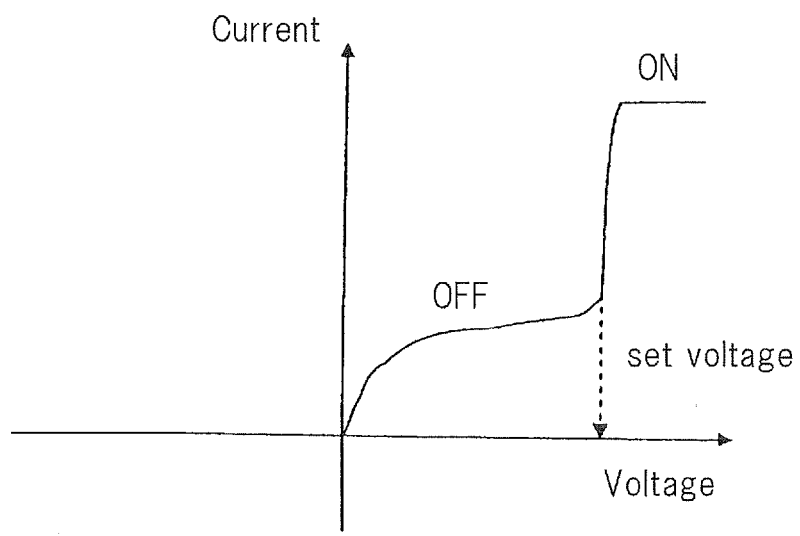
FIG. 1A shows the operation characteristics of a unipolar variable resistance element.
Figure 1B:
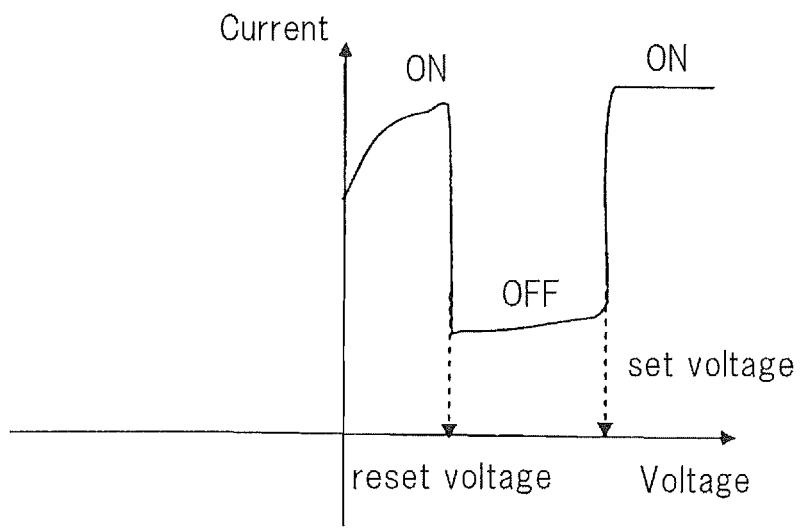
FIG. 1B shows the operation characteristics of a unipolar variable resistance element.
Figure 1C:
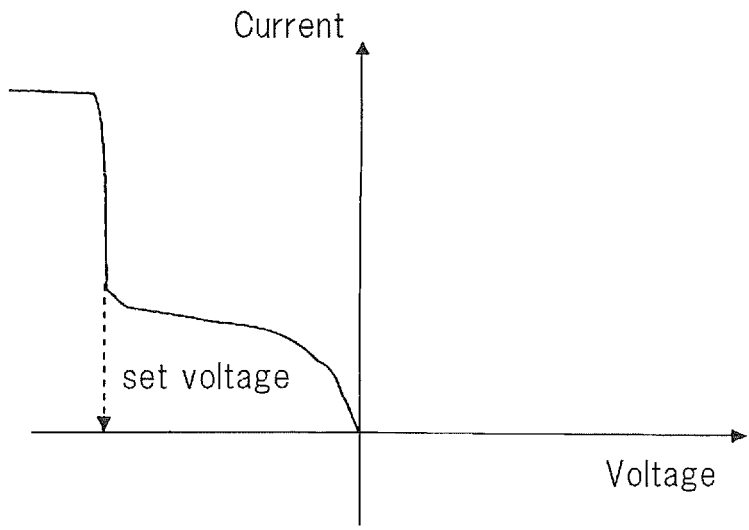
FIG. 1C shows the operation characteristics of a unipolar variable resistance element.
Figure 1D:
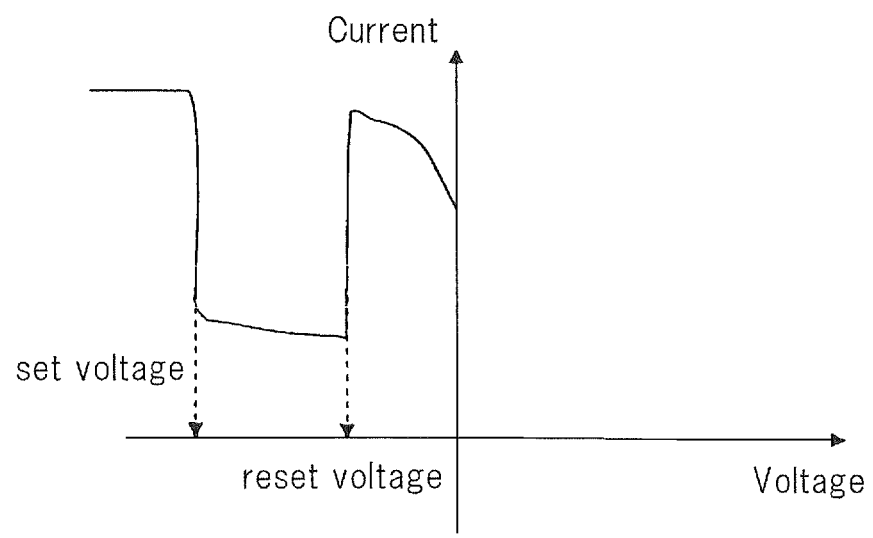
FIG. 1D shows the operation characteristics of a unipolar variable resistance element.
Figure 2A:
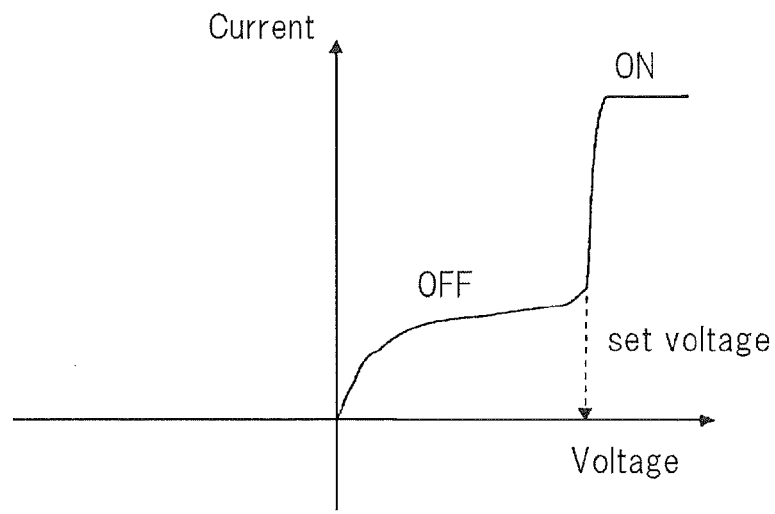
FIG. 2A shows the operation characteristics of a bipolar variable resistance element.
Figure 2B:
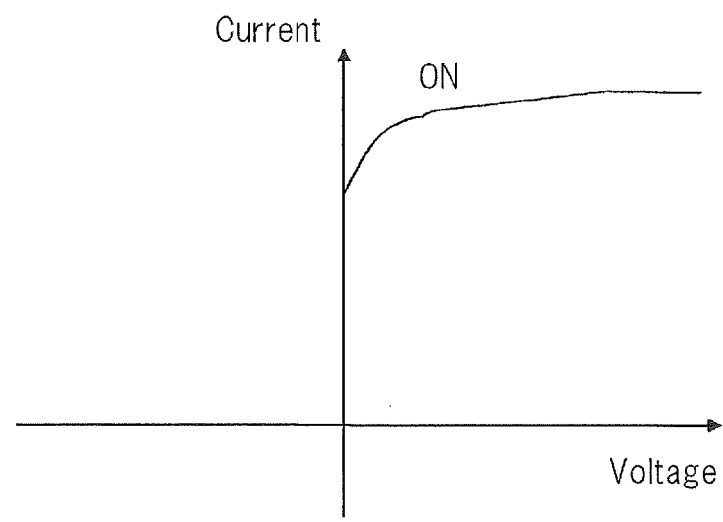
FIG. 2B shows the operation characteristics of a bipolar variable resistance element.
Figure 2C:
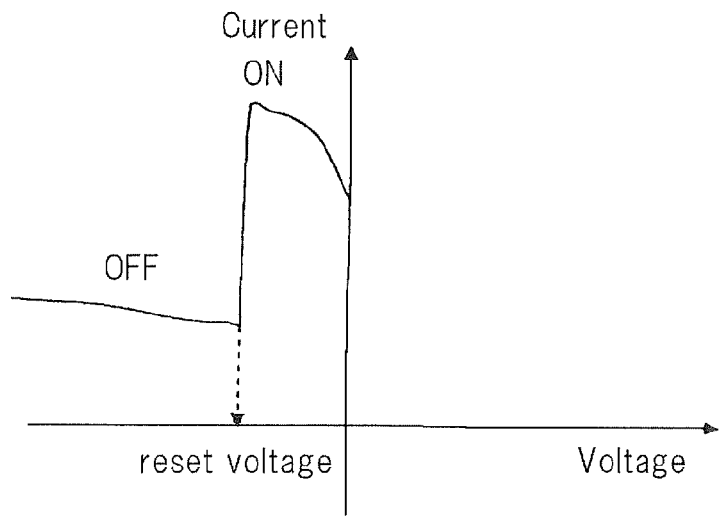
FIG. 2C shows the operation characteristics of a bipolar variable resistance element.
Figure 2D:
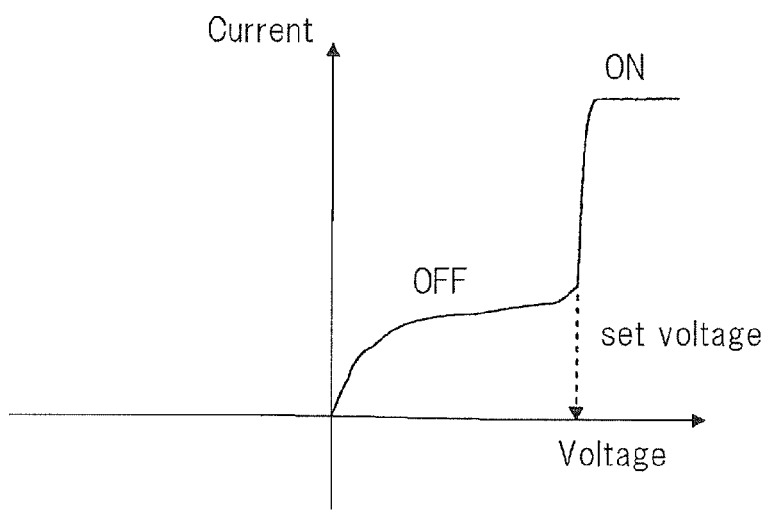
FIG. 2D shows the operation characteristics of a bipolar variable resistance element.
Figure 3:
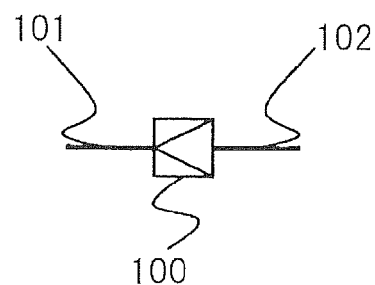
FIG. 3 shows an example of the configuration of a variable resistance element that is used in the semiconductor device of the first exemplary embodiment.

FIG. 3 shows an example of the configuration of the variable resistance element that is used in the semiconductor device of the present exemplary embodiment.

Variable resistance element 100 shown in FIG. 3 is a bipolar variable resistance element. Variable resistance element 100 is of a configuration that includes inactive electrode 101, active electrode 102, and a variable resistance element film that is interposed between these electrodes. The variable resistance element film is, for example the ion conductor disclosed in Non-Patent Document 1.

The configuration of the semiconductor device that uses variable resistance element 100 shown in FIG. 3 is next described.

Figure 4:
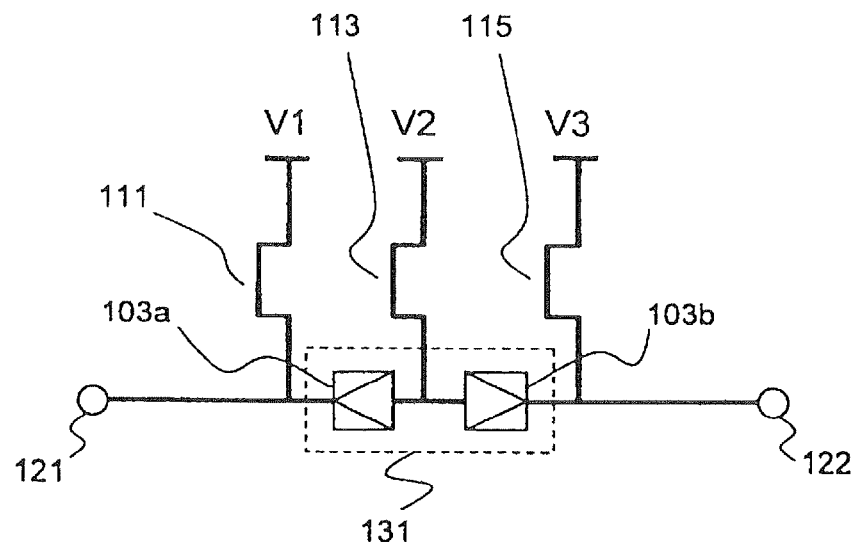
FIG. 4 shows an example of the configuration of the semiconductor device of the first exemplary embodiment.

FIG. 4 shows an example of the configuration of the semiconductor device of the present exemplary embodiment.

The semiconductor device shown in FIG. 4 has electrical element 131 that includes at least two bipolar variable resistance elements 103a and 103b. Each of variable resistance elements 103a and 103b corresponds to the variable resistance element 100 shown in FIG. 3. In electrical element 131, the active electrodes of each of variable resistance elements 103a and 103b are connected together, electrodes of the same polarity being connected together. In electrical element 131, the inactive electrode of variable resistance element 103a is the input side, and the inactive electrode of variable resistance element 103b is the output side. The inactive electrode of variable resistance element 103a is connected to input terminal 121 of the semiconductor device, and the inactive electrode of variable resistance element 103b is connected to output terminal 122 of the semiconductor device.

In the semiconductor device shown in FIG. 4, switching transistor (hereinbelow referred to as simply "transistor") 113 is provided, and switching transistor (in the present exemplary embodiment, referred to as simply "transistor") 113 is connected to electrical element 131. In addition, transistors 111 and 115 may be provided in the semiconductor device as shown in FIG. 4.

In the configuration shown in FIG. 4, transistors 111, 113, and 115 are NMOS transistors. The drain electrode of transistor 113 is connected to the active electrodes of each of variable resistance elements 103a and 103b. The drain electrode of transistor 111 is connected between input terminal 121 and variable resistance element 103a. The drain electrode of transistor 115 is connected between output terminal 122 and variable resistance element 103b.

The source electrode of transistor 111 is terminal V1, the source electrode of transistor 113 is terminal V2, and the source electrode of transistor 115 is terminal V3. In FIG. 4, the representation of the gate electrodes of transistors 111, 113, and 115 is omitted. Here, the drain electrode of each transistor is connected to variable resistance elements 103a and 103b and a voltage or the ground potential is applied to the source electrode, but a configuration is also possible in which the drain electrodes and source electrodes are switched. This point holds true for each of the Working Examples 1-3 to be explained hereinbelow.

The programming method of the semiconductor device shown in FIG. 4 is next described. Voltage is applied to the gate electrode of each transistor to place each transistor in the low resistance state, but the explanation of this operation is here omitted.

When an electrical signal is to be transmitted to output terminal 122 from input terminal 121, both of variable resistance element 103a and variable resistance element 103b must be caused to transition to the ON state (low resistance state). In this case, terminal V1 and terminal V3 are connected to ground, a positive voltage equal to or greater than the threshold voltage (set voltage) of the variable resistance elements is applied to terminal V2, and transistors 111, 113, and 115 are placed in the low resistance state, whereby the transition to the desired ON state can be realized for the semiconductor device.

In contrast, when an electrical signal from input terminal 121 to output terminal 122 is to be cut off, both of variable resistance element 103a and variable resistance element 103b must be caused to transition to the OFF state (high resistance state). In this case, terminal V2 is connected to ground, a positive voltage that is equal to or greater than the threshold voltage (reset voltage) of the variable resistance elements is applied to terminal V1 and terminal V3, and switch transistors 111, 113, and 115 are placed in the low-resistance state, whereby the transition to the desired OFF state can be realized for the semiconductor device.

The amelioration of disturb faults realized by the semiconductor device of the present exemplary embodiment is next described.

A disturb fault is a fault transitioning from the OFF state to the ON state due to a malfunction. From this, it is assumed that the states of variable resistance element 103a and variable resistance element 103b are the high-resistance state in the initial stage. It is here assumed that a positive voltage no greater than the threshold voltage (set voltage) is applied to input terminal 121 and that output terminal 122 is connected to ground.

Voltage is applied to both ends of electrical element 131, but while voltage is being applied to variable resistance element 103a in the direction of transitioning from the OFF state to the ON state, voltage is being applied to variable resistance element 103b in the direction of transitioning from the ON state to the OFF state. In other words, although there is a potential for malfunctioning and transitioning to the ON state when a voltage no greater than the threshold voltage is applied because the direction of application of voltage for variable resistance element 103a is in the direction of transitioning to the ON state, the direction of application of voltage for variable resistance element 103b is the direction of transitioning to the OFF state, and malfunctioning therefore does not occur.

On the other hand, when a positive voltage no greater than the threshold voltage (set voltage) is applied to output terminal 122 and input terminal 121 is connected to ground, a voltage is being applied to variable resistance element 103b in the direction of transitioning from the OFF state to the ON state, but a voltage is being applied to variable resistance element 103a in the direction of transitioning from the ON state to the OFF state. In other words, the direction of application of voltage for variable resistance element 103a is the direction of transitioning to the ON state, and although there is a possibility of malfunctioning and a transition to the ON state when a voltage no greater than the threshold voltage is applied, the direction of application of voltage for variable resistance element 103b is in the direction of transitioning to the OFF state and malfunctioning therefore does not occur.

The voltage that is applied to variable resistance element 103a and variable resistance element 103b is resistance-divided to approximately one half by the resistance values of each of variable resistance element 103a and variable resistance element 103b, whereby disturb faults can be prevented.

As described hereinabove, regardless of the signal form that is transmitted, malfunctioning as a circuit can be prevented if the OFF state can be maintained in at least one of variable resistance element 103a and variable resistance element 103b to block the signal from input terminal 121 to output terminal 122. The use of this type of variable resistance elements eliminates faults resulting from malfunctioning of the semiconductor circuit and enables the realization of a highly reliable semiconductor device.

Electrical element 131 that is shown in FIG. 4 that has at least two bipolar variable resistance elements in which same-polarity electrodes of the variable resistance elements are connected together, and moreover, in which input and output is effected from the two unconnected electrodes is hereinbelow referred to as a complementary variable resistance element.

Figure 5:
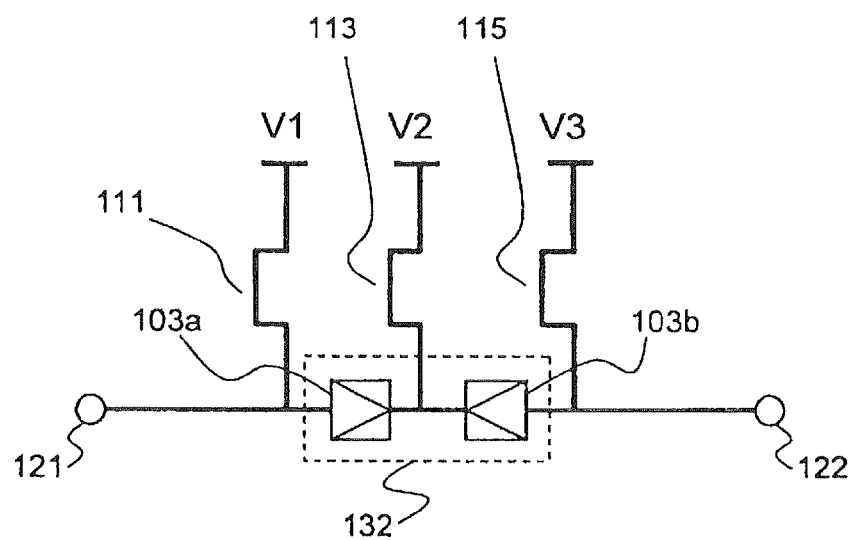
FIG. 5 shows an example of an electrical element of a configuration that differs from that of the electrical element shown in FIG. 4.

Although a case has been described for the semiconductor device shown in FIG. 4 in which electrical element 131 was used in which the inactive electrodes of variable resistance elements 103a and 103b are electrically interconnected, electrical element 132 may also be used in place of electrical element 131 as shown in FIG. 5. Electrical element 132 is of a configuration in which the active electrodes of variable resistance elements 103a and 103b are electrically interconnected. The inactive electrode of variable resistance element 103a is connected to input terminal 121, and the inactive electrode of variable resistance element 103b is connected to output terminal 122.

The programming method of the semiconductor device shown in FIG. 5 is next described briefly.

When both of variable resistance element 103a and variable resistance element 103b are to transition to the ON state (low-resistance state), terminal V2 is connected to ground, a positive voltage equal to or greater than the threshold voltage (set voltage) of the variable resistance elements is applied to terminal V1 and terminal V3, and transistors 111, 113, and 115 are placed in the low-resistance state. On the other hand, when both of variable resistance element 103a and variable resistance element 103b are to transition to the OFF state (high-resistance state), terminal V1 and terminal V3 are connected to ground, a positive voltage equal to or greater than the threshold voltage (reset voltage) of the variable resistance elements is applied to terminal V2, and switch transistors 111, 113, and 115 are placed in the low-resistance state.

In the case of the semiconductor device shown in FIG. 5 as well, disturb faults are ameliorated and the same effects are obtained as for the use of electrical element 131.

Working Example 1

Figure 6:
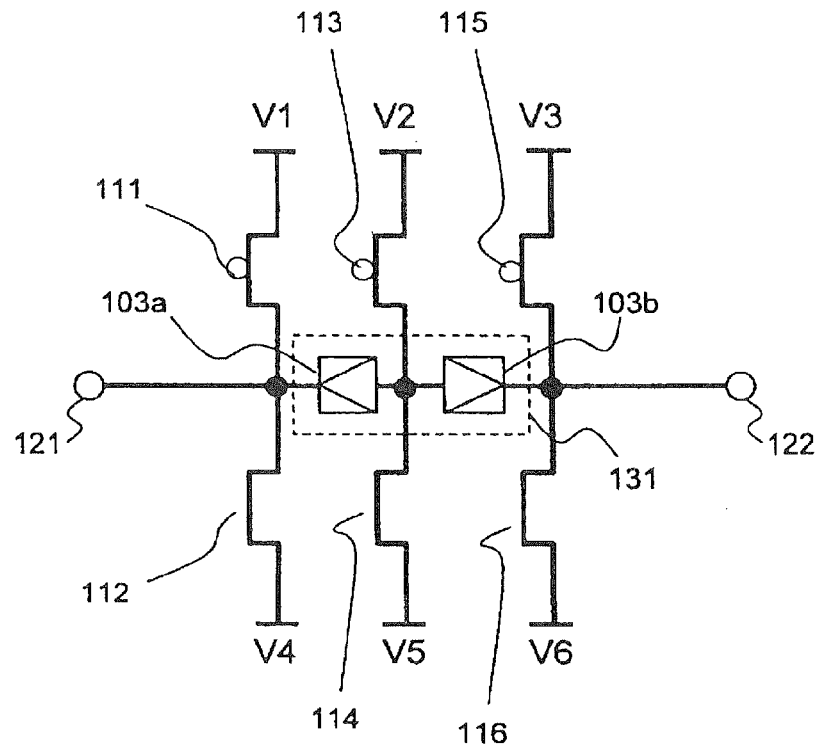
FIG. 6 shows an example of the configuration of the semiconductor device of Working Example 1.

Working Example 1 of the semiconductor device of the present exemplary embodiment is next described. FIG. 6 shows an example of the configuration of the semiconductor device of Working Example 1.

The semiconductor device shown in FIG. 6 is of a configuration that includes electrical element 131 shown in FIG. 4 and transistors 111-116. In the configuration shown in FIG. 6, transistors 111, 113, 115 are PMOS transistors, in contrast to the case of the semiconductor device shown in FIG. 4 and FIG. 5. Apart from the realization of transistors 111, 113, and 115 by PMOS transistors, the configuration is similar to that of FIGS. 4 and 5, and detailed description of the configuration is therefore here omitted.

Transistors 112, 114, and 116 are NMOS transistors. The drain electrode of transistor 114 is connected to the active electrodes of each of variable resistance elements 103a and 103b. The drain electrode of transistor 112 is connected between input terminal 121 and variable resistance element 103a. The drain electrode of transistor 116 is connected between output terminal 122 and variable resistance element 103b.

The source electrode of transistor 112 is taken as terminal 4V, the source electrode of transistor 114 is taken as terminal V5, and the source electrode of transistor 116 is taken as terminal V6. In FIG. 6, the depiction of the gate electrode of each transistor is omitted from the figure.

Transistor 111, transistor 112, and input terminal 21 are electrically connected to the inactive electrode of variable resistance element 103a. Transistor 115, transistor 116, and output terminal 122 are electrically connected to the inactive electrode of variable resistance element 103b.

The programming method of the semiconductor device of the present working example is next described. A positive voltage equal to or greater than the threshold voltage (set voltage) of the variable resistance elements is applied to terminals V1, V2, and V3 shown in FIG. 6, and terminals V4, V5, and V6 are connected to ground.

When an electrical signal is to be transmitted from input terminal 121 to output terminal 122, both of variable resistance element 103a and variable resistance element 103b must be caused to transition to the ON state (low-resistance state). To cause transitioning of the two variable resistance elements 103a and 103b to the ON state, a "High" signal is applied as input to the gate electrodes of transistors 111, 112, 115 and 116 and a "Low" signal is applied as input to the gate electrodes of transistors 113 and 114. As a result, a positive voltage equal to or greater than the threshold voltage (set voltage) is applied to the active electrodes of variable resistance elements 103a and 103b and the inactive electrodes of variable resistance elements 103a and 103b are grounded, whereby the transition to the desired ON state can be realized for the semiconductor device.

On the other hand, when an electrical signal from input terminal 121 to output terminal 122 is to be blocked, both of variable resistance element 103a and variable resistance element 103b must be caused to transition to the OFF state (high-resistance state). To cause the two variable resistance elements 103a and 103b to transition to the OFF state, a "Low" signal is applied as input to the gate electrodes of transistors 111, 112, 115, and 116, and a "High" signal is applied as input to the gate electrodes of transistors 113 and 114. As a result, the active electrodes of variable resistance elements 103a and 103b are connected to ground and a positive voltage equal to or greater than the threshold value (reset voltage) is applied to the inactive electrodes of variable resistance elements 103a and 103b, whereby the transmission to the desired OFF state can be realized for the semiconductor device.

Working Example 2

Figure 7:
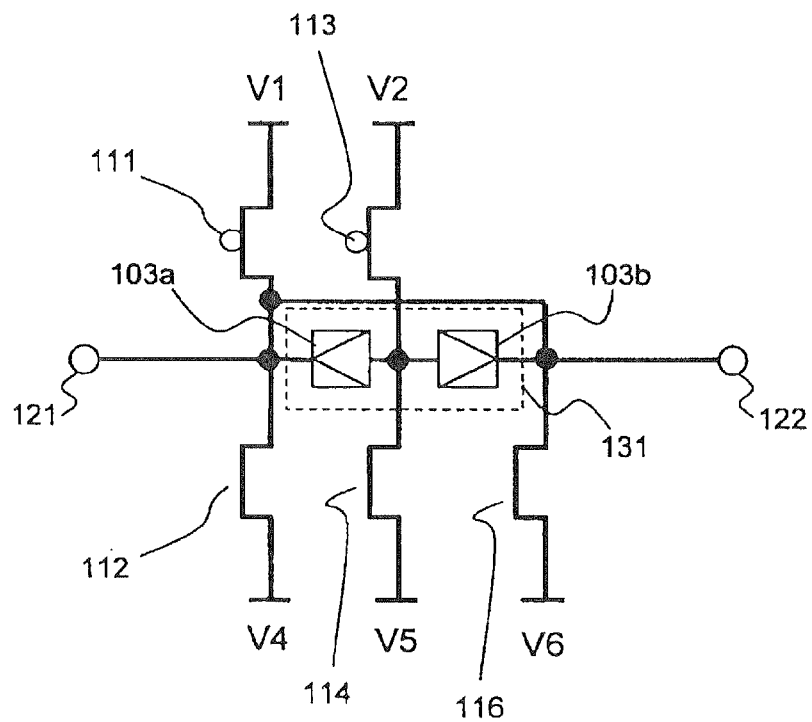
FIG. 7 shows an example of the configuration of the semiconductor device of Working Example 2.

Working Example 2 of the semiconductor device of the present exemplary embodiment is next described. FIG. 7 shows an example of the configuration of the semiconductor device of Working Example 2.

The semiconductor device shown in FIG. 7 is of a configuration that includes electrical element 131 shown in FIG. 4 and transistors 111-114 and 116 shown in FIG. 6. In the present working example, a configuration is adopted in which, instead of providing transistor 115 shown in FIG. 6, the inactive electrodes of each of variable resistance elements 103a and 103b are connected together.

The programming method of the semiconductor device of the present working example is similar to the method described with reference to FIG. 4 and a detailed explanation is therefore here omitted.

In the semiconductor device shown in FIG. 6, a case was described in which six transistors were used to program two variable resistance elements, but in the present working example, electrically interconnecting the inactive electrodes of the two variable resistance elements enables omission of switching transistor 115.

Working Example 3

Figure 8:
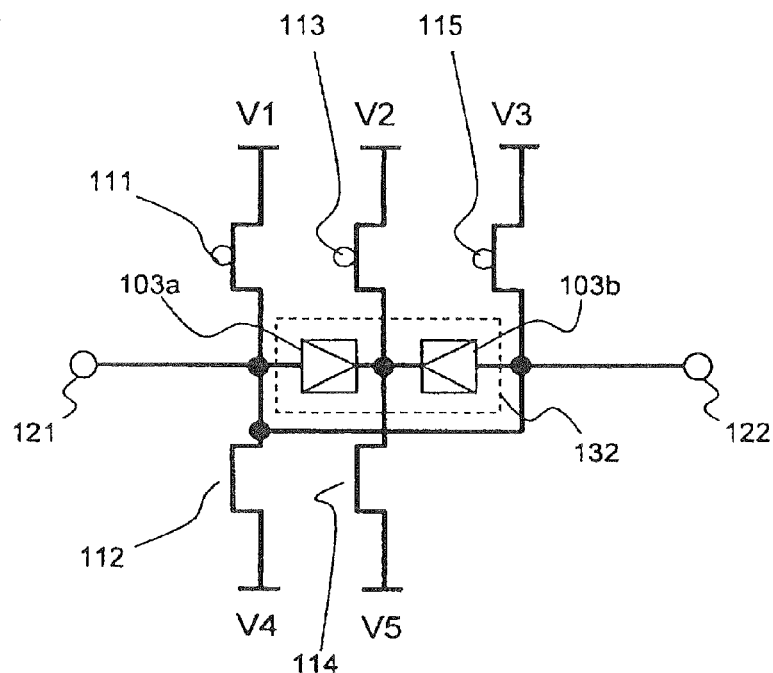
FIG. 8 shows an example of the configuration of the semiconductor device of Working Example 3.

Working Example 3 of the semiconductor device of the present exemplary embodiment is next described. FIG. 8 shows an example of the configuration of the semiconductor device of Working Example 3.

The semiconductor device shown in FIG. 8 is of a configuration that includes electrical element 132 shown in FIG. 5 and transistors 111-115 shown in FIG. 6. In the present working example, a configuration is adopted in which, instead of providing transistor 116 shown in FIG. 6, the active electrodes of each of variable resistance elements 103a and 103b are connected together.

The programming method of the semiconductor device of the present working example is next described. A positive voltage equal to or greater than the threshold voltage (set voltage) of the variable resistance elements is applied to terminals V1, V2, and V3 shown in FIG. 8, and terminals V4 and V5 are connected to ground.

To cause both of variable resistance element 103a and variable resistance element 103b to transition to the ON state (low-resistance state), a "Low" signal should be applied as input to the gate electrodes of transistors 111, 112, and 115 and a "High" signal should be applied to the gate electrodes of transistors 113 and 114.

On the other hand, to cause both of variable resistance element 103a and variable resistance element 103b to transition to the OFF state (high-resistance state), a "High" signal should be applied as input to the gate electrodes of transistors 111, 112, and 115 and a "Low" signal should be applied as input to the gate electrodes of transistors 113 and 114.

In the semiconductor device shown in FIG. 6, a case was described in which six transistors were used to program two variable resistance elements, but in the present working example, electrically interconnecting the active electrodes of the two variable resistance elements enables the omission of switching transistor 116.

Second Exemplary Embodiment

The semiconductor device of the present exemplary embodiment is next described. The semiconductor device of the present exemplary embodiment has two variable resistance elements in which the active electrodes are electrically interconnected.

Figure 9:
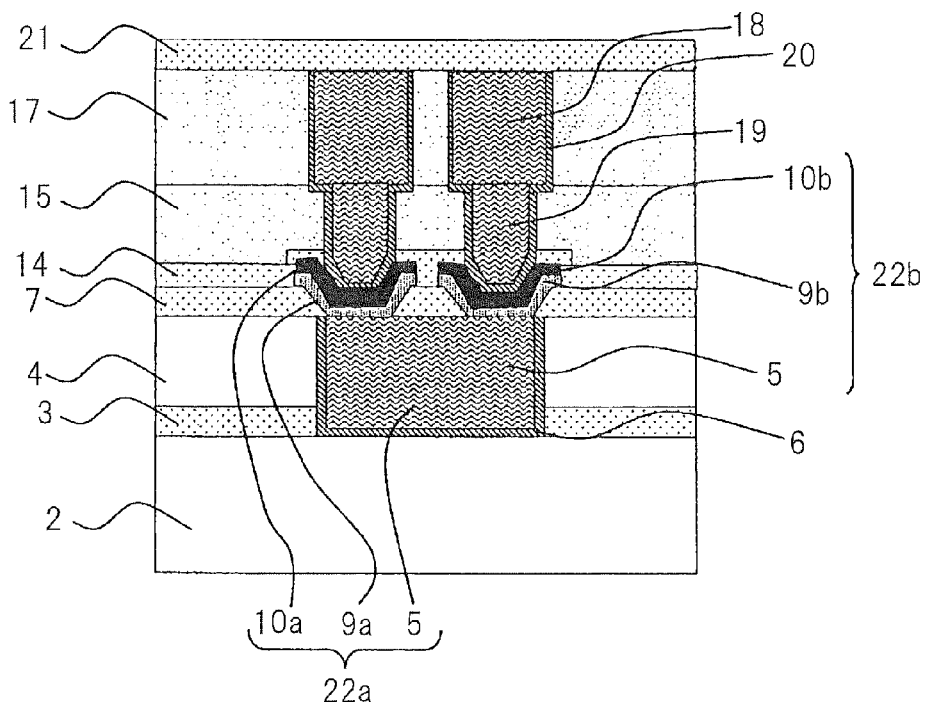
FIG. 9 is a sectional view showing an example of the configuration of the semiconductor device of the second exemplary embodiment.

FIG. 9 is a sectional view showing an example of the configuration of the semiconductor device of the second exemplary embodiment.

The semiconductor device of the present exemplary embodiment has variable resistance elements 22a and 22b and multilayer interconnects that include first interconnect 5 and second interconnect 18. Variable resistance element 22a includes a lower electrode, upper electrode 10a, and variable resistance element film 9a that is interposed between these electrodes. Variable resistance element 22b includes a lower electrode, upper electrode 10b, and variable resistance element film 9b that is interposed between these electrodes. The lower electrodes of variable resistance elements 22a and 22b correspond to first interconnect 5 shown in FIG. 9, variable resistance elements 22a and 22b thus sharing the lower electrode. Variable resistance elements 22a and 22b are of a configuration in which the active electrodes are connected together. Here, first interconnect 5 is a copper interconnect.

As shown in FIG. 9, interlayer insulating film 2 is formed on a semiconductor substrate (not shown), and barrier insulating film 3 and interlayer insulating film 4 are formed on interlayer insulating film 2. First interconnect 5 is provided in a trench that reaches from the upper surface of interlayer insulating film 4, through barrier insulating film 3, and to the upper surface of interlayer insulating film 2, the bottom surface and side surfaces of first interconnect 5 being covered by barrier metal 6. Insulating barrier film 7 and protective insulating film 14 are formed on interlayer insulating film 4. Two trenches that are reverse-tapered as seen from perpendicularly above the surface of the substrate are formed in insulating barrier film 7 and protective insulating film 14. Of the two trenches, variable resistance element film 9a and upper electrode 10a are provided laminated in one trench, and variable resistance element film 9b and upper electrode 10b are provided laminated in the other trench.

Interlayer insulating film 15, interlayer insulating film 17, and barrier insulating film 21 are formed in order on protective insulating film 14. Openings are formed that reach from the upper surface of interlayer insulating film 15 to each of upper electrodes 10a and 10b and plugs 19 are provided in each of these openings. The side surfaces and bottom surfaces of plugs 19 are covered by barrier metal 20. Two trenches are formed that reach from the upper surface of interlayer insulating film 17 to the upper surface of interlayer insulating film 15, and second interconnects 18 are provided in each of the trenches. The side surfaces of second interconnects 18 are covered by barrier metal 20. The bottom surfaces of second interconnects 18 are connected to plugs 19, and the upper surfaces of second interconnects 18 are covered by barrier insulating film 21.

In the sectional view shown in FIG. 9, variable resistance element films 9a and 9b and upper electrodes 10a and 10b are provided between plugs 19 and first interconnect 5, but apart from a construction of this type, a construction in which plugs 19 and the first interconnect are directly connected may be provided in the semiconductor device of the present exemplary embodiment.

The multilayer interconnects that include a multilayer interconnect construction are next described.

First interconnect 5 is provided in barrier insulating film 3 and interlayer insulating film 4, and insulation is maintained against other interconnects provided in the same interconnect layer by these insulating films. In addition, at the bottom surface side of first interconnect 5, insulation against lower-layer interconnects is maintained by interlayer insulating film 2, and at the upper-surface side of first interconnect 5, insulation against upper-layer interconnects is maintained by insulating barrier film 7. Plugs 19 are provided in protective insulating film 14 and interlayer insulating film 15, and insulation against other plugs provided in the same conductive layer is maintained by these insulating films Second interconnects 18 are provided in interlayer insulating film 17 and insulation against other interconnects provided in the same interconnect layer is maintained by this insulating film. In addition, insulation of the bottom-surface sides of second interconnects 18 against first interconnect is maintained by interlayer insulating film 15, and insulation of the upper-surface side of second interconnects 18 against upper-layer interconnects is maintained by barrier insulating film 21.

The insulating film in which first interconnect 5 is formed, the insulating film in which plugs 19 are formed, the insulating film in which second interconnects 18 are formed, and the insulating films for maintaining insulation of these interconnects and plugs are hereinbelow referred to as "multilayer interconnects."

In the construction shown in FIG. 9, the insulating film laminated body in which interlayer insulating film 2, barrier insulating film 3, interlayer insulating film 4, insulating barrier film 7, protective insulating film 14, interlayer insulating film 15, interlayer insulating film 17, and barrier insulating film 21 are stacked in order corresponds to the multilayer interconnects. In these multilayer interconnects, second interconnects 18 are embedded in the interconnect trenches that are formed in interlayer insulating film 17, plugs 19 are embedded in the openings that are formed in interlayer insulating film 15 and protective insulating film 14, second interconnects 18 and plugs 19 are unified, and the side surfaces and bottom surfaces of the conductive unified constructions composed of second interconnects 18 and plugs 19 are covered by barrier metal 20. In the present exemplary embodiment, variable resistance elements 22a and 22b are provided in multilayer interconnects.

In the present exemplary embodiment, first interconnect 5 is made the lower electrode of variable resistance elements 22a and 22b, whereby first interconnect 5 also serves as lower electrode of variable-resistance elements 22a and 22b. Compared to a case in which the first interconnect and lower electrodes are formed in separate steps, not only can an increase in the number of steps be limited to simplify processing, but the resistance of the lower electrodes can also be lowered. In addition, because the lower electrodes of variable resistance elements 22a and 22b are unified, the two variable resistance elements can be made more compact. Miniaturizing the construction of the variable resistance elements enables a more concentrated arrangement of the variable resistance elements and enables the realization of a semiconductor device that features higher performance and greater reliability.

Still further, when first interconnect 5 is formed by a normal copper damascene interconnect process, the variable resistance elements can be formed in the multilayer interconnects by the addition of only two lithography steps. As described hereinabove, not only can the resistance of the lower electrodes be decreased and an increase in the number of steps limited, but reduced resistance of elements and lower costs can also be simultaneously achieved because mask sets for only two lithography steps are necessary.

Variable resistance elements 22a and 22b are variable resistance nonvolatile elements, and, for example, are switching elements that employ electrochemical reactions and metal ion movement in an ion conductor. Variable resistance element 22a is of a configuration in which variable resistance element film 9a is interposed between first interconnect 5 that serves as the lower electrode and upper electrode 10a that is electrically connected to plug 19. Variable resistance element 22b is of a configuration in which variable resistance element film 9b is interposed between first interconnect 5 that serves as the lower electrode and upper electrode 10b that is electrically connected to plug 19. In variable resistance elements 22a and 22b, each of variable resistance element films 9a and 9b are directly connected to first interconnect 5 by the openings formed in insulating barrier film 7, and each of upper electrodes 10a and 10b is electrically connected to a separate plug 19 by way of barrier metal 20.

In variable resistance element 22a, ON/OFF control is performed by applying voltage to the lower electrode or upper electrode 10a or by causing current to flow from the lower electrode or upper electrode 10a. For example, ON/OFF control is performed in variable resistance element 22a by using the electrotransport of metal from first interconnect 5 into variable resistance element film 9a. The operation of the ON/OFF control realized by variable resistance element 22b is similar to that of variable resistance element 22a. Upper electrodes 10a and 10b and barrier metal 20 are composed of the same materials. Making these materials the same enables unification of barrier metal 20 of plugs 19 and upper electrodes 10a and 10b and enables a reduction of contact resistance, and moreover, due to the improvement in adhesion, enables an improvement of reliability compared to a case in which the materials differ.

Semiconductor elements (not shown) such as MOS transistors are formed on the semiconductor substrate (not shown). A substrate such as a silicon substrate, a single-crystal substrate, an SOI (Silicon On Insulator) substrate, a TFT (Thin-Film Transistor) substrate, or a substrate for liquid crystal fabrication can be used as the semiconductor substrate. Semiconductor substrate 1 (to be described hereinbelow) is also of a similar configuration to this semiconductor substrate, and description of this substrate is therefore omitted hereinbelow.

Interlayer insulating film 2 is an insulating film formed on the semiconductor substrate. As an example, a silicon oxide film or a low-dielectric constant film (for example, hydrogenated silicon oxycarbide (SiOCH) film), which is a film having a lower relative dielectric constant than a silicon oxide film, can be used as interlayer insulating film 2. Interlayer insulating film 2 is not limited to a single layer and may be realized by stacking a plurality of insulating films.

Barrier insulating film 3 is an insulating film having barrier property that is provided between interlayer insulating film 2 and interlayer insulating film 4. Barrier insulating film 3 has the role as an etch-stop layer at the time of processing the interconnect trench for first interconnect 5. Films such as a silicon nitride (SiN) film, a silicon carbide (SiC) film, or a silicon carbon nitride (SiCN) film can be used as barrier insulating film 3. An interconnect trench is provided for embedding first interconnect 5 in barrier insulating film 3, first interconnect 5 being embedded in this interconnect trench with barrier metal 6 interposed. Depending on the etching selectivity of the etching conditions for the interconnect trench, barrier insulating film 3 may not be provided. If the etching selectivity of interlayer insulating film 2 and interlayer insulating film 4 is extremely high, barrier insulating film may be omitted because the amount of etching of interlayer insulating film 2 is limited when etching interlayer insulating film 4 to form the interconnect trench for first interconnect 5 even without barrier insulating film 3.

Interlayer insulating film 4 is an insulating film formed on barrier insulating film 3. A film such as a silicon oxide film or a low-dielectric constant film (for example, a hydrogenated silicon oxycarbide (SiOCH) film) can be used as interlayer insulating film 4. Interlayer insulating film 4 is not limited to a single layer and may be realized by stacking a plurality of insulating films. An interconnect trench for embedding first interconnect 5 is provided in interlayer insulating film 4, and first interconnect 5 is embedded in this interconnect trench with barrier metal 6 interposed.

First interconnect 5 is an interconnect that is embedded in an interconnect trench formed in interlayer insulating film 4 and barrier insulating film 3 with barrier metal 6 interposed. A conductive material such as an electrode layer may be provided between first interconnect 5 and variable resistance element films 9a and 9b. When an electrode layer is formed between first interconnect 5 and variable resistance element films 9a and 9b, the electrode layer and variable resistance element films 9a and 9b are deposited in continuous steps, and by processing in continuous steps, the electrode layer and variable resistance element films 9a and 9b can be formed without increasing the number of steps. In addition, the lower portions of variable resistance element films 9a and 9b do not contact the lower-layer interconnect by way of contact plugs. A metal capable of diffusion or ionic conduction in variable resistance element film 9 is used for first interconnect 5. For example, copper can be used as first interconnect 5. First interconnect 5 may also be alloyed with aluminum.

Barrier metal 6 is a conductive film having a barrier property and covers the side surfaces and bottom surface of the interconnect to prevent the diffusion of metal that is contained in first interconnect 5 into interlayer insulating film 4 or a lower layer. When, for example, first interconnect 5 is composed of metal elements in which copper is the main constituent, a refractory metal such as tantalum (Ta), a nitride of the metal such as tantalum nitride (TaN), titanium nitride (TiN), and tungsten carbon-nitride (WCN), or a laminated film of these metals can be used for barrier metal 6.

Insulating barrier film 7 is formed on interlayer insulating film 4 that contains first interconnect 5 and has the roles of preventing oxidation of metal (such as copper) that is contained in first interconnect 5, preventing the diffusion of metal that is contained in first interconnect 5 into interlayer insulating film 15, and serving as an etch-stop layer during processing of electrodes 10a and 10b and variable resistance element films 9a and 9b. A film such as a silicon carbide (SiC) film, a silicon carbon nitride (SiCN) film, a silicon nitride (SiN) film, or a laminated construction of these films can be used as insulating barrier film 7. Insulating barrier film 7 is preferably of the same material as protective insulating film 14.

Insulating barrier film 7 has openings above first interconnect 5. In the openings of insulating barrier film 7, first interconnect 5 contacts variable resistance element films 9a and 9b. The openings of insulating barrier film 7 are formed within the area of first interconnect 5. The adoption of this construction enables the formation of variable resistance elements 22a and 22b on the surface of first interconnect 5 having little unevenness. The wall surfaces of the openings of insulating barrier film 7 are tapered surfaces that spread as the distance from first interconnect 5 increases. The tapered surfaces of the openings of insulating barrier film 7 are set to 85° or less with respect to the upper surface of first interconnect 5. Adopting this construction eases the field concentration at the outer periphery of the connection between variable resistance element films 9a and 9b and first interconnect 5 (the vicinity of the outer periphery of the openings of insulating barrier film 7) and improves the insulation resistance.

As described hereinabove, variable resistance element films 9a and 9b are films having a property by which resistance changes according to conditions. Variable resistance element films 9a and 9b employ a material in which resistance is changed by the action (diffusion or ionic conduction) of metal that is contained in first interconnect 5 (lower electrodes). When the resistance-change of variable resistance elements 22a and 22b is implemented by the precipitation of metal ions, a film that is capable of ionic conduction is used in variable resistance element films 9a and 9b, and this film can be, for example, an oxide insulating film that contains tantalum (Ta) such as tantalum oxide ($Ta_2O_5$) or tantalum silicon oxide (TaSiO).

Alternatively, variable resistance element films 9a and 9b may be of a laminated construction in which tantalum oxide ($Ta_2O_5$) and tantalum silicon oxide (TaSiO) are stacked in order from the side closer to the substrate. By adopting a laminated construction of this type, when variable resistance element films 9a and 9b are used as ionic conduction layers, a bridge realized by metal ions (for example, copper ions) that is formed within the ionic conduction layer during low resistance (at the time of OFF) is cut by the tantalum oxide ($Ta_2O_5$) layer, whereby metal ions can be easily recovered at the time of OFF and an improvement of the switching characteristics can be achieved. Variable resistance element films 9a and 9b are each formed to straddle the upper surface of first interconnect 5, the tapered surfaces of the openings of insulating barrier film 7, and the upper surface of insulating barrier film 7. The outer peripheral portion of the connection with first interconnect 5 in variable resistance element films 9a and 9b is arranged at least along the tapered surfaces of the openings of insulating barrier film 7.

Upper electrodes 10a and 10b directly contact variable resistance element films 9a and 9b, respectively. Upper electrodes 10a and 10b are a metal that is more difficult to ionize than the metal that is contained in first interconnect 5 and that is less amenable to diffusion or ionic conduction in variable resistance element films 9a and 9b, and preferably are of a metal material for which the absolute value of free energy of oxidation is lower than that of the metal component (tantalum (Ta)) contained in variable resistance element films 9a and 9b. As upper electrodes 10a and 10b, a metal such as ruthenium (Ru) and platinum (Pt) can be used. Alternatively, upper electrodes 10a and 10b may be a material that takes a metal material such as platinum or ruthenium as the chief component to which oxygen is added, or may be of a laminated construction of layers that take a metal material such as platinum or ruthenium as the chief component and layers in which oxygen is added.

Protective insulating film 14 is an insulating film that during its formation does not damage variable resistance elements 22a and 22 and that has the function of preventing desorption of oxygen from variable resistance element films 9a and 9b. A film such as a silicon nitride (SiN) film or a silicon carbon nitride (SiCN) film can be used as protective insulating film 14. Protective insulating film 14 is preferably of the same material as insulating barrier film 7. When these films are of the same material, protective insulating film 14 and insulating barrier film 7 are unified, whereby the adhesion of the interface of these films is improved and the protective capability for variable resistance elements 22a and 22b is improved.

Interlayer insulating film 15 is an insulating film formed on protective insulating film 14. A film such as a silicon oxide film, a silicon oxycarbide (SiOC) film, or a low-dielectric constant film (such as a hydrogenated silicon oxycarbide (SiOCH) film) can be used as interlayer insulating film 15. Interlayer insulating film 15 is not limited to a single layer and may be realized by stacking a plurality of insulating films. Interlayer insulating film 15 may be made of the same material as interlayer insulating film 17. Interlayer insulating film 15 is provided with openings for embedding plugs 19, plugs 19 being embedded in these openings with barrier metal 20 interposed.

Interlayer insulating film 17 is an insulating film formed on interlayer insulating film 15. A film such as a silicon oxide film, a silicon oxycarbide (SiOC) film, or a low-dielectric constant film (such as a hydrogenated silicon oxycarbide (SiOCH) film) can be used as interlayer insulating film 17. Interlayer insulating film 17 is not limited to a single layer and may be realized by stacking a plurality of insulating films. Interlayer insulating film 17 may be of the same material as interlayer insulating film 15. Interconnect trenches for embedding second interconnects 18 are provided in interlayer insulating film 17, second interconnects 18 being embedded in the interconnect trenches with barrier metal 20 interposed.

Second interconnects 18 are interconnects that are embedded in the interconnect trenches formed in interlayer insulating film 17 with barrier metal 20 interposed. Second interconnects 18 are unified with plugs 19. Plugs 19 are embedded in the openings provided in interlayer insulating film 15 and protective insulating film 14 with barrier metal 20 interposed. Plugs 19 are electrically connected with upper electrodes 10a and 10b with barrier metal 20 interposed. A material such as copper can be used as the material of second interconnects 18 and plugs 19. The area of the region in which plug 19 contacts upper electrode 10a, or to state more strictly, the region in which barrier metal 20 contacts upper electrode 10a (assumed to be a circle of radius R2), is set to be smaller than the area of the region in which first interconnect 5 contacts variable resistance element film 9a (assumed to be a circle of radius R1) in order to limit embedding defects of the plating on the opening. In other words, the relation is R2<R1. The relation of these areas for upper electrode 10b and variable resistance element film 9b is also the same as for upper electrode 10a and variable resistance element film 9a.

Barrier metal 20 is a conductive film having a barrier property that covers the side surfaces and bottom surfaces of the conductive unified construction that includes second interconnects 18 and plugs 19 to prevent the diffusion of the metal that is contained in the conductive unified construction into interlayer insulating films 15 and 17 or into lower layers. When second interconnects 18 and plugs 19 take as their material, for example, metal elements that take copper as the chief constituent, a refractory metal such as tantalum (Ta) or a nitride of the metal such as tantalum nitride (TaN), titanium nitride (TiN), or tungsten-carbon-nitride (WCN), or a laminated film of these materials can be used as barrier metal 20.

Barrier insulating film 21 is formed on interlayer insulating film 17 that contains second interconnects 18 and is an insulating film having the role not only of preventing oxidation of the metal (for example, copper) that is included in second interconnects 18 but also of preventing the diffusion of the metal that is contained in second interconnects 18 into upper layers (not shown). A film such as a silicon carbide (SiC) film, a silicon carbon nitride (SiCN) film, a silicon nitride (SiN) film, or a laminated construction of these films can be used as barrier insulating film 21.

The manufacturing method of the semiconductor device of the present exemplary embodiment may add, to a manufacturing method of multilayer interconnects that include a first interconnect layer, a second interconnect layer, and plugs that connect the interconnects of these interconnect layers, a step of forming variable resistance element films and upper electrodes between the first interconnect layer and the plugs. Because this manufacturing method is the same as that of the fifth exemplary embodiment to be explained hereinbelow, detailed explanation is omitted in the present exemplary embodiment.

According to the present exemplary embodiment, by adopting the configuration of a semiconductor device in which electrodes of the same polarity of the variable resistance elements are connected together, and further, the semiconductor device having an electrical element that receives input from and supplies output to the two unconnected electrodes, erroneous writing and malfunctioning of the variable resistance elements, when voltage no greater than the threshold voltage is applied, can be prevented.

Third Exemplary Embodiment

The configuration of the semiconductor device of the present exemplary embodiment is next described. The semiconductor device of the present exemplary embodiment includes two variable resistance elements in which inactive electrodes are electrically interconnected.

Figure 10:
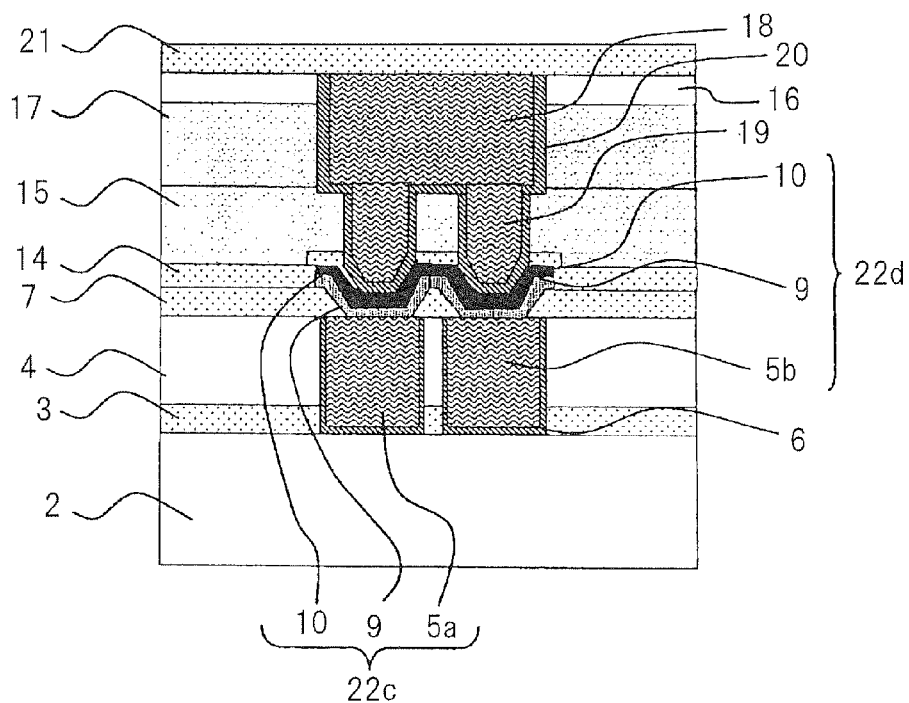
FIG. 10 is a sectional view showing an example of the configuration of the semiconductor device of the third exemplary embodiment.

FIG. 10 is a sectional view showing an example of the configuration of the semiconductor device of the third exemplary embodiment. In addition, constructions that are the same as those of the second exemplary embodiment are given the same reference numbers and detailed explanation of these parts is omitted, detailed explanation being limited to points that differ from the second exemplary embodiment.

The semiconductor device of the present exemplary embodiment is of a configuration in which variable resistance elements 22c and 22d are provided in the multilayer interconnects that were described in the second exemplary embodiment. However, the multilayer interconnects shown in FIG. 10 are provided with etch-stop film 16 between barrier insulating film 21 and interlayer insulating film 17.

Variable resistance element 22c includes first interconnect 5a that is the lower electrode, upper electrode 10, and variable resistance element film 9 that is interposed between these electrodes. Variable resistance element 22d includes first interconnect 5b that is the lower electrode, upper electrode 10, and variable resistance element film 9 that is interposed between these electrodes. Variable resistance elements 22c and 22d are of the same configuration as variable resistance elements 22a and 22b, and detailed explanation is therefore here omitted.

Upper electrode 10 is a construction in which upper electrodes 10a and 10b of variable resistance elements 22a and 22b shown in FIG. 9 are unified. This is a configuration in which the inactive electrodes of variable resistance elements 22c and 22d are interconnected. The configuration of upper electrode 10 is the same as upper electrodes 10a and 10b and detailed explanation is therefore here omitted. In addition, first interconnects 5a and 5b that are the lower electrodes are of a configuration in which first interconnect 5 shown in FIG. 9 is divided in two. The configuration of first interconnects 5a and 5b is the same as first interconnect 5, and detailed explanation is therefore here omitted.

In the present working example, variable resistance elements 22c and 22d share variable resistance element film 9. The reason that variable resistance element film 9 can be shared in this way is that the state of the variable resistance is recorded between each of the lower electrodes and upper electrode. Variable resistance element film 9 is a construction in which variable resistance element films 9a and 9b shown in FIG. 9 are unified, and because this configuration is the same as described in the second exemplary embodiment, detailed explanation is here omitted.

In the semiconductor device of the present exemplary embodiment, the same effect as in the second exemplary embodiment is obtained because the upper electrodes are unified by means of a construction in which two variable resistance elements are provided in which the inactive electrodes are electrically interconnected.

The manufacturing method of the semiconductor device of the present exemplary embodiment should add, to the manufacturing method of a multilayer interconnects having a first interconnect layer, a second interconnect layer, and plugs that connect the interconnects of these interconnect layers, a step of forming a variable resistance element film and upper electrodes between the first interconnect layer and the plugs. This manufacturing method is similar to the fifth exemplary embodiment to be explained hereinbelow, and a detailed explanation is therefore omitted in the present exemplary embodiment.

Working Example 4

A working example in the semiconductor device of the third exemplary embodiment is next described. The semiconductor device of this working example is, in a construction in which the inactive electrodes are electrically interconnected, a construction that allows greater miniaturization than the construction described in FIG. 10.

Figure 11:
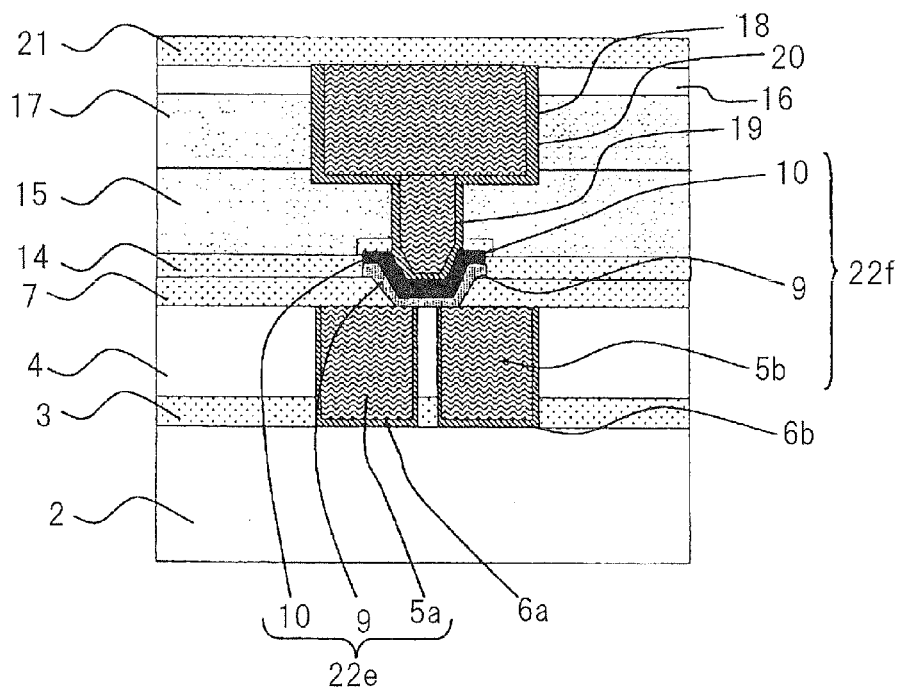
FIG. 11 is a sectional view showing an example of the configuration of the semiconductor device of Working Example 4.

FIG. 11 is a sectional view showing an example of the configuration of the semiconductor device of Working Example 4. Constructions that are the same as the second or third exemplary embodiment are given the same reference numbers and detailed explanation of these parts is here omitted.

The semiconductor device of the present working example is of a configuration in which variable resistance elements 22e and 22f are provided within the multilayer interconnects that were described in the second exemplary embodiment. However, in the present working example as well, etch-stop film 16 is provided between barrier insulating film 21 and interlayer insulating film 17, as in FIG. 10.

Variable resistance element 22e includes first interconnect 5a that is the lower electrode, upper electrode 10, and variable resistance element film 9 that is interposed between these electrodes. Variable resistance element 22f includes first interconnect 5b that is the lower electrode, upper electrode 10, and variable resistance element film 9 that is interposed between these electrodes. Variable resistance elements 22e and 22f are of the same configuration as variable resistance elements 22a and 22b, and detailed explanation of these parts is therefore here omitted.

In the present working example, variable resistance elements 22e and 22f not only share variable resistance element film 9 but are also of a configuration in which variable resistance element film 9 is connected to the two independent active electrodes by way of an opening provided in insulating barrier film 7.

A visual comparison of the sectional view shown in FIG. 10 and the sectional view shown in FIG. 11 reveals that the length of the pattern of variable resistance element film 9 in the left-right direction of the figure is shorter in the present working example. Further, although two plugs 19 are provided in the configuration shown in FIG. 10, the number of plugs 19 in the present working example is one.

In the semiconductor device of the present working example, the upper electrode 10 of variable resistance elements 22e and 22f is not only unified but the pattern of variable resistance element film 9 can also be made smaller than in the semiconductor device shown in FIG. 10, whereby the two variable resistance elements can be miniaturized. By miniaturizing the construction of the variable resistance elements, the variable resistance elements can be arranged with higher concentration.

The manufacturing method of the semiconductor device of the present working example should add, to the manufacturing method of a multilayer interconnects that includes a first interconnect layer, a second interconnect layer, and plugs that connect the interconnects of these interconnect layers, a step of forming a variable resistance element film and upper electrode between the first interconnect layer and the plugs. Because this manufacturing method is similar to the fifth exemplary embodiment to be explained hereinbelow, a detailed explanation of the manufacturing method is omitted in the present exemplary embodiment.

Working Example 5

Another working example in the semiconductor device of the third exemplary embodiment is next described. The semiconductor device of the present working example is one example of a construction in which the inactive electrodes are electrically interconnected.

Figure 12:
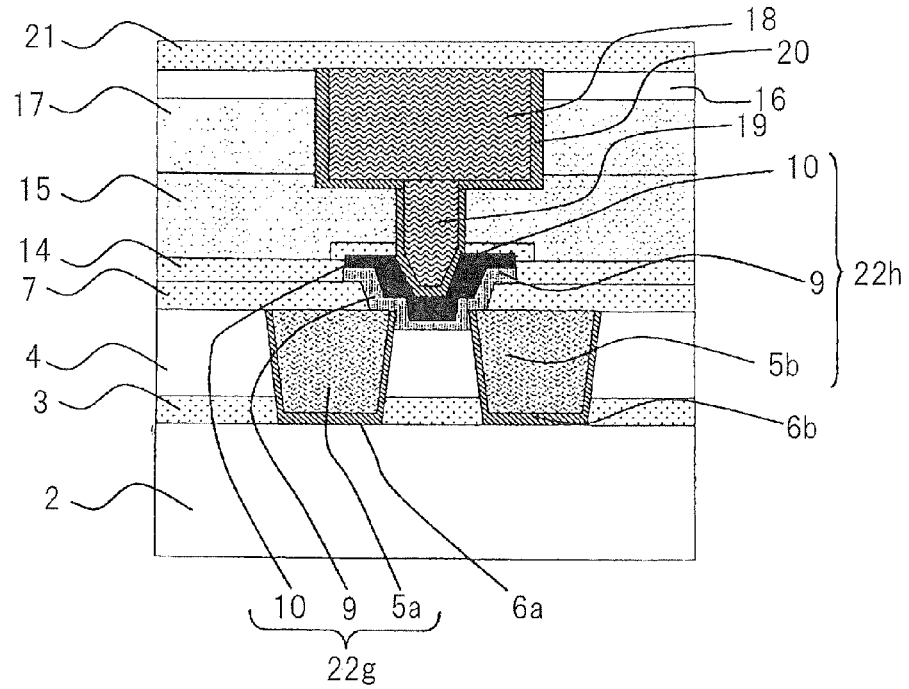
FIG. 12 is a sectional view showing an example of the configuration of the semiconductor device of Working Example 5.

FIG. 12 is a sectional view showing an example of the configuration of the semiconductor device of Working Example 5. Constructions that are similar to the second or third exemplary embodiment are given the same reference numbers and detailed explanation of these parts is here omitted.

The semiconductor device of the present working example is of a configuration in which variable resistance elements 22g and 22h are provided within the multilayer interconnects that were described in the second exemplary embodiment. However, in the present working example as well, etch-stop film 16 is provided between barrier insulating film 21 and interlayer insulating film 17, as in FIG. 10.

Variable resistance element 22g includes first interconnect 5a that is the lower electrode, upper electrode 10, and variable resistance element film 9 that is interposed between these electrodes. Variable resistance element 22h includes first interconnect 5b that is the lower electrode, upper electrode 10, and variable resistance element film 9 that is interposed between these electrodes. Variable resistance elements 22g and 22h are of the same configuration as variable resistance elements 22a and 22b and detailed explanation is therefore here omitted.

In the present working example as well, variable resistance elements 22g and 22h share variable resistance element film 9. In addition, variable resistance element film 9 is connected to two independent active electrodes by way of an opening provided in insulating barrier film 7, but in the present working example, this opening has a configuration in which the opening reaches as far as the interior of interlayer insulating film 4.

When a construction is adopted in which the opening, in which variable resistance element film 9 is formed, reaches as far as the interior of interlayer insulating film 4, barrier metal 6a and 6b contact variable resistance element film 9 in the upper portions of the side surfaces of first interconnects 5a and 5b. As a result, first interconnects 5a and 5b are able to conduct with variable resistance element film 9 by way of barrier metal 6a and 6b.

In the semiconductor device of the present working example, the resistance between the lower electrodes and the variable resistance element film of the variable resistance elements is lower than in Working Example 4.

The manufacturing method of the semiconductor device of the present working example should add, in the manufacturing method of a multilayer interconnects that include a first interconnect layer, a second interconnect layer, and plugs that connect these interconnect layers, a step of forming a variable resistance element film and upper electrodes between the first interconnect layer and the plugs. Because this manufacturing method is similar to the fifth exemplary embodiment described hereinbelow, a detailed explanation is omitted in the present exemplary embodiment.

Fourth Exemplary Embodiment

The semiconductor device of the present exemplary embodiment is a crossbar switch in which the variable resistance elements described in the second exemplary embodiment are applied to a switch element. The crossbar switch of the present exemplary embodiment is of a configuration provided with a plurality of cells that takes as a unit the configuration that includes two variable resistance elements and transistors described in the second exemplary embodiment. To explain while referring to FIG. 5, a cell includes variable resistance elements 103a and 103b and transistor 113. Because a cell has three terminals, these three terminals are placed in correspondence with the source electrode (Source), drain electrode (Drain), and gate electrode (Gate) of a MOS transistor.

Figure 13A:
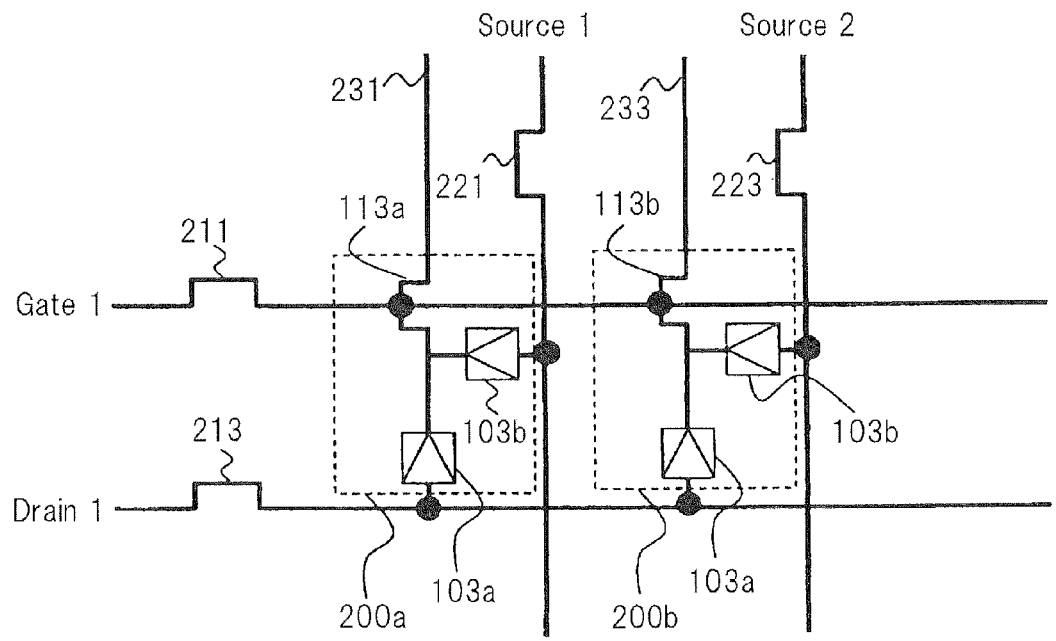
FIG. 13A is a circuit diagram showing an example of the configuration of the crossbar switch in the fourth exemplary embodiment.

FIG. 13A is a circuit diagram showing an example of the configuration of a crossbar switch in the present exemplary embodiment.

As shown in FIG. 13A, cells 200a and 200b are arranged in linear form. The active electrodes of variable resistance elements 103a of cells 200a and 200b are connected to interconnect Drain1. The active electrode of variable resistance element 103b of cell 200a is connected to interconnect Source1, and the active electrode of variable resistance element 103b of cell 200b is connected to interconnect Source1. The gate electrodes of transistors 113a and 113b are connected to interconnect Gate1.

Transistor 213 is provided at interconnect Drain1, and transistor 211 is provided at interconnect Gate1. Transistor 221 is provided at interconnect Source1, and transistor 221 is provided at interconnect Source1. Transistor 213 corresponds to transistor 111 shown in FIG. 5. Transistors 221 and 223 correspond to transistor 115 shown in FIG. 5.

The write method of the crossbar switch shown in FIG. 13A is next described. The case of cell 200a is here described.

When both variable resistance element 103a and variable resistance element 103b of cell 200a are to be caused to transition to the ON state (low-resistance state), interconnect GATE1 is connected to ground, a positive voltage equal to or greater than the threshold voltage (set voltage) is applied to interconnect Drain1 and interconnect Source1, transistors 211, 213, and 221 are turned ON, and transistor 113a is turned ON. On the other hand, when both variable resistance element 103a and variable resistance element 103b are to be caused to transition to the OFF state (high-resistance state), interconnect Drain1 and interconnect Source1 are connected to ground, a positive voltage equal to or greater than the threshold voltage (reset voltage) is applied to interconnect Gate1, switch transistors 211, 213, and 221 are turned ON, and transistor 113a is turned ON.

When writing is carried out to cell 200b, transistor 223 is used in place of transistor 221, interconnect 233 is used in place of interconnect 231, and, as with cell 200a, each transistor should be operated and a predetermined potential should be applied to each interconnect.

Figure 13B:
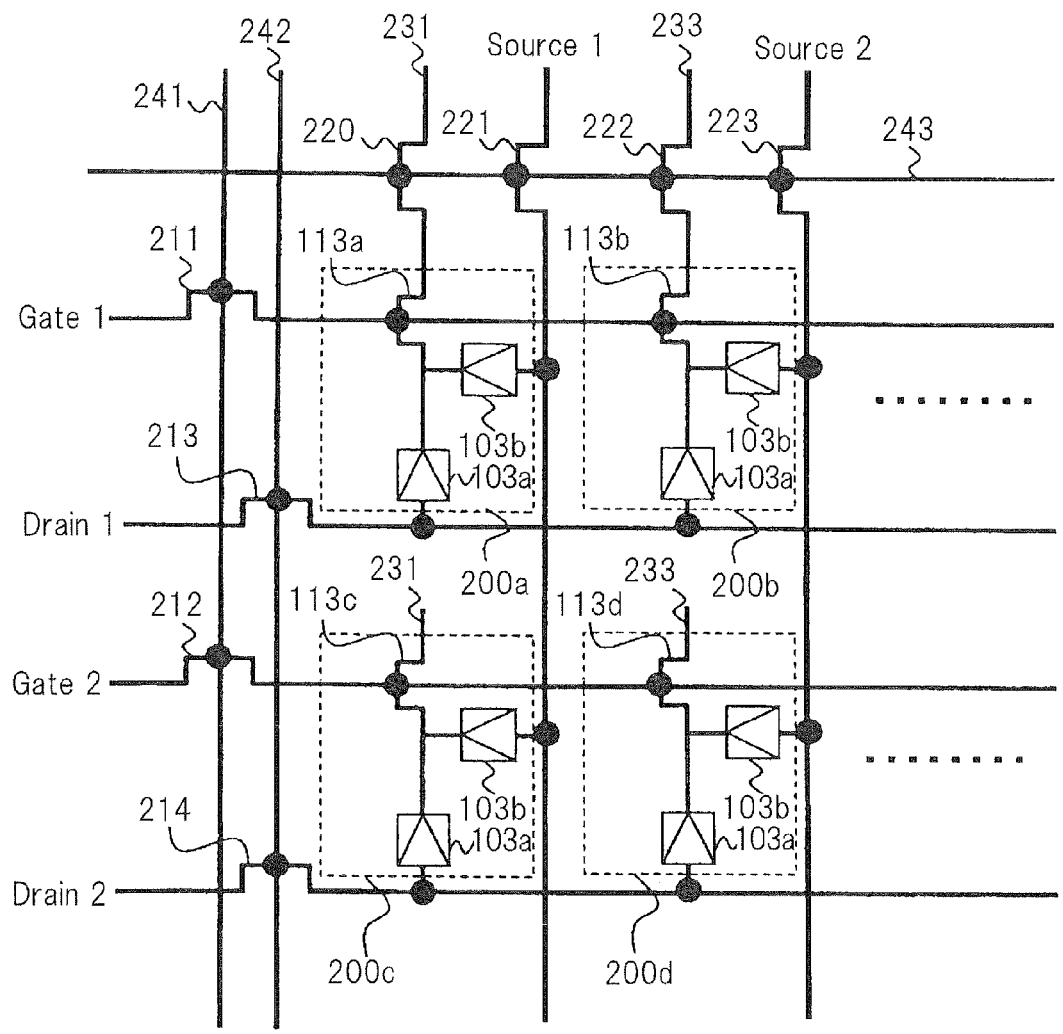
FIG. 13B is a circuit diagram showing another example of the configuration of the crossbar switch in the fourth exemplary embodiment.

FIG. 13B is a circuit diagram showing another example of the configuration of the crossbar switch in the present exemplary embodiment.

Although a plurality of cells were arranged in linear form in FIG. 13A, in the crossbar switch shown in FIG. 13B, a plurality of cells 200a-200d are arranged in matrix form. Cells 200a and 200b are of the same construction as described in FIG. 13A and only points that differ from FIG. 13A are here described.

The active electrodes of variable resistance elements 103a of cells 200c and 200d are connected to interconnect Drain2. The active electrode of variable resistance element 103b of cell 200c is connected to interconnect Source1, and the active electrode of variable resistance element 103b of cell 200b is connected to interconnect Source1. The gate electrodes of transistors 113c and 113d are connected to interconnect Gate2.

Transistor 214 is provided in interconnect Drain2, and transistor 211 is provided in interconnect Gate2. Transistor 214 corresponds to transistor 111 shown in FIG. 5. Transistor 220 is provided in interconnect 231, and transistor 222 is provided in interconnect 233. Each gate electrode of transistors 220-223 is connected by interconnect 243. The gate electrodes of transistors 211 and 212 are connected to interconnect 241, and the gate electrodes of transistors 213 and 214 are connected to interconnect 242.

In addition, the method of writing to each cell is similar to the method described in FIG. 13A, and a detailed explanation is therefore omitted.

An example of the crossbar switch layout of the present exemplary embodiment is next described.

Figure 14:
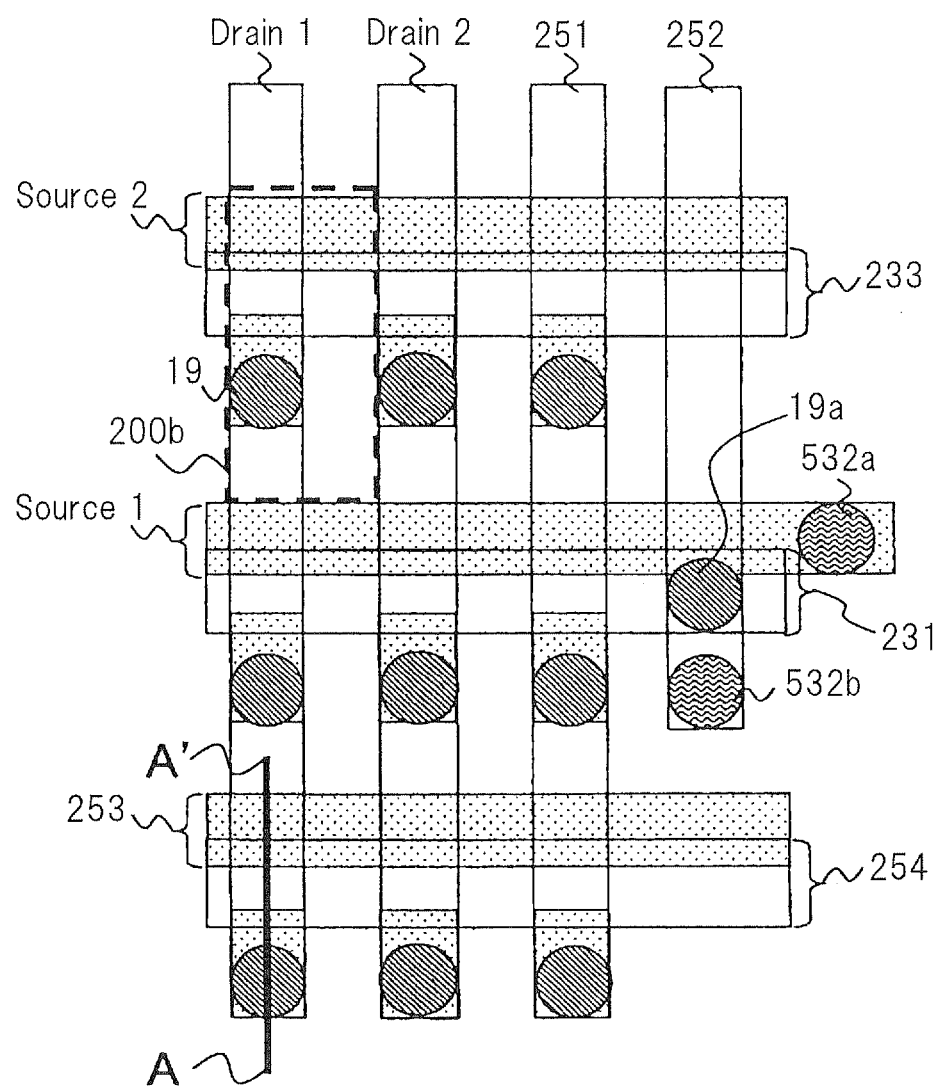
FIG. 14 is a layout diagram of the crossbar switch of the fourth exemplary embodiment.

FIG. 14 shows the layout of the crossbar switch of the present exemplary embodiment. The layout is placed in correspondence with the circuit diagram shown in FIG. 13B. However, because the pattern of interconnects and other components that are connected to the variable resistance elements is difficult to see when the layout of the transistors is superposed on the pattern of the variable resistance elements, the depiction of transistors in the figure is here omitted.

If the horizontal direction of FIGS. 13B and 14 is the X-axis and the vertical direction is the Y-axis, the X-axis and Y-axis are reversed regarding the direction of interconnects in the circuit diagram of FIG. 13B and the layout diagram shown in FIG. 14. The broken-line box shown in FIG. 14 shows the cell size of cell 200b shown in FIG. 13B. In the layout shown in FIG. 14, the cell size is approximately $8F^2$. In FIG. 14, interconnects 251 and 252 that are not shown in FIG. 13B are provided in the same layer as interconnect Drain1 and interconnect Drain2. Interconnects 251 and 252, interconnect Drain1, and interconnect Drain2 correspond to second interconnect 18.

In addition, interconnect 253 that was not shown in FIG. 13B is provided in the same layer as interconnect Source1 and interconnect Source2, and interconnect 254 is provided on the same layer as interconnects 231 and 233. Interconnects Source1, Source2, and interconnect 253 correspond to first interconnect 5a (lower electrode). Interconnects 254, 231, and 233 correspond to upper electrode 10. Focusing on cell 200b, interconnect Drain1 is connected to the active electrode of variable resistance element 193a by way of plug 19. This active electrode corresponds to first interconnect 5b (lower electrode).

Interconnect 252 of the same layer as second interconnect 18 is connected with interconnect 231 (that corresponds to upper electrode 10) by way of plug 19a, and interconnect 231 is connected to transistors (not shown) formed on the semiconductor substrate by way of contact plug 532b. In addition, interconnect Source1 is also connected to transistors (not shown) formed on the semiconductor substrate by way of contact plug 532b.

Although a configuration in which the active electrodes of two variable resistance elements are connected together has been described in the present exemplary embodiment, the present exemplary embodiment may also be applied to a configuration in which the inactive electrodes are connected together.

Fifth Exemplary Embodiment

The present exemplary embodiment relates to variable resistance elements that are used in the crossbar switch described in the fourth exemplary embodiment. The semiconductor device of the present exemplary embodiment is of a configuration in which the inactive electrodes of two variable resistance elements are electrically connected together.

Figure 15:
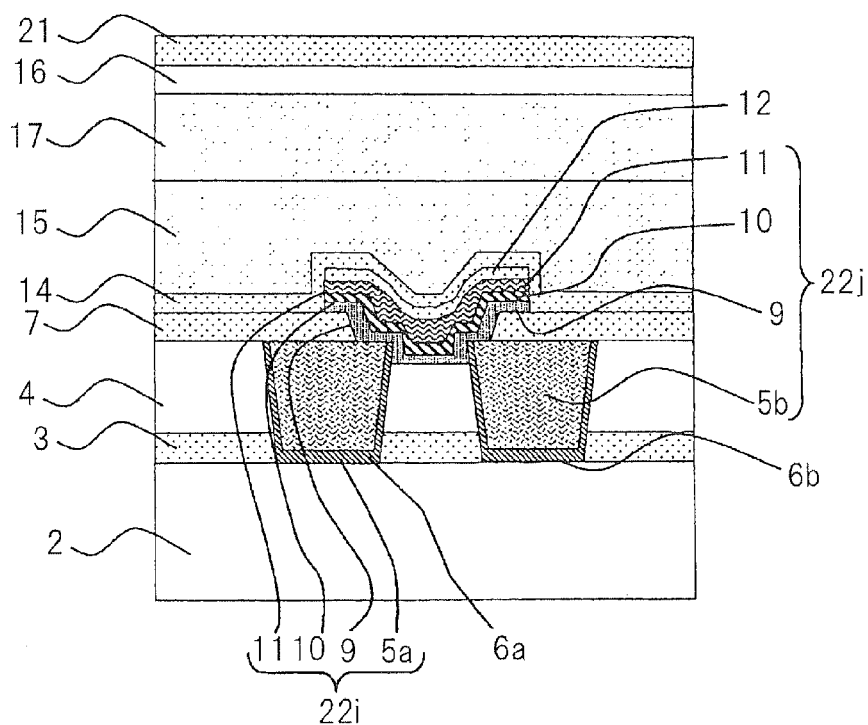
FIG. 15 is a sectional view showing an example of the configuration of the semiconductor device of the fifth exemplary embodiment.

FIG. 15 is a sectional view showing an example of the configuration of the semiconductor device of the present exemplary embodiment. Constructions that are the same as those in the exemplary embodiments or working examples described hereinabove are given the same reference numbers and detailed explanation of these elements is omitted, and points that differ from the above-described exemplary embodiments or working examples are described in detail.

The semiconductor device of the present exemplary embodiment is of a configuration provided with variable resistance elements 22i and 22j within the multilayer interconnects described in the second exemplary embodiment. However, in the present exemplary embodiment as well, etch-stop film 16 is provided between barrier insulating film 21 and interlayer insulating film 17 as in the third exemplary embodiment.

Variable resistance element 22i includes first interconnect 5a that is the lower electrode, upper electrode that is made up from first upper electrode 10 and second upper electrode 11, and variable resistance element film 9 that is interposed between the lower electrode and the upper electrodes. Variable resistance element 22j includes first interconnect 5b that is the lower electrode, upper electrodes that are made up from first upper electrode 10 and second upper electrode 11, and variable resistance element film 9 that is interposed between the lower electrode and the upper electrodes. In the present working example as well, variable resistance elements 22i and 22j share variable resistance element film 9.

In the present exemplary embodiment as well, variable resistance element film 9 is connected to two independent active electrodes by way of an opening provided in insulating barrier film 7, but this opening is of a configuration that reaches as far as the interior of interlayer insulating film 4. By means of this configuration, the same effects as Working Example 5 can be obtained.

In addition, in the present exemplary embodiment, the upper electrodes of variable resistance elements 22i and 22j are of a configuration in which first upper electrode 10 and second upper electrode 11 are stacked in order. Variable resistance elements 22i and 22j are of the same configuration as variable resistance elements 22a and 22b with the exception that the upper electrodes are of a configuration in which two conductive layers are stacked, and detailed explanation of the variable resistance elements is therefore here omitted.

In the multilayer interconnects of the present exemplary embodiment, variable resistance elements 22i and 22j are provided that are formed by stacking in order variable resistance element film 9, first upper electrode 10, and second upper electrode 11 on the upper surfaces of first interconnects 5 that are the lower electrodes and on the wall surfaces of the opening of insulating barrier film 7 in the opening that has been formed in insulating barrier film 7 and on the upper surface of insulating barrier film 7. In addition, hard-mask film 12 is formed on second upper electrode 11 in these multilayer interconnects. Still further, in these multilayer interconnects, protective insulating film 14 covers the upper surface and side surfaces of the laminated body composed of variable resistance element film 9, first upper electrode 10, second upper electrode 11, and hard mask film 12.

Although barrier metal 20, plugs 19, and second interconnect 18 that were shown in FIG. 12 are not represented in the section portion shown in FIG. 15, barrier metal 20, plugs 19, and second interconnect 18 are provided in the semiconductor device of the present exemplary embodiment.

Points are next described regarding the configuration that is used in the semiconductor device of the present exemplary embodiment that were not described in the above-described exemplary embodiments and working examples.

Insulating barrier film 7 is preferably of the same material as protective insulating film 14 and hard-mask film 12.

First upper electrode 10 is the electrode of lower-layer side in the upper electrodes of variable resistance elements 22i and 22j and directly contacts variable resistance element film 9. First upper electrode 10 is preferably a metal that is more difficult to ionize and less prone to diffusion or ionic conduction in variable resistance element film 9 than metals contained in first interconnects 5a and 5b, and is preferably a metal material for which the absolute value of free energy of oxidation is lower than that of the metal component (tantalum (Ta)) contained in variable resistance element film 9. A material such as platinum (Pt) or ruthenium (Ru) can be used as first upper electrode 10. Alternatively, first upper electrode 10 may be a material in which oxygen is added to a metal material such as platinum or ruthenium as the main component or a laminated construction of layers that take a metal material such as platinum or ruthenium as the main component and layers to which oxygen has been added.

Second upper electrode 11 is the electrode on the upper side in the upper electrodes of variable resistance elements 22i and 22j and is formed on first upper electrode 10. Second upper electrode 11 has the role of protecting first upper electrode 10. In other words, by protecting first upper electrode 10, second upper electrode 11 limits damage to first upper electrode 10 and can thus maintain the switching characteristics of variable resistance elements 22i and 22j. As second upper electrode 11, a metal such tantalum (Ta), titanium (Ti), tungsten (W), and aluminum (Al) or a nitride of these metals can be used.

Hard-mask film 12 is a film that serves as a hard mask during etching of second upper electrode 11, first upper electrode 10, and variable resistance element film 9. As hard-mask film 12, a material such as a silicon nitride (SiN) film can be used. Hard-mask film 12 is preferably of the same material as protective insulating film 14 and insulating barrier film 7. By making these films of the same material, not only can the surroundings of variable resistance elements 22i and 22j be enclosed by the same material and the material interfaces thus unified, but penetration of moisture from the outside can be prevented and escape of oxygen from variable resistance elements 22i and 22j themselves can be prevented.

Protective insulating film 14 is preferably of the same material as hard-mask film 12 and insulating barrier film 7. When these films are of the same material, protective insulating film 14, insulating barrier film 7, and hard-mask film 12 are unified, the adhesion of the interfaces of these films is improved, and the performance of protecting variable resistance elements 22i and 22j is improved.

Etch-stop film 16 is an insulating film that is interposed between interlayer insulating film 17 and barrier insulating film 21. As etch-stop film 16, a material such as a silicon nitride (SiN) film, a silicon carbide (SiC) film, or a silicon carbon nitride (SiCN) film can be used. In addition, etch-stop film 16 may be provided between interlayer insulating film 15 and interlayer insulating film 17. In this case, etch-stop film 16 serves a role as an etch-stop layer when processing the interconnect trench for second interconnect 18.

The manufacturing method of the semiconductor device of the present exemplary embodiment is next described. The manufacturing method here described is one example when manufacturing each of the semiconductor devices of the above-described exemplary embodiments and working examples.

FIGS. 16A to 19B are sectional views that give schematic representations of the manufacturing method of the semiconductor device of the present exemplary embodiment.

After forming semiconductor elements on a semiconductor substrate (not shown in the figures), interlayer insulating film 2 is deposited on this semiconductor substrate. Interlayer insulating film 2 is, for example, a silicon oxide film and has a film thickness of 300 nm. Next, barrier insulating film 3 and interlayer insulating film 4 are deposited successively on interlayer insulating film 2. Barrier insulating film 3 is, for example, a silicon nitride (SiN) film and has a film thickness of 30 nm. Interlayer insulating film 4 is, for example, a silicon oxide film and has a film thickness of 200 nm.

A lithographic method (including photoresist formation, dry etching, and photoresist removal) is next used to form an interconnect trench in interlayer insulating film 4 and barrier insulating film 3. Copper is next embedded in the formed interconnect trench with barrier metal 6 interposed to form first interconnects 5a and 5b (see FIG. 16A). Barrier metal 6 is, for example, a laminated film of tantalum nitride (TaN)/ tantalum (Ta) and has a film thickness of 5 nm/5 nm. The processes from the formation of interlayer insulating film 2 up to the formation of first interconnects 5a and 5b are taken as Step A1.

In Step A1, interlayer insulating films 2 and 4 can be formed by a plasma CVD (Chemical Vapor Deposition) method. Here, a plasma CVD method is a process of continuously supplying a gas raw material or a liquid raw material that has been vaporized to a reduced-pressure reaction chamber, placing molecules in an excited state by means of plasma energy, and forming a continuous film on a substrate by a gas phase reaction or substrate surface reaction.

An actual example of the method of forming first interconnects 5a and 5b in Step A1 is next described. After first forming barrier metal 6 (for example, a laminated film of tantalum nitride (TaN)/tantalum (Ta)) and a copper seed layer by, for example, a PVD (Physical Vapor Deposition) method, copper is embedded in interconnect trenches by an electrolytic plating method. After next subjecting the copper to heat treatment at a temperature of at least 200° C., surplus copper, i.e., copper outside the interconnect trenches, is removed by a CMP (Chemical Mechanical Polishing) method. First interconnects 5a and 5b are thus formed.

This series of formation methods of the copper interconnects is not limited to the described methods, and typical methods in the technological field of the present invention can also be used. Here, the CMP method is briefly described. The CMP method is a method of placing a rotating polishing pad in contact with a wafer surface while subjecting the wafer surface to a flow of slurry to polish the wafer surface and thus level unevenness of the wafer surface produced in the multilayer interconnect formation process. By means of the CMP method, surplus copper that is not embedded in trenches is polished to form embedded interconnects (referred to as damascene interconnects), and the interlayer insulating films are leveled by polishing.

Figure 16A:
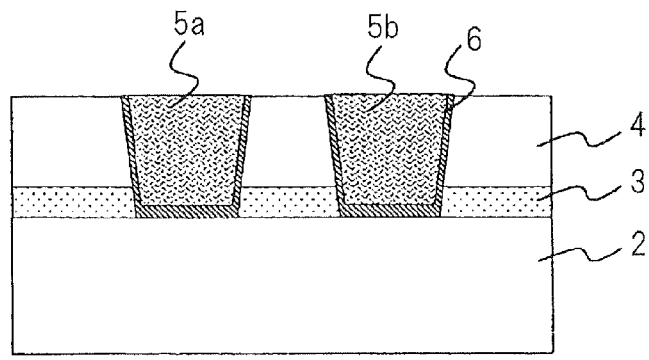
FIG. 16A is a sectional view giving a schematic representation of the manufacturing method of the semiconductor device of the fifth exemplary embodiment.
Figure 16B:
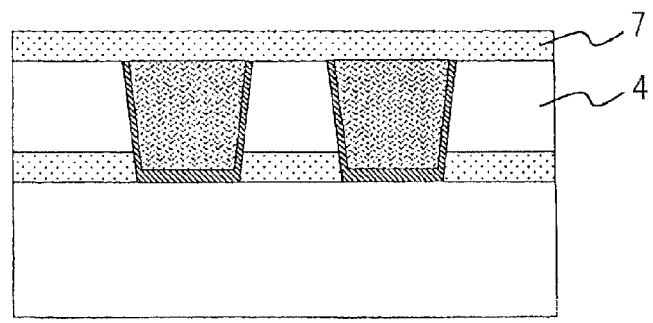
FIG. 16B is a sectional view giving a schematic representation of the manufacturing method of the semiconductor device of the fifth exemplary embodiment.

After Step A1, insulating barrier film 7 is formed on interlayer insulating film 4 that includes first interconnects 5a and 5b (see FIG. 16B). Insulating barrier film 7 is, for example, a silicon carbon nitride (SiCN) film and has a film thickness of 30 nm. Insulating barrier film 7 can be formed by the plasma CVD method. The film thickness of insulating barrier film 7 is preferably in the order of 10 nm-50 nm. The step of fixating insulating barrier film 7 is taken as Step A2.

Figure 16C:
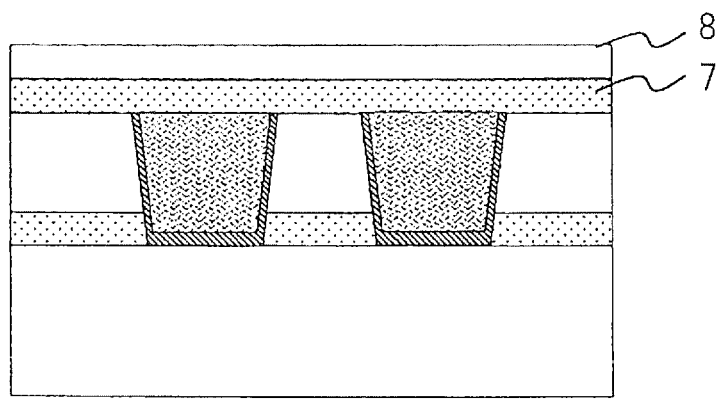
FIG. 16C is a sectional view giving a schematic representation of the manufacturing method of the semiconductor device of the fifth exemplary embodiment.

Hard-mask film 8 is next formed on insulating barrier film 7 (see FIG. 16C). Hard-mask film 8 is, for example, a silicon oxide film. Hard-mask film 8 is preferably of a material that differs from that of insulating barrier film 7 from the standpoint of increasing the etching selectivity of insulating barrier film 7 and hard-mask film 8 in the process of dry etching insulating barrier film 7. If the etching selectivity is high, hard-mask film 8 may be an insulating film or a conductive film. As hard-mask film 8, materials such as a silicon oxide film, a silicon nitride film, titanium nitride (TiN), titanium (Ti), tantalum (Ta), and tantalum nitride (TaN) may be used, or a laminated body of silicon nitride (SiN)/silicon dioxide ($SiO_2$) may be used. The step of forming hard-mask film 8 is taken as Step A3.

A photoresist (not shown) is next formed on hard-mask film 8 and a predetermined mask is used to carry out an exposure process to pattern an opening in the photoresist. An opening pattern is next formed in hard-mask film 8 by dry-etching hard-mask film 8 using the photoresist as a mask. The photoresist is next stripped away by, for example, oxygen plasma aching (see FIG. 17A). At this time, the dry etching does not necessarily stop at the upper surface of insulating barrier film 7 and may halt after having reached as far as the interior of insulating barrier film 7. The processes from forming the photoresist on hard-mask film 8 up to removing the photoresist are taken as Step A4.

Figure 17A:
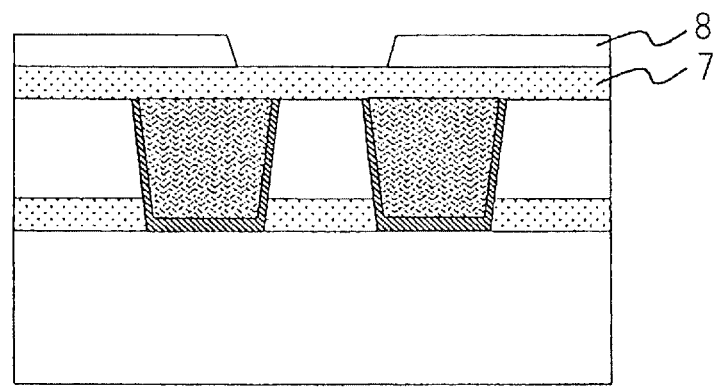
FIG. 17A is a sectional view giving a schematic representation of the manufacturing method of the semiconductor device of the fifth exemplary embodiment.
Figure 17B:
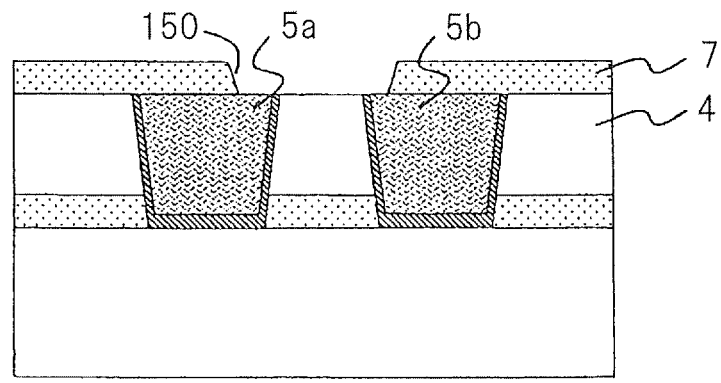
FIG. 17B is a sectional view giving a schematic representation of the manufacturing method of the semiconductor device of the fifth exemplary embodiment.

Insulating barrier film 7 that is exposed in the opening of hard-mask film 8 is next subjected to etch-back (dry etching) with hard-mask film 8 shown in FIG. 17A as a mask. By means of this etching, opening 150 is formed in insulating barrier film 7, portions of the upper surface of each of first interconnects 5a and 5b being exposed from opening 150. At this time, opening 150 may reach as far as the interior of interlayer insulating film 4. An organic peeling process is next carried out by means of an amine stripping agent to both remove the copper oxide that has formed on the exposed surfaces of first interconnects 5a and 5b and remove etching by-products produced at the time of etch-back (see FIG. 17B). The steps from dry-etching to the organic peeling process are taken as Step A5.

In Step A5, hard-mask film 8 shown in FIG. 17A is preferably completely eliminated during etch-back, but may be left unchanged if hard-mask film 8 is an insulating material. In addition, the shape of opening 150 may be a circle, a square, or a quadrangle. When the shape of opening 150 is a circle, the diameter can be from 20 nm to 500 nm, and when shape of opening 150 is a quadrangle, the length of one side can be from 20 nm to 500 nm.

If reactive dry etching is employed in the etch-back process upon insulating barrier film 7 in Step A5, the wall surfaces of opening 150 can be made a tapered shape. In reactive dry etching, a gas that contains fluorocarbon can be used as the etching gas.

Figure 17C:
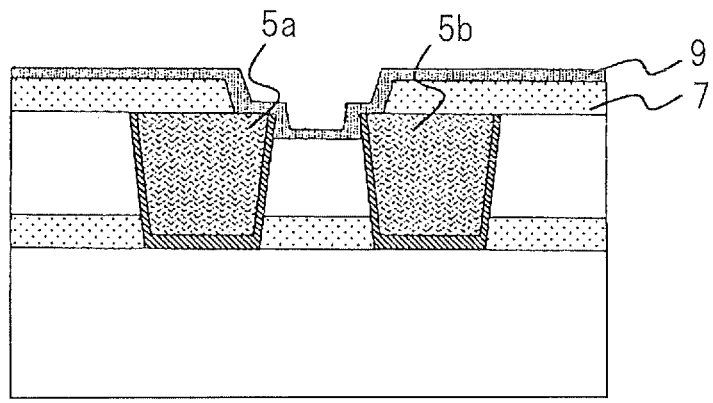
FIG. 17C is a sectional view giving a schematic representation of the manufacturing method of the semiconductor device of the fifth exemplary embodiment.

Variable resistance element film 9 is next deposited on the exposed surfaces of first interconnects 5a and 5b and insulating barrier film 7 (see FIG. 17C). Variable resistance element film 9 is a material such as $Si_1C_3O_1$, TaSiO, $Ta_2O_5$, ZrO, or HfO. The film thickness of variable resistance element film 9 is, for example, 6 nm. Variable resistance element film 9 may also be $SiO_xC_y$, $TaSiO_x$, $TaO_x$, $ZrO_x$, $HfO_x$, $SiO_x$, $TiO_x$, $C_xH_y$, $C_xH_ySi_aO_b$, or an organic film. However, the subscripts X, Y, a, and b are assumed to be integers equal to or greater than "1" and are determined by realizable bonded states. Variable resistance element film 9 can be formed by using a PVD method or CVD method, this method being, for example, a plasma CVD method that uses an organic silica raw material. The shaping process of variable resistance element film 9 is taken as Step A6.

In Step A6, because water adheres to opening 150 of insulating barrier film 7 due to the organic peeling process of Step A5, a heat process is preferably applied at a temperature in the range of 250° C.-350° C. under reduced pressure and degassing is carried out before depositing variable resistance element film 9. At this time, care must be taken to carry out the heat process in a vacuum or in a nitrogen atmosphere such that the copper surface is not again oxidized.

In Step A6, before deposition of variable resistance element film 9, first interconnects 5a and 5b that are exposed in opening 150 of insulating barrier film 7 may be subjected to a gas cleaning process that uses hydrogen ($H_2$) gas or a plasma cleaning process. The cleaning process can prevent oxidation of copper that is the material of first interconnects 5a and 5b when forming variable resistance element film 9 and can prevent thermal diffusion (mass transfer) of copper during processing.

In addition, in Step A6, before depositing variable resistance element film 9, the oxidation of copper that is the material of first interconnects 5a and 5b may be prevented by using a PVD method to deposit thin-film titanium (Ti) (not shown) on the substrate surface. The film thickness of the titanium (Ti) is, for example, no greater than 2 nm. The thin-film titanium (Ti) layer is oxidized during the formation of variable resistance element film 9 and becomes titanium oxide.

In addition, when variable resistance elements 22i and 22j are not of the type that uses an ionic conduction layer in variable resistance element film 9, but rather, the type that uses a transition metal oxide (such as titanium oxide (TiO) or nickel oxide (NiO)), second lower electrode (not shown) may be formed on first interconnects 5a and 5b in Step A6 before depositing variable resistance element film 9. As the second lower electrode, a material such as titanium (Ti), titanium nitride (TiN), tungsten (W), tungsten nitride (WN), tantalum (Ta), tantalum nitride (TaN), ruthenium (Ru), or ruthenium oxide (RuOx) may be used, or a laminated construction of these films may be used. The laminated construction is, for example, tantalum nitride (TaN) (lower layer)/ruthenium (Ru) (upper layer). At this time, the total film thickness of the laminated construction must be less than insulating barrier film 7 and preferably should be no more than 10 nm in order to reduce the step height of the element and surface roughness according to the conditions in forming variable resistance element film 9 within insulating barrier film 7.

In addition, in Step A6, because variable resistance element film 9 must be embedded with good coverage in opening 150 that has a step height, a plasma CVD method is preferably used to form variable resistance element film 9.

Figure 18A:
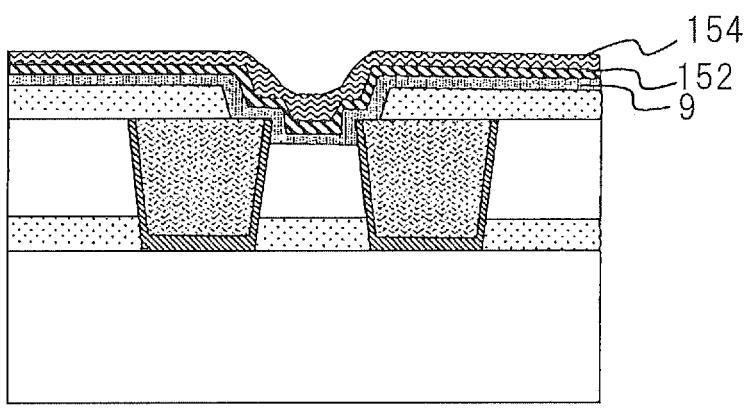
FIG. 18A is a sectional view giving a schematic representation of the manufacturing method of the semiconductor device of the fifth exemplary embodiment.

Next, first conductive film 152 for forming first upper electrode 10 and second conductive film 154 for forming second upper electrode 11 are formed successively on variable resistance element film 9 (see FIG. 18A). First conductive film 152 is, for example, ruthenium (Ru) and has a film thickness of 10 nm. Second conductive film 154 is, for example, tantalum (Ta) and has a film thickness of 50 nm. As when forming variable resistance element film 9, in order to embed the electrode material without producing voids at opening 150 that has a step height, first conductive film 152 is preferably formed by means of, for example, an ALD (Atomic Layer Deposition) method. When first conductive film 152 is ruthenium (Ru), first conductive film 152 can be formed by a plasma ALD method using an organic metal ruthenium (Ru) raw material. The steps of forming first conductive film 152 and second conductive film 154 are taken as Step A7.

Figure 18B:
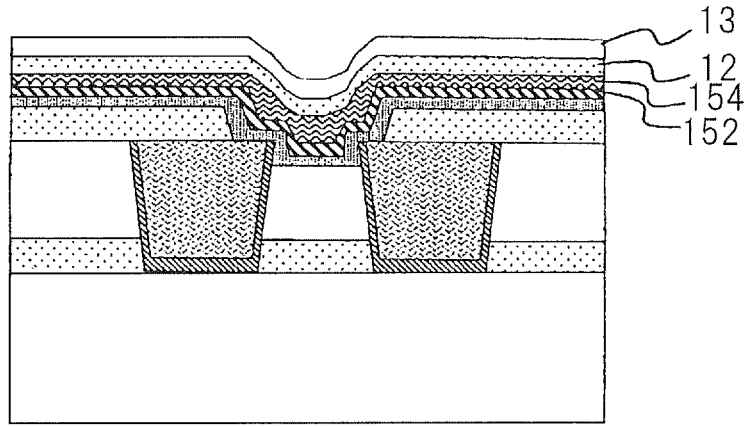
FIG. 18B is a sectional view giving a schematic representation of the manufacturing method of the semiconductor device of the fifth exemplary embodiment.

Hard-mask film 12 and hard-mask film 13 are next formed in order on second conductive film 154 (see FIG. 18B). Hard-mask film 12 is, for example, a silicon nitride (SiN) film and has a film thickness of 30 nm. Hard-mask film 13 is, for example, a silicon dioxide ($SiO_2$) film and has a film thickness of 200 nm. The steps of forming hard-mask film 12 and hard-mask film 13 are taken as Step A8.

In Step A8, hard-mask film 12 and hard-mask film 13 can be formed using a plasma CVD method. Hard-mask films 12 and 13 can be formed using a typical plasma CVD method in the technical field of the present invention. In addition, hard-mask film 12 and hard-mask film 13 are preferably films of different types. As an example, a configuration can be considered in which hard-mask film 12 is a silicon nitride (SiN) film and hard-mask film 13 is a silicon dioxide ($SiO_2$) film. In addition, hard-mask film 12 is preferably of the same material as protective insulating film 14 and insulating barrier film 7. The reason for this is that, as described hereinabove, enclosing the variable resistance elements by the same material unifies the material interfaces, and further, both prevent intrusion by moisture from the outside and prevent the desorption of oxygen from the variable resistance elements themselves.

When hard-mask film 12 is formed by a plasma CVD method, the reaction chamber must be maintained at reduced pressure before film formation, and desorption of oxygen from variable resistance element film 9 at this time raises the problem of an increase in leak current of the ionic conduction layer due to the lack of oxygen. In order to prevent this problem from occurring, the film formation temperature is preferably kept no greater than 350° C., and more preferably, the film formation temperature is kept no greater than 250° C. Further, because variable resistance element film 9 is exposed to film formation gas at reduced pressure before film formation, reducing gas is preferably not used. For example, a silicon nitride (SiN) film formed by high-density plasma of a mixed gas of silane ($SiH_4$)/nitrogen ($N_2$) is preferably used for hard-mask film 12.

A photoresist (not shown) is next formed for patterning the variable resistance element portion on hard-mask film 13, following which hard-mask film 13 is subjected to dry-etching with this photoresist as a mask until hard-mask film 12 is exposed. Oxygen plasma ashing and organic peel is then used to eliminate the photoresist (see FIG. 18C). The steps of patterning hard-mask film 13 after removing the photoresist on hard-mask film 13 up until the removal of the photoresist are taken as Step A9.

Figure 18C:
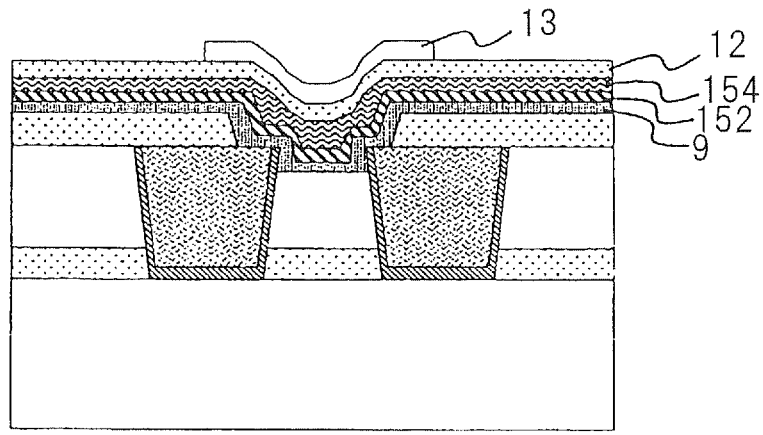
FIG. 18C is a sectional view giving a schematic representation of the manufacturing method of the semiconductor device of the fifth exemplary embodiment.
Figure 19A:
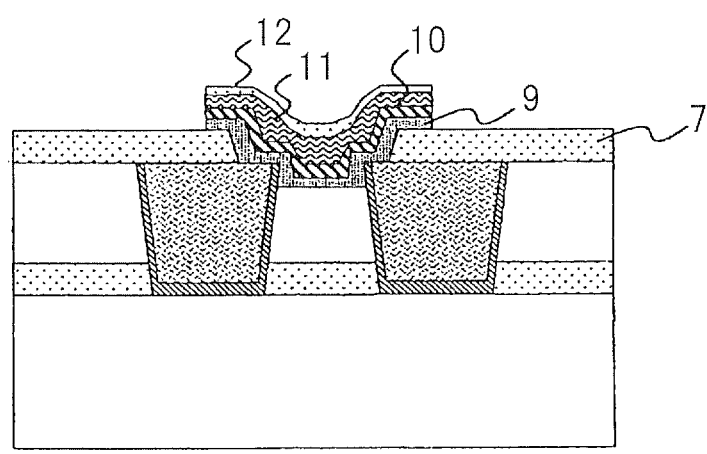
FIG. 19A is a sectional view giving a schematic representation of the manufacturing method of the semiconductor device of the fifth exemplary embodiment.

After Step A9, hard-mask film 12, second conductive film 154, first conductive film 152, and variable resistance element film 9 are subjected continuously to dry-etching with hard-mask film 13 shown in FIG. 18C as a mask to form second upper electrode 11 and first upper electrode 10 (see FIG. 19A). At this time, hard-mask film 13 is preferably completely removed during dry-etching as shown in FIG. 19A, but the film may also remain. The step of patterning hard-mask film 12, second upper electrode 11, first upper electrode 10, and variable resistance element film 9 by implementing dry-etching with hard-mask film 13 as a mask is taken as Step A10.

When second upper electrode 11 is, for example, tantalum (Ta), processing can be achieved by RIE (Reactive Ion Etching) by means of chlorine ($Cl_2$) gas, and when first upper electrode 10 is ruthenium (Ru), processing can be achieved by RIE realized by chlorine ($Cl_2$)/oxygen ($O_2$) mixed gas. In addition, when etching variable resistance element film 9, dry-etching must be halted on lower-layer insulating barrier film 7. When variable resistance element film 9 is an oxide that contains tantalum (Ta) and insulating barrier film 7 is a silicon nitride (SiN) film or a silicon carbon nitride (SiCN) film, variable resistance element film 9 can both be processed by RIE and the amount of etching of insulating barrier film 7 can be controlled by adjusting etching conditions by a mixed gas of, for example, tetrafluoromethane ($CF_4$), tetrafluoromethane ($CF_4$)/chlorine ($Cl_2$), or tetrafluoromethane ($CF_4$)/chorine ($Cl_2$)/argon (Ar). By thus using a hard-mask RIE method that implements RIE using a hard mask, compared to a patterning method that uses a photoresist, the variable resistance element parts can be processed without exposing the variable resistance element parts to oxide plasma ashing when removing the photoresist. In addition, when performing an oxidation process by oxygen plasma after processing, the oxygen plasma can be irradiated onto the variable resistance element part without any dependence on the peeling time of the photoresist.

Figure 19B:
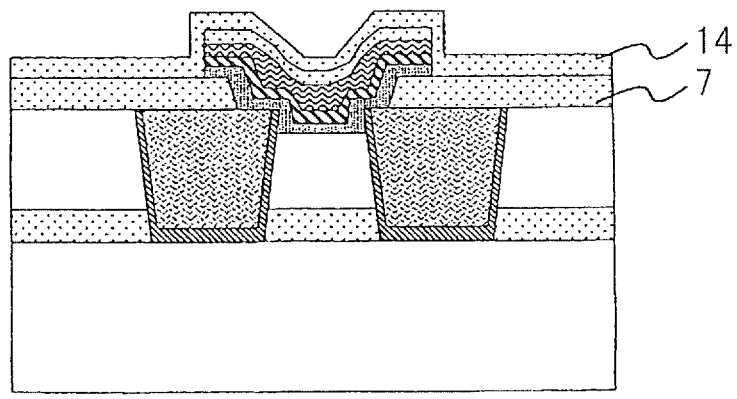
FIG. 19B is a sectional view giving a schematic representation of the manufacturing method of the semiconductor device of the fifth exemplary embodiment.

Protective insulating film 14 that covers hard-mask film 12, second upper electrode 11, first upper electrode 10, and variable resistance element film 9 is next deposited on insulating barrier film 7 (see FIG. 19B). Insulating barrier film 7 is, for example, a silicon nitride (SiN) film and has a film thickness of 30 nm. The step of forming protective insulating film 14 is taken as Step A11.

In Step A11, protective insulating film 14 can be formed by a plasma CVD method, but the problems arise in which the reaction chamber must be maintained at reduced pressure before film formation, and at this time, oxygen is removed from the side surfaces of variable resistance element film 9 and leak current of the ionic conduction layer increases. In order to mitigate this problem, the film formation temperature of protective insulating film 14 is preferably kept no greater than 250° C. Still further, because variable resistance element film 9 is exposed to film-forming gas at reduced pressure before film formation, reducing gas is preferably not used. For example, a silicon nitride (SiN) film is preferably used for protective insulating film 14 that is formed by a high-density plasma of silane ($SiH_4$)/nitrogen ($N_2$) mixed gas at a substrate temperature of 200° C.

Interlayer insulating film 15 and interlayer insulating film 17 are next formed in order on protective insulating film 14. The material of interlayer insulating film 15 is, for example, silicon oxycarbide (SiOC). Hard mask 17 is, for example, a silicon oxide film. An opening for a plug (not shown) is next formed in interlayer insulating film 15, and an interconnect trench for second interconnect (not shown) is formed in interlayer insulating film 17. Next, using a copper dual-damascene interconnect process, a second interconnect and plug are simultaneously formed in the interconnect trench and opening with barrier metal (not shown) interposed. The barrier metal is, for example, a laminated film of tantalum nitride (TaN) (lower layer)/tantalum (Ta) (upper layer). The material of the second interconnect and plug is, for example, copper (Cu). Insulating barrier film 21 is next deposited on interlayer insulating film 17 that includes the second interconnect (see FIG. 15). Insulating barrier film 21 is, for example, a silicon nitride (SiN) film. The steps from forming interlayer insulating film 15 until forming insulating barrier film 21 are taken as Step A12.

In Step A12, the formation of second interconnect (not shown) can employ the same process as the process used when forming first interconnects 5a and 5b. Making barrier metal (not shown) and second upper electrode 11 the same material at this time enables a decrease in the contact resistance between the plug (not shown) and second upper electrode 11 and an improvement in the performance of the elements. The improvement in the element performance is, for example, a decrease in the resistance of variable resistance elements 22i and 22j in the ON state.

In addition, interlayer insulating film 15 and interlayer insulating film 17 can be formed by a plasma CVD method in Step A12.

In addition, in Step A12, in order to eliminate the step height formed by variable resistance elements 22i and 22j, interlayer insulating film 15 may be deposited more thickly and the upper surface of interlayer insulating film 15 may be shaved and leveled by a CMP method to form interlayer insulating film 15 at the desired film thickness.

In the present exemplary embodiment, as in the second exemplary embodiment, by making first interconnect 5 the lower electrodes of variable resistance elements 22i and 22j, first interconnect 5 serves as the lower electrodes of variable resistance elements 22i and 22j. As a result, not only can higher density be realized by the miniaturization of variable resistance elements 22i and 22j, but an improvement in reliability can also be achieved due to the ability to form complementary variable resistance elements.

In addition, compared to a case of forming first interconnect and lower electrodes in separate steps, an increase in the number of steps can be limited to simplify processing, and the resistance of the lower electrode can be decreased. In addition, when first interconnect 5 is formed by a normal copper damascene interconnect process, the variable resistance elements can be formed inside multilayer interconnects by merely adding two lithography steps. Because the resistance of the lower electrode decreases, and further, increase in the number of steps is reduced and necessary mask sets in just two lithography steps may be prepared, as described hereinabove, lower resistance of the elements and lower costs can be simultaneously achieved.

Still further, variable resistance elements 22i and 22j can be mounted even in the interior of a leading-edge device that is made up by copper interconnects to achieve an improvement of device performance.

Working Example 6

A working example of the semiconductor device of the fifth exemplary embodiment is next described. The present working example relates to the sectional construction of a portion that includes plug 19 and second interconnect 18 that were not shown in FIG. 15.

Figure 20:
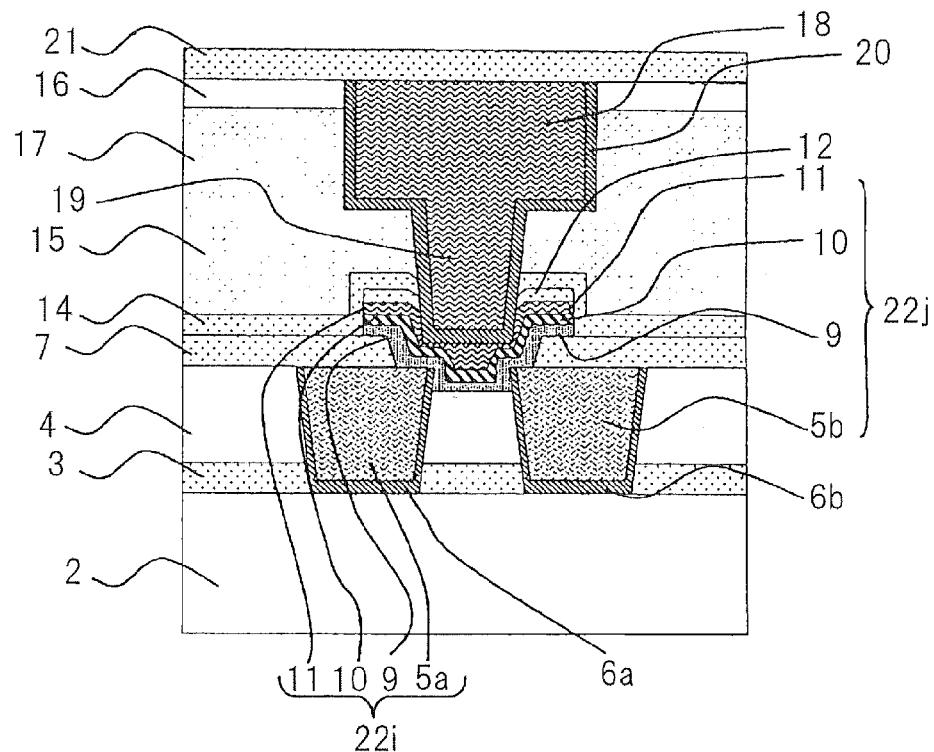
FIG. 20 is a sectional view showing an example of the configuration of the semiconductor device of Working Example 6.

FIG. 20 is a sectional view showing an example of the configuration of the semiconductor device of Working Example 6. Constructions that are the same as those in the above-described exemplary embodiments and working examples are given the same reference numbers and detailed explanation of these parts is here omitted.

As shown in FIG. 20, plug 19 and second interconnect 18 are provided in interlayer insulating film 15 and interlayer insulating film 17, and the side surfaces and bottom surface of the conductive unified construction composed of plug 19 and second interconnect 18 are covered by barrier metal 20. Plug 19 contacts second upper electrode 11 by way of barrier metal 20.

In the example shown in FIG. 20, interlayer insulating film 15 and interlayer insulating film 17 are represented as a unified construction, and the interfaces of these films are not shown in the figure. Plug 19 and second interconnect 18 are also represented as a unified construction, and the interface of plug 19 and second interconnect 18 is also not shown in the figure.

Barrier metal 20 is preferably of the same material as second upper electrode 11. For example, when barrier metal 20 is a laminated construction of tantalum nitride (TaN) (lower layer)/tantalum (Ta) (upper layer), tantalum nitride (TaN) that is the lower-layer material is preferably used as the material of second upper electrode 11. When barrier metal 20 is titanium (Ti) (lower layer)/ruthenium (Ru) (upper layer), titanium (Ti) that is the lower-layer material is preferably used as the material of second upper electrode 11.

As described hereinabove, second upper electrode 11 is preferably the same material as barrier metal 20. Second upper electrode 11 is electrically connected to plug 19 by way of barrier metal 20. The area of the region in which plug 19 and second upper electrode 11 make contact, or more strictly speaking, the region in which barrier metal 20 and second upper electrode 11 make contact (assumed to be a circle with diameter R2), is set smaller than the area of the horizontal surface of the region in which first interconnects 5a and 5b contact variable resistance element film 9a (assumed to be a circle with diameter R1). In other words, these areas are in the relation R2<R1. Adopting this configuration enables preventing the occurrence of voids and embedding defects of the plating (for example, copper plating) of the opening that is formed in interlayer insulating film 15 that is the connection portion of second upper electrode 11 and plug 19.

The manufacturing method of the semiconductor device of the present working example is similar to the manufacturing method that was described with reference to FIGS. 16A-19B, and detailed explanation of the manufacturing method is therefore here omitted.

Working Example 7

Another working example of the semiconductor device of the fifth exemplary embodiment is next described. The semiconductor device of the present working example is of a configuration in which the upper electrodes of the variable resistance elements are connected to the second interconnect without passing by way of a plug.

Figure 21:
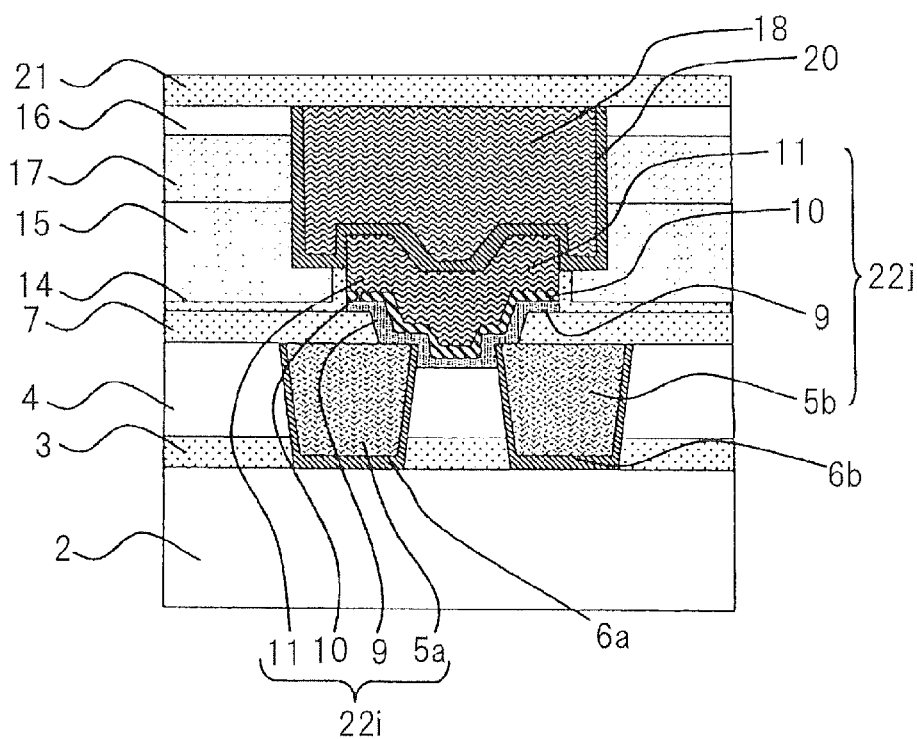
FIG. 21 is a sectional view showing an example of the configuration of the semiconductor device of Working Example 7.

FIG. 21 is a sectional view showing an example of the configuration of the semiconductor device of Working Example 7. Constructions that are the same as those of the above-described exemplary embodiments or working examples are given the same reference numbers and detailed explanation of these constructions is here omitted.

As shown in FIG. 21, in the semiconductor device of the present working example, the film thicknesses of first upper electrode 11 and second electrode 18 are each made greater than in Working Example 6. First upper electrode 11 and second interconnect are connected just by way of barrier metal 20 and not by way of a plug.

According to the present working example, the step of forming a plug can be omitted. The manufacturing method of the semiconductor device of the present working example is the same as the manufacturing method described with reference to FIGS. 16A to 19B, and detailed explanation of the manufacturing method is therefore here omitted.

Working Example 8

Another working example of the semiconductor device of the fifth exemplary embodiment is next described. The semiconductor device of the present working example is of a configuration that differs from that of Working Example 7 in that the upper electrodes of the variable resistance elements and the second interconnect are connected without an interposed plug.

Figure 22:
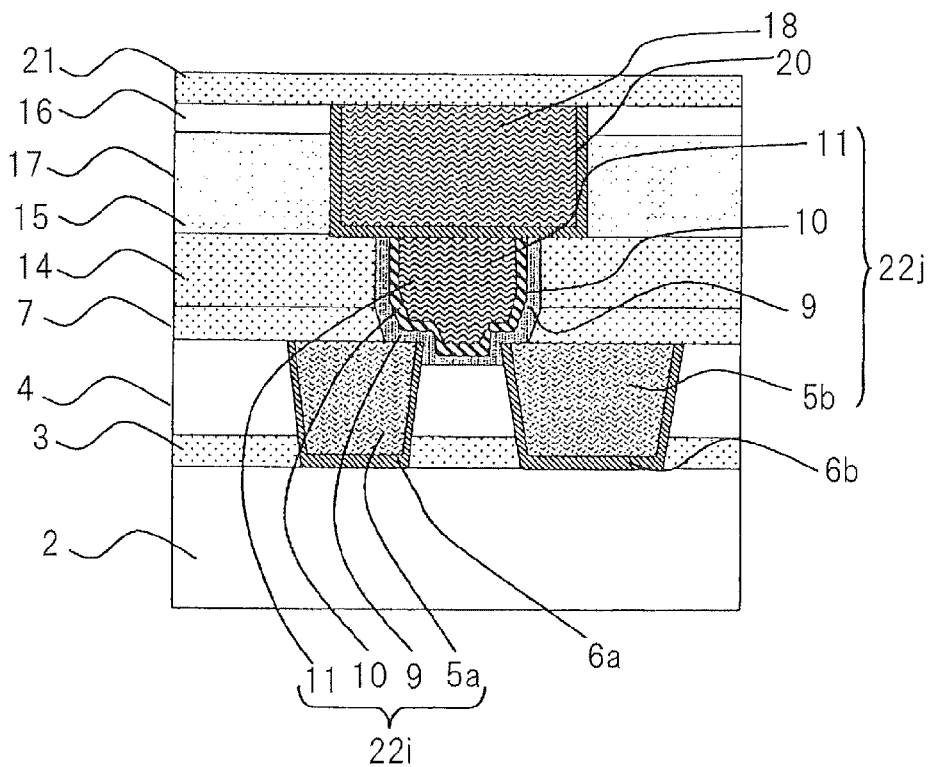
FIG. 22 is a sectional view showing an example of the configuration of the semiconductor device of Working Example 8.

FIG. 22 is a sectional view showing an example of the configuration of the semiconductor device of Working Example 8. Constructions that are the same as in the above-described exemplary embodiments and working examples are given the same reference numbers and detailed explanation of these parts is here omitted.

As shown in FIG. 22, in the semiconductor device of the present working example, the film thickness of interlayer insulating film 14 is made greater than in Working Example 6, whereby the opening formed in interlayer insulating film 14 is deeper. By embedding the material of first upper electrode 11 in this opening, first upper electrode 11 is connected with second interconnect without the interposition of a plug.

In the present working example as well, the step of forming a plug can be omitted. Further, because the manufacturing method of the semiconductor device of the present working example is the same as the manufacturing method described with reference to FIGS. 16A to 19B, a detailed explanation of this manufacturing method is here omitted.

Working Example 9

Another working example of the semiconductor device of the fifth exemplary embodiment is next described. The semiconductor device of the present working example includes a configuration in which the second interconnect is connected to the variable resistance elements by way of a plug and first interconnect.

Figure 23:
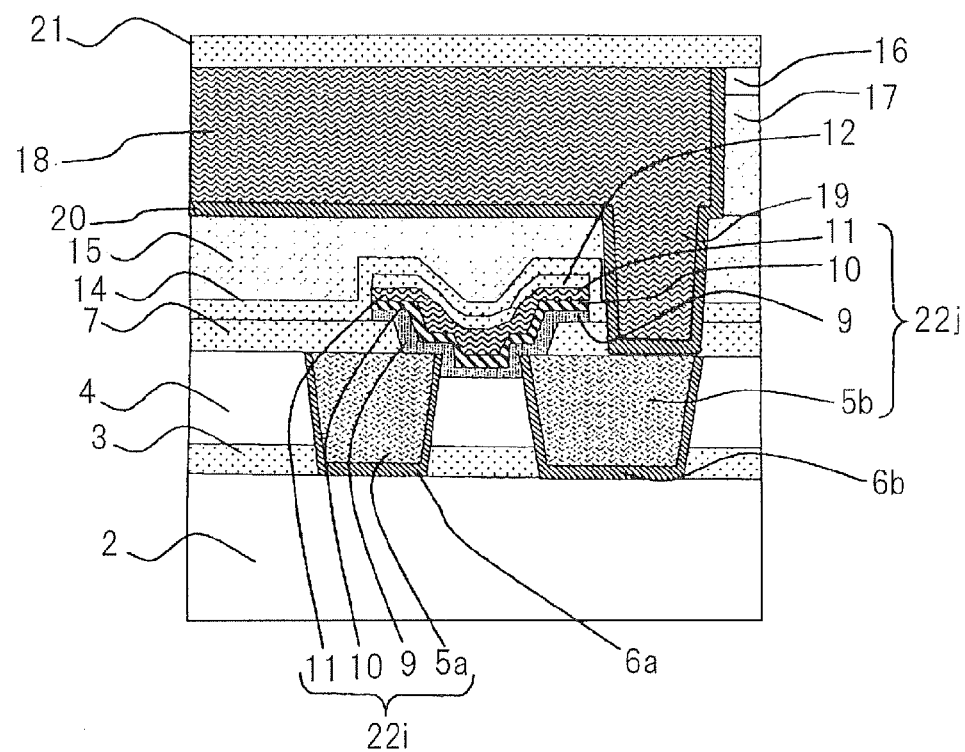
FIG. 23 is a sectional view showing an example of the configuration of the semiconductor device of Working Example 9.

FIG. 23 is a sectional view showing an example of the configuration of the semiconductor device of the present working example and shows the sectional construction along line A-A' of the layout diagram shown in FIG. 14. Constructions that are the same as in the above-described exemplary embodiments and working examples are given the same reference numbers and detailed explanation of these parts is here omitted.

As shown in FIG. 23, in the semiconductor device of the present working example, first interconnect 5b in the semiconductor device shown in FIG. 15 is connected to second interconnect 18 by way of barrier metal 20 and plug 19. At first interconnect 5b, the length of the pattern of first interconnect 5b is greater in the left-right direction shown in FIG. 23 than that of first interconnect 5b shown in FIG. 15. This feature is for the purpose of securing the area of the upper surface of first interconnect 5b for both connecting first interconnect 5b to variable resistance element film 9 and connecting first interconnect 5b to plug 19.

The side surfaces and bottom surface of first interconnect 5a are covered by barrier metal 6a, and the side surfaces and bottom surface of first interconnect 5b are covered by barrier metal 6b. Barrier metal 6a and 6b are of the same configuration as barrier metal 6 described in the second exemplary embodiment and detailed explanation is therefore here omitted. Second interconnect 18 is formed in an interconnect trench that has been provided in interlayer insulating film 17 and etch-stop film 16, and plug 19 is formed in an opening that has been provided in interlayer insulating film 15. The side surfaces and bottom surface of the conductive unified construction that is made up from plug 19 and second interconnect 18 are covered by barrier metal 20.

The manufacturing method of the semiconductor device of the present working example is next described. Detailed explanation of processes that are the same as those in the manufacturing method described in the fifth exemplary embodiment is here omitted. FIGS. 24A to 30B are sectional views giving a schematic representation of the manufacturing method of the semiconductor device of Working Example 9. The unit Torr of pressure is 1 Torr=1.33.3 Pa.

After forming a semiconductor element on a semiconductor substrate (not shown), interlayer insulating film 2 is deposited on this semiconductor substrate. Interlayer insulating film 2 is, for example, a silicon oxide film and has a film thickness of 300 nm Barrier insulating film 3 and interlayer insulating film 4 are next deposited successively on interlayer insulating film 2. Barrier insulating film 3 is, for example, a silicon carbon nitride (SiCN) film and has a film thickness of 30 nm. Interlayer insulating film 4 is, for example, a silicon oxide film, and has a film thickness of 200 nm.

Next, using a lithography method (including photoresist formation, dry-etching, and photoresist removal), interconnect trenches are formed in interlayer insulating film 4 and barrier insulating film 3. Copper is then embedded in the interconnect trenches that were formed with barrier metal 6 interposed to form first interconnects 5a and 5b (see FIG. 24A). Barrier metal 6 is, for example, a laminated film of tantalum nitride (TaN)/tantalum (Ta) with film thicknesses of 5 nm/5 nm.

Figure 24A:
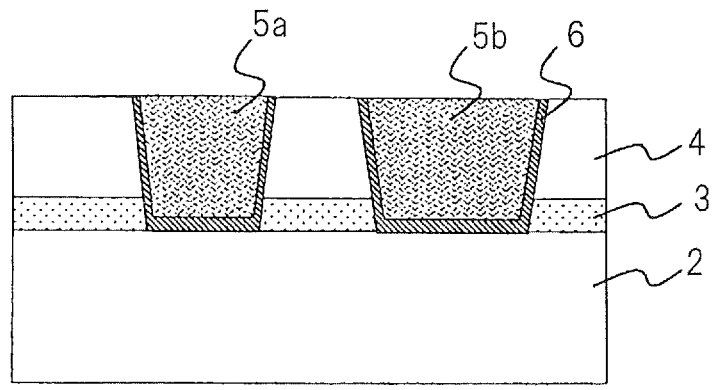
FIG. 24A is a sectional view giving a schematic representation of the manufacturing method of the semiconductor device of Working Example 9.
Figure 24B:
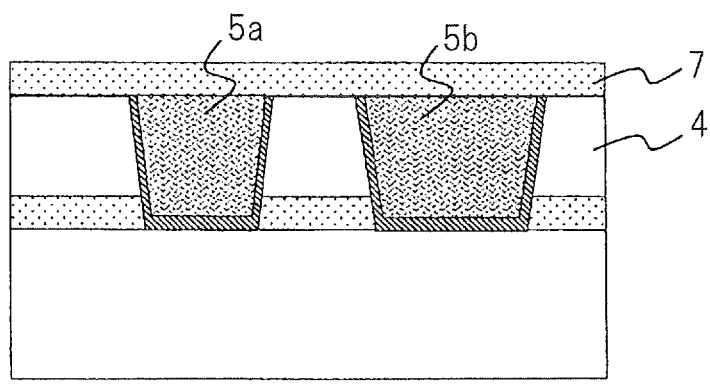
FIG. 24B is a sectional view giving a schematic representation of the manufacturing method of the semiconductor device of Working Example 9.
Figure 24C:
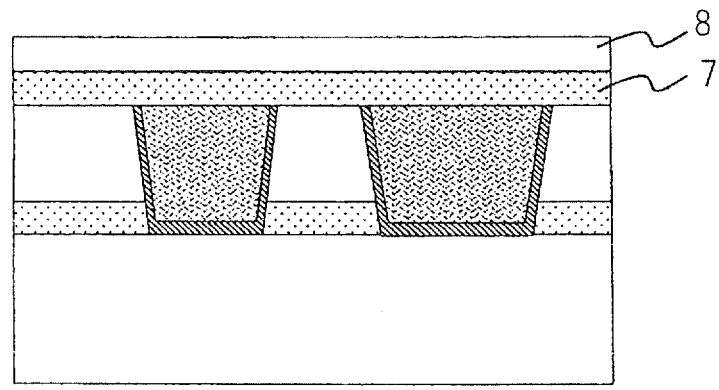
FIG. 24C is a sectional view giving a schematic representation of the manufacturing method of the semiconductor device of Working Example 9.

Insulating barrier film 7 is next formed on interlayer insulating film 4 that includes first interconnects 5a and 5b (see FIG. 24B). Insulating barrier film 7 is, for example, a silicon carbon nitride (SiCN) film and has a film thickness of 30 nm. Hard-mask film 8 is further formed on insulating barrier film 7 (see FIG. 24C). Hard-mask film 8 is, for example, a silicon oxide film.

A photoresist (not shown) is next formed on hard-mask film 8, and a predetermined mask is used to carry out an exposure process to pattern an opening portion in the photoresist. This photoresist is next used as a mask to subject hard-mask film 8 to dry etching to form an opening pattern on hard-mask film 8. The photoresist is then peeled off by means of, for example, oxygen plasma ashing (see FIG. 25A).

Figure 25A:
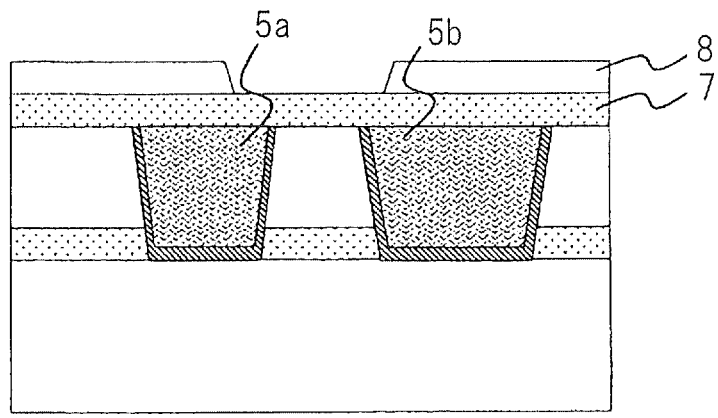
FIG. 25A is a sectional view giving a schematic representation of the manufacturing method of the semiconductor device of Working Example 9.
Figure 25B:
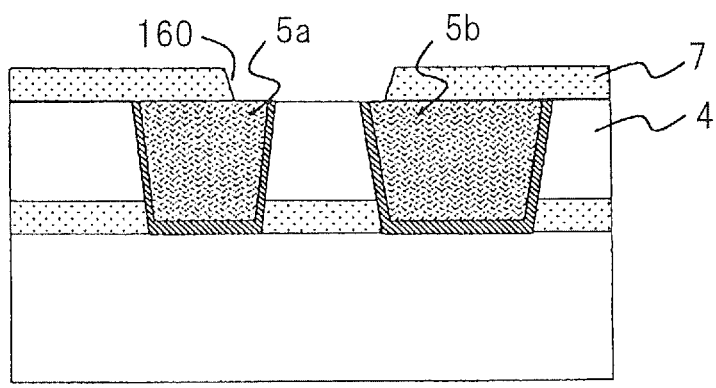
FIG. 25B is a sectional view giving a schematic representation of the manufacturing method of the semiconductor device of Working Example 9.

Hard-mask film 8 shown in FIG. 25A is next used as a mask to subject insulating barrier film 7 that is exposed in the opening of hard-mask film 8 to etch-back (reactive dry etching). Opening 160 is formed in insulating barrier film 7 by means of this etching, and portions of the upper surfaces of each of first interconnects 5a and 5b are exposed from opening 160. The copper oxide that has formed on the exposed surfaces of first interconnects 5a and 5b is then removed by carrying out an organic peeling process by means of an amine stripping agent and the etching by-products that were produced at the time of etch-back are also removed. The organic components and moisture are next eliminated by heating the substrate for one minute in an atmosphere of reduced pressure at 350° C. Oxides on the surface of first interconnect 5a are then removed by means of plasma cleaning by a mixed gas of hydrogen ($H_2$)/helium (He) (FIG. 25B). Many of the processes to this point are the same as in the fifth exemplary embodiment. Because few of the processes require detailed explanation, the processes from the formation of interlayer insulating film 2 up to the plasma cleaning are taken as Step B1.

In Step B1, the reactive dry etching (etch-back) when forming opening 160 of insulating barrier film 7 can be carried out under the conditions of a gas flow rate of tetrafluoromethane ($CF_4$)/argon (Ar)=25:50 sccm, pressure at 4 mTorr, source power of 400 W, and substrate bias power of 90 W. At this time, an opening can be formed that reaches as far as the interior of interlayer insulating film 4 by implementing etching equivalent to 55 nm (approximately 80% over) with respect to the film thickness 30 nm of insulating barrier film 7.

In addition, in Step B1, heating under reduced pressure at 350° C. can be carried out in a heat chamber that is mounted in a sputtering device.

After the processes of Step B1, the upper surface of first interconnect 5*b* is exposed in opening 160 but remains covered by insulating barrier film 7 in areas other than opening 160.

Figure 25C:
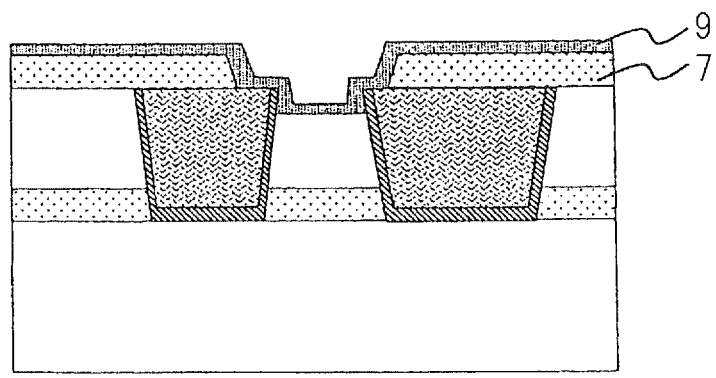
FIG. 25C is a sectional view giving a schematic representation of the manufacturing method of the semiconductor device of Working Example 9.

Variable resistance element film 9 is next deposited on the exposed surfaces of first interconnects 5*a* and 5*b* and insulating barrier film 7 by a plasma CVD method (see FIG. 25C). The material of variable resistance element film 9 is, for example, silicon oxycarbide (SiOC) or silicon oxycarbide ($Si_1O_1C_3$) and the film thickness is 6 nm. First conductive film 152 and second conductive film 154 are next formed successively on variable resistance element film 9 (see FIG. 26A). The material of first conductive film 152 is, for example, ruthenium (Ru), and the film thickness is 10 nm. The material of second conductive film 154 is, for example, tantalum (Ta), and the film thickness is 50 nm. The processes from forming variable resistance element film 9 up to forming second conductive film 154 are taken as Step B2.

In the film formation step of variable resistance element film 9 in Step B2, variable resistance element film 9 can be formed under the conditions of: a flow rate of the organic siloxane raw material indicated in the chemical formula [chemical formula 1] of 65 sccm, introduction into the chamber of a film-formation device using helium (He) as a carrier gas, RF power of 88 W, temperature of 350° C., and pressure at 4.5 Torr.

[Chemical Formula 1]

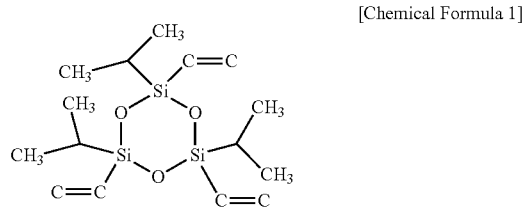 [SMILES: C=C[Si]1(C(C)C)O[Si](C=C)(C(C)C)O[Si](C=C)(C(C)C)O1]

In addition, in Step B2, first conductive film 152 can be formed by DC (Direct Current) sputtering with ruthenium (Ru) as a target under the conditions of: DC power of 0.2 kW, argon (Ar) gas, and at a pressure of 2 mTorr. Second conductive film 154 can be formed by DC sputtering with tantalum (Ta) as a target and otherwise, under the same conditions as for first conductive film 152. Because both conductive films are formed under reduced pressure, concern exists that oxygen will be desorbed from variable resistance element film 9, but these conductive films are formed at room temperature to limit the desorption of oxygen from variable resistance element film 9.

Another formation method of first conductive film 152 is next described. In Step B2, first conductive film 152 can be formed by using organic metal ruthenium (Ru) according to an ALD method at a substrate temperature no greater than 300° C. For example, ethyl cyclopentadienyl ruthenium can be used as the organic metal ruthenium (Ru) raw material. When a shape having a step height must be subjected to embedding, taking into consideration the coverability of the side surfaces of the stepped shape, an ALD method may be selected over a DC sputtering method. When ruthenium (Ru) is used for first conductive film 152, the film thickness of ruthenium (Ru) is no greater than 10 nm, and preferably, within the range of from 2 to 10 nm.

In an ALD method, a method is known of carrying out a hydrogen ($H_2$) plasma process after supplying organic metal ruthenium (Ru) raw material to decrease carbon in the film. This method is called the PEALD (Plasma Enhanced ALD) method, and the PEALD method may be used in the formation of first conductive film 152. When the PEALD method is used to form first conductive film 152, as the conditions of foiining the ruthenium (Ru) film without damaging the underlying variable resistance element film 9 (its material being, for example, silicon oxycarbide (SiOC)), a plasma process is preferably carried out with a mixed gas ratio of nitrogen ($N_2$):hydrogen ($H_2$)=1:2. RF power on the order of 200 W is preferable, but damage to variable resistance element film 9 depends on, for example, the supplied amount of raw material and the configuration of the chamber. As a result, the RF power is preferably adjusted such that the sheet resistance of the ruthenium (Ru) film is no greater than 100 µΩ, and preferably, in the order of 50 µΩ. By setting these conditions, a growth rate in the order of approximately 0.05 nm/cycle was achieved for the ruthenium (Ru) film. The gas used in the plasma process is not limited to hydrogen ($H_2$) and any of helium (He), argon (Ar), and nitrogen ($N_2$) may be used.

In addition, second conductive film 154 may be formed by means of a PEALD method that uses an organic tantalum (Ta) raw material, similar to first conductive film 152.

On the other hand, it is known that adhesion between an insulating film and ruthenium (Ru) formed by a typical ALD method is extremely poor. In order to improve adhesion between variable resistance element film 9 and first conductive film 152, the use of either of the following methods is preferable. The first method is a method in which, after forming variable resistance element film 9, ruthenium (Ru) is caused to grow on variable resistance element film 9 by the PEALD method without exposing the substrate to the air. The second method is a method in which ruthenium (Ru) is caused to grow on variable resistance element film 9 in the PEALD method after having implemented the above-described hydrogen ($H_2$)/nitrogen ($N_2$) plasma process on the surface of variable resistance element film 9 without exposing the substrate to the air.

After the process of Step B2, the upper surface of first interconnect 5*b* is covered by insulating barrier film 7 or variable resistance element film 9, and first conductive film 152 and second conductive film 154 are formed on variable resistance element film 9.

Figure 26A:
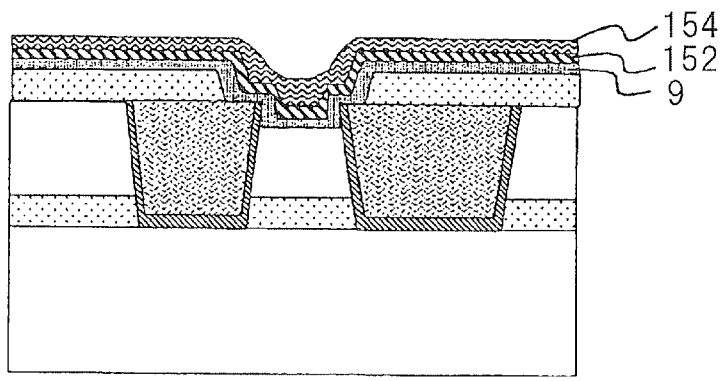
FIG. 26A is a sectional view giving a schematic representation of the manufacturing method of the semiconductor device of Working Example 9.
Figure 26B:
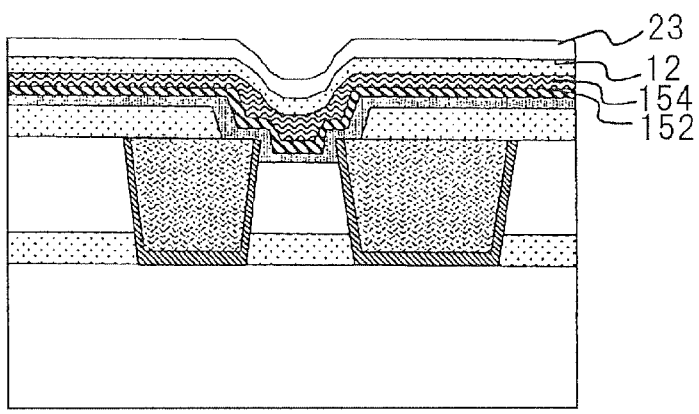
FIG. 26B is a sectional view giving a schematic representation of the manufacturing method of the semiconductor device of Working Example 9.
Figure 26C:
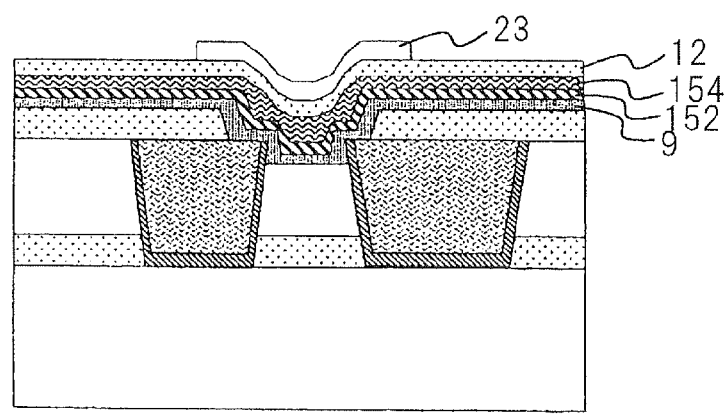
FIG. 26C is a sectional view giving a schematic representation of the manufacturing method of the semiconductor device of Working Example 9.

Hard-mask film 12 and hard-mask film 23 are next formed successively on second conductive film 153 (see FIG. 26B). Hard-mask film 12 is, for example, a silicon nitride (SiN) film and has a film thickness of 30 nm. Hard-mask film 23 is, for example, a silicon dioxide ($SiO_2$) film and has a film thickness of 200 nm. The step of forming hard-mask film 12 and hard-mask film 23 is taken as Step B3. Hard-mask film 12 and hard-mask film 23 can be grown by using a plasma CVD method. Hard-mask film 12 and hard-mask film 23 can be formed by using a typical plasma CVD method in the technical field of the present invention. In the present working example, the film forming temperature was 350° C.

Hard-mask film 23 is a film that serves as a hard mask when etching hard-mask film 12. Hard-mask film 23 is preferably a film of a type that differs from hard-mask film 12. As in the above-described example, if hard-mask film 12 is a silicon nitride (SiN) film, hard-mask film 23 can be a silicon dioxide ($SiO_2$) film.

After the processes of Step B2, the upper surface of first interconnect 5*b* is covered by insulating barrier film 7 or variable resistance element film 9, and first conductive film 152, second conductive film 154, hard-mask film 12, and hard-mask film 23 are formed on variable resistance element film 9.

A photoresist (not shown) is next formed for patterning the variable resistance element portion on hard-mask film 23, and hard-mask film 23 is then subjected to dry etching with this photoresist as a mask until hard-mask film 12 is revealed. Oxygen plasma ashing and organic peeling are next used to remove the photoresist (see FIG. 26C). Then, using hard-mask film 13 as a mask, hard-mask film 12, second conductive film 154, first conductive film 152, and variable resistance element film 9 are subjected to continuous dry etching, whereby second upper electrode 11 and first upper electrode 10 are formed (see FIG. 27A). The processes from forming the photoresist on hard-mask film 23 up to forming second upper electrode 11 and first upper electrode 10 are taken as Step B4.

In Step B4, the dry etching of hard-mask film 23 is preferably halted at the upper surface or in the interior of hard-mask film 12. At this time, variable resistance element film 9 is covered by hard-mask film 12 and is therefore not exposed to oxygen plasma during this dry etching. A typical parallel-plate dry etching device can be used for the dry etching of hard-mask film 23.

In Step B4, the etching of each of hard-mask film 12, second conductive film 154, first conductive film 152, and variable resistance element film 9 can be realized by using a parallel-plate dry etcher. The etching of hard-mask film 12 (for example a silicon nitride (SiN) film) can be carried out under the following conditions: tetrafluoromethane ($CF_4$)/argon (Ar)=25/50 sccm, a pressure of 4 mTorr, a source power of 400 W, and a substrate bias power of 90 W.

The etching of second conductive film 154 (for example, a tantalum (Ta) film) can be carried out under the following conditions: chlorine ($Cl_2$)=50 sccm, a pressure of 4 mTorr, a source power of 400 W, and a substrate bias power of 60 W. The etching of first conductive film 152 (for example, a ruthenium (Ru) film) can be carried out under the following conditions: chlorine ($Cl_2$)/oxygen ($O_2$)=5/40 sccm, a pressure of 4 mTorr, a source power of 900 W, and a substrate bias power of 100 W.

Figure 27A:
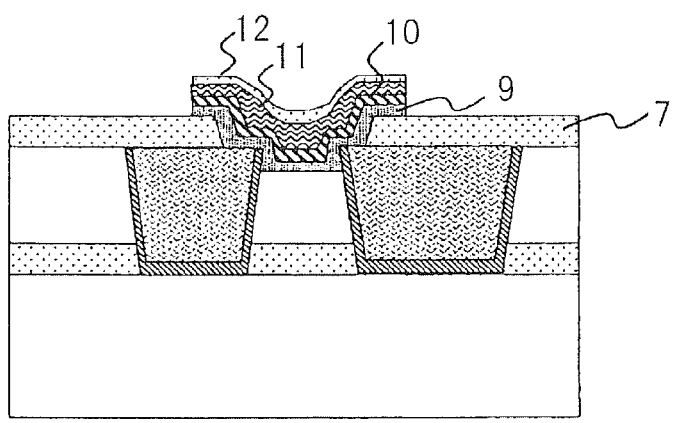
FIG. 27A is a sectional view giving a schematic representation of the manufacturing method of the semiconductor device of Working Example 9.

The etching of variable resistance element film 9 (for example, a silicon oxycarbide (SiOC) film) can be carried out under the following conditions: tetrafluoromethane ($CF_4$)/argon (Ar)=15/15 sccm, a pressure of 10 mTorr, a source power of 800 W, and a substrate bias power of 60 W. By using these conditions, processing can be carried out while limiting the occurrence of subtrenches. At this time, etching conditions are adjusted such that the film thickness of the remaining film of insulating barrier film 7 on first interconnects 5a and 5b is 40 nm. In etching these films, hard-mask film 23 is preferably completely eliminated during etching as shown in FIG. 27A, but hard-mask film 23 may also remain.

Figure 27B:
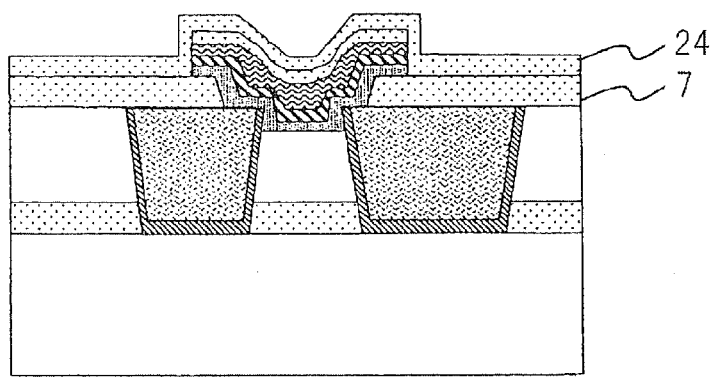
FIG. 27B is a sectional view giving a schematic representation of the manufacturing method of the semiconductor device of Working Example 9.

Protective insulating film 24 that covers hard-mask film 12, second upper electrode 11, first upper electrode 10, and variable resistance element film 9 is next deposited on insulating barrier film 7 (see FIG. 27B). The step of forming protective insulating film 24 is taken as Step B5.

Protective insulating film 24 is an insulating film having the function not only of preventing damage to variable resistance elements 22i and 22j but also of preventing desorption of oxygen from variable resistance element film 9. As examples, a silicon nitride (SiN) film or a silicon carbon nitride (SiCN) film can be used for protective insulating film 24. In Step B5, protective insulating film 24 can be formed by using a high-density plasma with silane ($SiH_4$) and nitrogen ($N_2$) as the raw-material gases at a substrate temperature of 200° C. Because a reducing gas such as ammonia ($NH_3$) or hydrogen ($H_2$) is not used, the reduction of variable resistance element film 9 (for example, a silicon oxycarbide (SiOC) film) can be limited in a film-formation gas stabilizing step immediately before film formation.

Protective insulating film 24 is preferably of the same material as hard-mask film 12 and insulating barrier film 7. When insulating barrier film 7, protective insulating film 24, and hard-mask film 12 are of the same material, such as silicon nitride (SiN) films, the adhesion of the interfaces of these films is improved, thereby unifying these films and protecting the surroundings of variable resistance elements 22i and 22j. As a result, the moisture absorbency, resistance to water, and resistance to oxygen desorption of variable resistance film 9 are improved and the yield and reliability of elements can be improved.

Figure 28A:
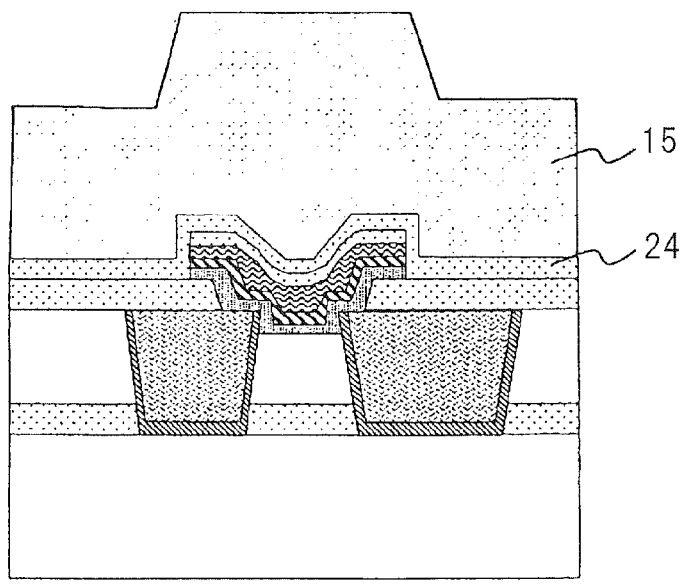
FIG. 28A is a sectional view giving a schematic representation of the manufacturing method of the semiconductor device of Working Example 9.
Figure 28B:
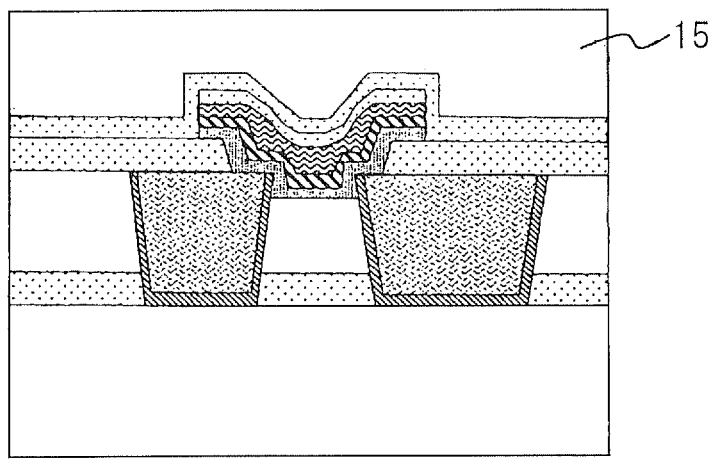
FIG. 28B is a sectional view giving a schematic representation of the manufacturing method of the semiconductor device of Working Example 9.

A plasma CVD method is next used to deposit interlayer insulating film 15 on protective insulating film 24 (see FIG. 28A). Interlayer insulating film 15 is, for example, a silicon oxide film and has a film thickness of 500 nm. The step of forming interlayer insulating film 15 is taken as Step B6.

A CMP method is next used to level the upper surface of interlayer insulating film 15 (see 28B). In leveling protective insulating film 15, approximately 350 nm can be shaved from the apex of interlayer insulating film 15 to make the remaining film thickness approximately 150 nm. In the CMP process for interlayer insulating film 15 at this time, interlayer insulating film 15 can be polished using a typical colloidal silica or a ceria-based slurry. The step of leveling the upper surface of interlayer insulating film 15 is taken as Step B7.

Figure 29A:
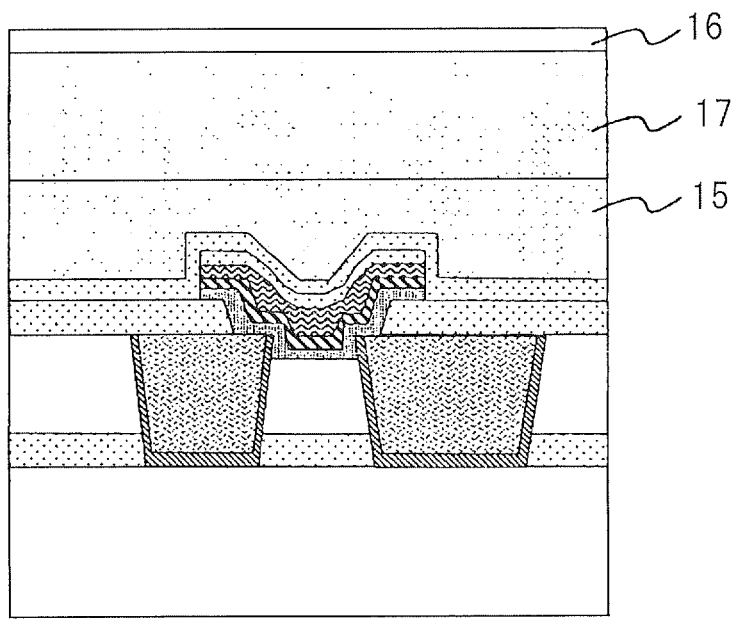
FIG. 29A is a sectional view giving a schematic representation of the manufacturing method of the semiconductor device of Working Example 9.
Figure 29B:
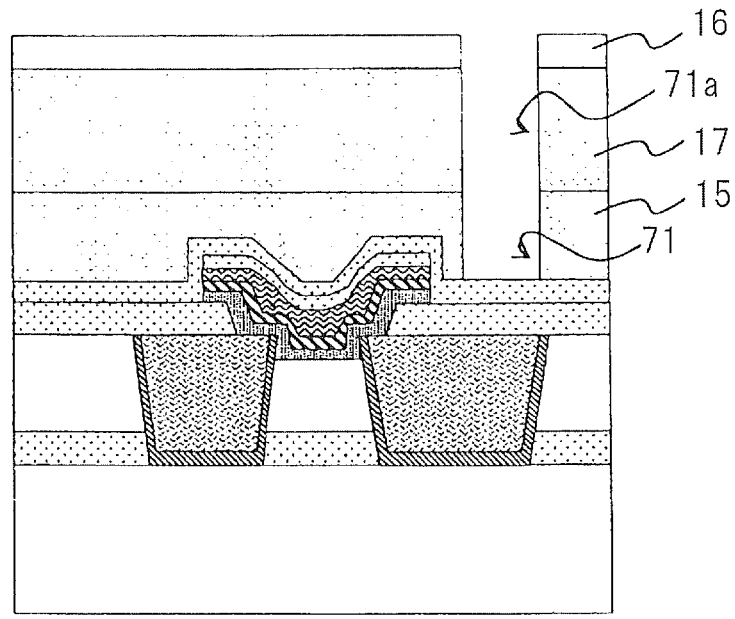
FIG. 29B is a sectional view giving a schematic representation of the manufacturing method of the semiconductor device of Working Example 9.

Interlayer insulating film 17 and etch-stop film 16 are next successively deposited on interlayer insulating film 15 (see FIG. 29A). Interlayer insulating film 17 is, for example, a silicon oxide film and has a film thickness of 300 nm. The steps of forming interlayer insulating film 17 and etch-stop film 16 are taken as Step B8. In Step B8, interlayer insulating film 17 can be deposited using a plasma CVD method.

The method of forming second interconnect 18 and plug 19 by means of a dual damascene method is next described. Dual damascene methods are of a plurality of types such as the trench-first method and the via-first method, but here, the method of forming second interconnect 18 and plug 19 using the via-first method is described.

In the via-first method, a photoresist (not shown) for forming an opening for plug 19 is first formed in etch-stop film 16, following which etch-stop film 16, interlayer insulating film 17, and interlayer insulating film 15 are subjected to dry etching with the photoresist as a mask. In this way, opening 71a is formed in etch-stop film 16 and interlayer insulating film 17 and opening 71 for plug 19 is formed in interlayer insulating film 15. The photoresist is then removed by implementing oxygen plasma ashing and organic peeling (see FIG. 29B). The steps from forming the photoresist for forming the opening for plug 19, forming openings 71 and 71a, and up to the removal of the photoresist are taken as Step B9.

In Step B9, the etching conditions and time are adjusted such that the dry etching halts at insulating barrier film 24.

Figure 30A:
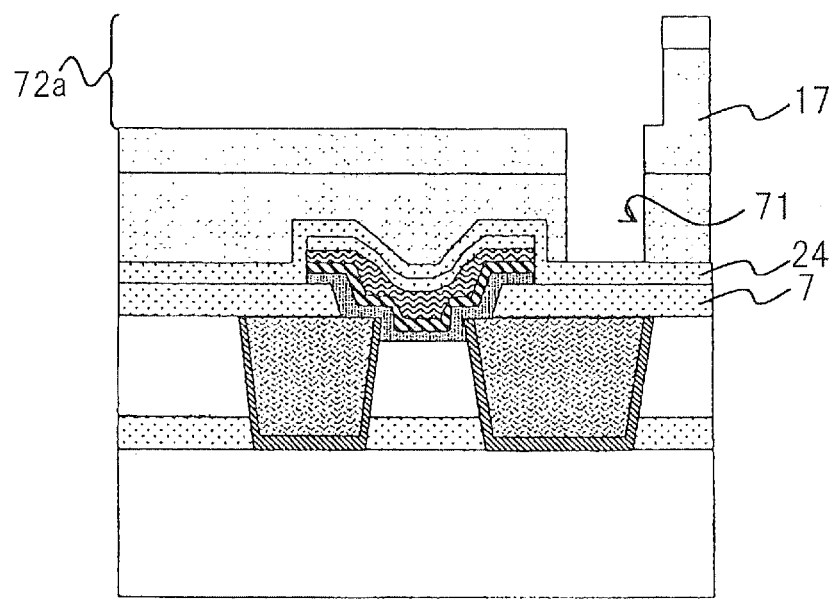
FIG. 30A is a sectional view giving a schematic representation of the manufacturing method of the semiconductor device of Working Example 9.

A photoresist for forming an interconnect trench for second interconnect 18 is next formed on etch-stop film 16, following which etch-stop film 16 and interlayer insulating film 17 are subjected to dry etching with this photoresist as a mask. In this way, provisional interconnect trench 72a for second interconnect 18 is formed in etch-stop film 16 and interlayer insulating film 17. The photoresist is then removed by carrying out oxygen plasma ashing and organic peeling (see FIG. 30A). As shown in FIG. 30A, interlayer insulating film 17 remains at the bottom of provisional interconnect trench 72a. The steps from forming the photoresist for forming the interconnect trench for second interconnect 18, forming provisional interconnect trench 72a, and up to the removal of the photoresist are taken as Step B10.

In Step B10, a coating such as ARC (Anti-Reflection Coating) may be embedded on the bottom of opening 71. In this case, penetration of the bottom of opening 71 can be prevented during etching of interlayer insulating film 17.

In addition, in Step B10, the bottom of opening 71 corresponds to the upper surface of protective insulating film 24, and because the upper surface of first interconnect 5b is protected by protective insulating film 24 and insulating barrier film 7, first interconnect 5b is not damaged by oxidation due to oxygen plasma ashing.

Figure 30B:
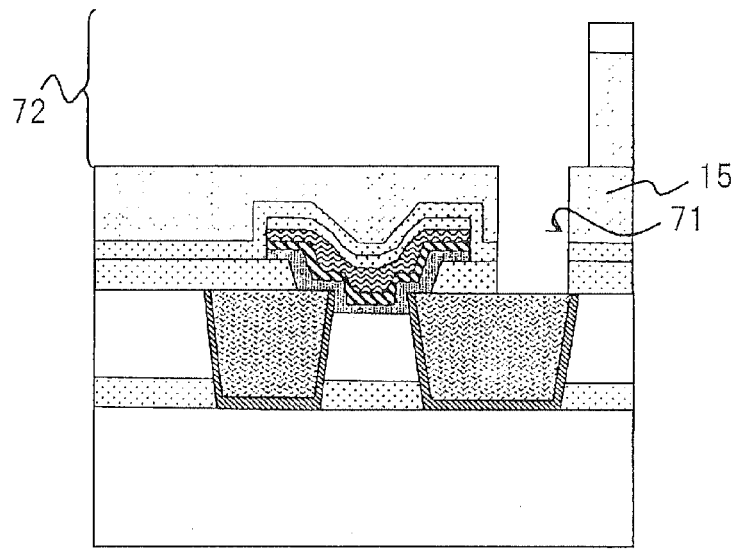
FIG. 30B is a sectional view giving a schematic representation of the manufacturing method of the semiconductor device of Working Example 9.

Next, with etch-stop film 16 as a mask, both interlayer insulating film 17 at the bottom of interconnect trench 72a is subjected to etching and protective insulating film 24 and insulating barrier film 7 at the bottom of opening 71 are subjected to etching, whereby interlayer insulating film 15 is exposed in interconnect trench 72 and first interconnect 5b is exposed in opening 71 (see FIG. 30B).

Second interconnect 18 and plug 19 are then simultaneously formed in interconnect trench 72 and opening 71 with barrier metal 20 interposed. The material of barrier metal 20 is, for example, tantalum (Ta) and the film thickness is 5 nm. The material of second interconnect 18 and plug 19 is, for example, copper (Cu). Insulating barrier film 21 is further deposited on second interconnect 18 and etch-stop film 16 (see FIG. 23). Insulating barrier film 21 is, for example, a silicon nitride (SiN) film. The steps from forming interconnect trench 72a up to forming insulating barrier film 21 are taken as Step B11.

According to the present working example, not only can the same effects be exhibited as in the fifth exemplary embodiment, but in the dual damascene steps of forming plug 19 and second interconnect 18, plug 19 can also be connected to first interconnect 5b.

Figure 31:
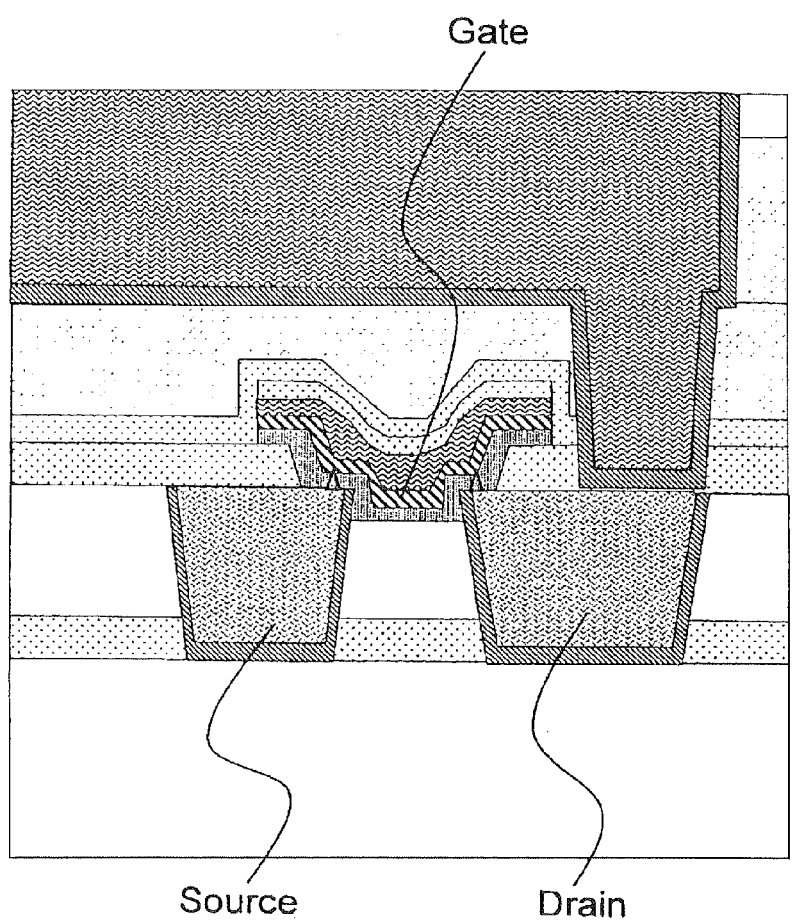
FIG. 31 is a schematic view for describing the write operation of the semiconductor device of Working Example 9.

A write operation of the semiconductor device of the present working example is next described. FIG. 31 is a schematic view for describing the write operation of the semiconductor device of the present working example. Here, three terminals of an MOS transistor are applied in the semiconductor device of the present exemplary embodiment, first interconnect 5a of variable resistance element 22i shown in FIG. 23 being the source electrode (hereinbelow indicated as "Source"), first interconnect 5b of variable resistance element 22j being the drain electrode (hereinbelow indicated as "Drain"), and first upper electrode 10 being the gate electrode (hereinbelow indicated as "Gate").

If the description is placed in correspondence with electrical element 131 shown in FIG. 4, input terminal 121 shown in FIG. 4 corresponds to Source, output terminal 122 corresponds to Drain, and terminal V2 to which the control voltage is applied corresponds to Gate. It is here assumed that transistor 113 shown in FIG. 4 is always in the ON state.

Figure 32A:
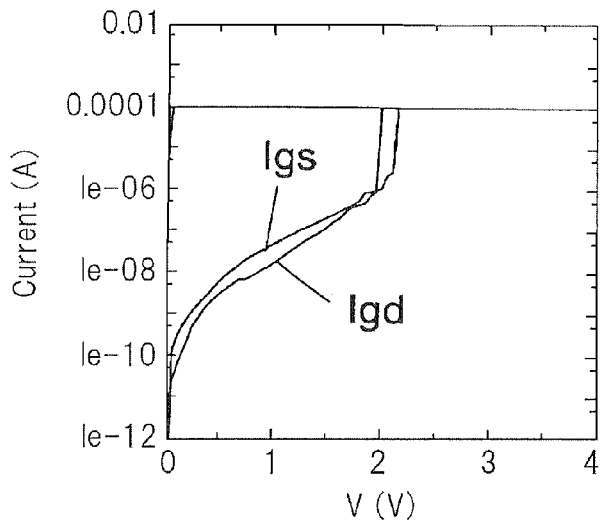
FIG. 32A is a graph showing the voltage-current characteristic when voltage is applied to each terminal of the electrical element shown in FIG. 31.
Figure 32B:
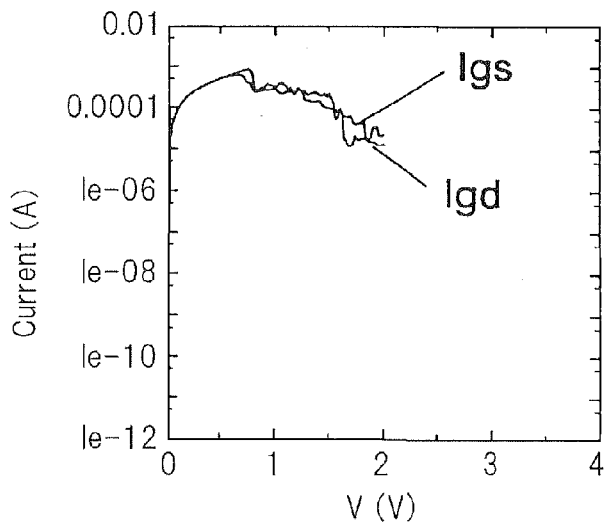
FIG. 32B is a graph showing the voltage-current characteristic when voltage is applied to each terminal of the electrical element shown in FIG. 31.
Figure 32C:
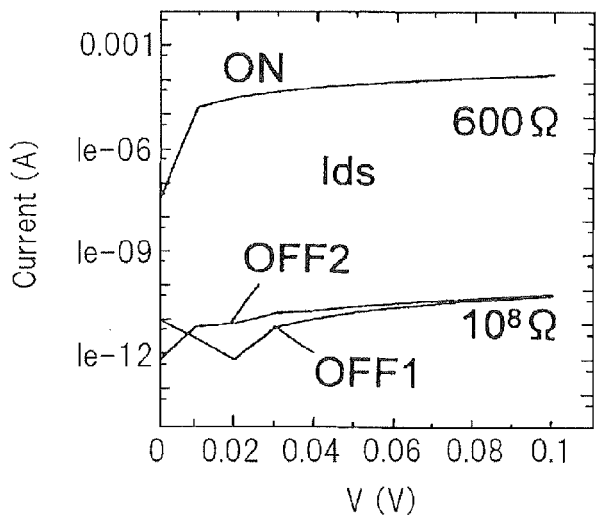
FIG. 32C is a graph showing the voltage-current characteristic when voltage is applied to each terminal of the electrical element shown in FIG. 31.

FIGS. 32A-32C are graphs showing the voltage-current characteristics when voltage is applied to each terminal of the electrical element shown in FIG. 31. The vertical axis shows the current between Source-Drain and the horizontal axis shows the voltage applied across the two electrodes. In the initial state, variable resistance elements 22i and 22j are in the high-resistance state, and the resistance between Source-Drain is therefore $10^8\Omega$ as shown by "OFF1" in FIG. 32C. Variable resistance elements 22i and 22j are in the high-resistance state.

In order to cause variable resistance elements 22i and 22j to transition from the high-resistance state to the low-resistance state, voltage is applied to each of Gate-Drain (hereinbelow indicated as "GD") and Gate-Source (hereinbelow indicated as "GS"). When Gate is fixed to ground, applying a positive voltage to Source and Drain allows a forming operation to be carried out in variable resistance elements 22i and 22j. Current Ids across Drain-Source and current Igs across Gate-Source when the foiming operation is carried out are shown in FIG. 32A. At this time, as can be seen from FIG. 32A, the threshold voltage is 2V. The set current is controlled to 100 uA by a transistor such that excess current does not flow.

Next, measurement of the voltage-current characteristic between Source-Drain to verify whether variable resistance elements 22i and 22j have transitioned to the low-resistance state indicates approximately 600Ω, as shown by "ON" in FIG. 32C. Variable resistance elements 22i and 22j are in the low-resistance state.

On the other hand, in order to cause variable resistance elements 22i and 22j to transition from the low-resistance state to the high-resistance state, voltage is applied across GD and across GS. When Source and Drain are fixed to ground, applying a positive voltage to Gate enables resetting variable resistance elements 22i and 22j. Current Ids and current Igs when the reset operation is carried out are shown in FIG. 32B. When voltage is applied, each of the currents decreases from the vicinity of 1V. In other words, the resistance increases.

Measurement of the voltage-current characteristic between Source-Drain to verify whether variable resistance elements 22i and 22j have transitioned to the high-resistance state indicates approximately $10^8\Omega$, as shown by "OFF2" in FIG. 32C. Variable resistance elements 22i and 22j are in the high-resistance state.

As can be seen from the foregoing explanation, applying voltage to Gate not only enables changing of variable resistance elements 22i and 22j between a high-resistance state such as "OFF1" and "OFF2" shown in FIG. 32C and a low-resistance state such as "ON" shown in FIG. 32C but also enables verification of whether a nonvolatile recording of the changed state was possible.

Figure 33A:
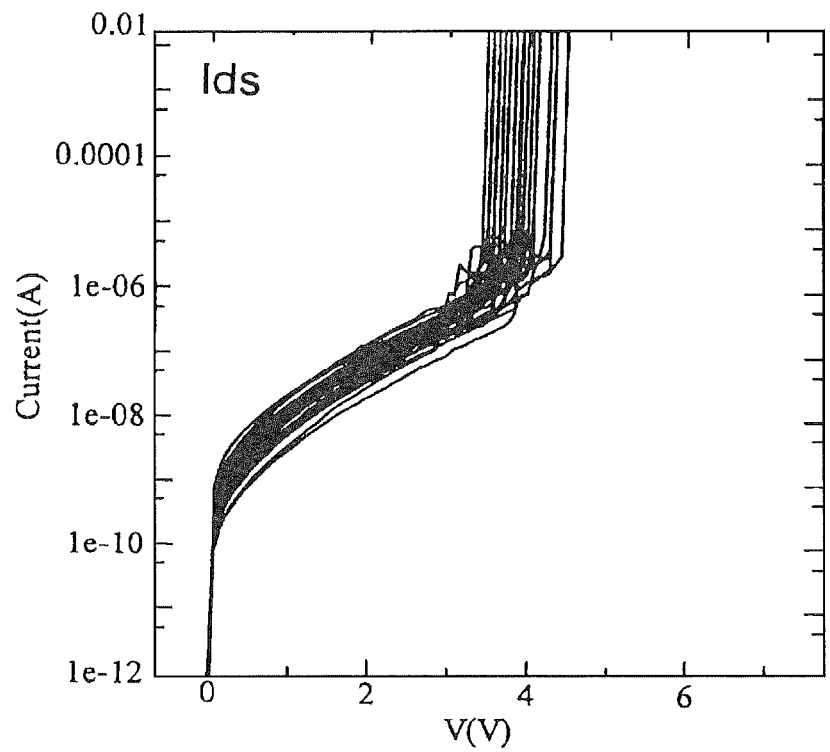
FIG. 33A is a graph showing the measurement result relating to reliability of the semiconductor device of Working Example 9.
Figure 33B:
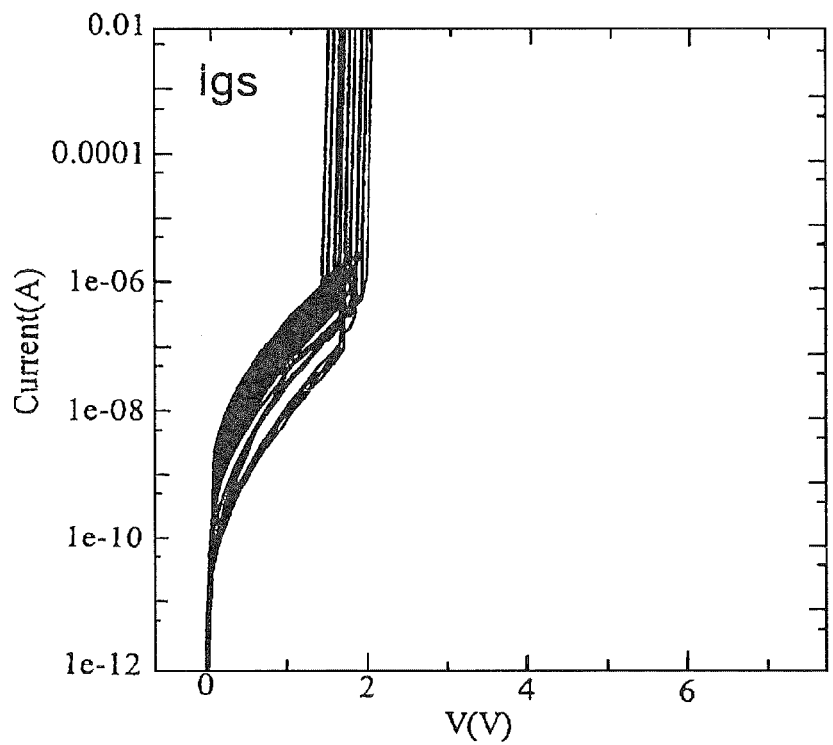
FIG. 33B is a graph showing the measurement result relating to reliability of the semiconductor device of Working Example 9.

Measurement results relating to the reliability of the semiconductor device of the present working example are next described. Reliability as here described is the disturb characteristic. FIGS. 33A and 33B are graphs showing the results of measurements relating to the reliability of the semiconductor device of the present working example and are graphs showing the current-voltage characteristic in a variable resistance element in the high-resistance state at a temperature of 125° C. The vertical axis is current and the horizontal axis is voltage.

FIG. 33A is a graph showing current Ids when voltage is applied across Drain-Source. Looking at FIG. 33A, it can be seen that dielectric breakdown occurs in the neighborhood of a voltage of 4V. FIG. 33B is a graph showing current Igs when voltage is applied across Gate-Source. Looking at FIG. 33B, it can be seen that variable resistance elements 22i and 22j transition to the low-resistance state in the neighborhood of a voltage of 2V.

Based on these measurement results, it can be seen that the withstand pressure across Drain-Source is greater than the programming voltage and that reliability is improved.

Points that should be noted when improving the disturb characteristic are next described. To ensure insulation reliability across Drain-Source, the insulation resistances (OFF resistances) across GS and across GD are preferably as close to equal as possible. When these insulation resistance values differ, splitting of the applied voltage is unbalanced and the possibility arises that high voltage will be applied to the Drain or Source. In other words, opening 160 shown in FIG. 25B is preferably formed as close as possible to the center between Drain-Source.

Working Example 10

The present working example is of a configuration in which the semiconductor device shown in Working Example 6 is provided within the multilayer interconnects of a logic CMOS device.

Figure 34:
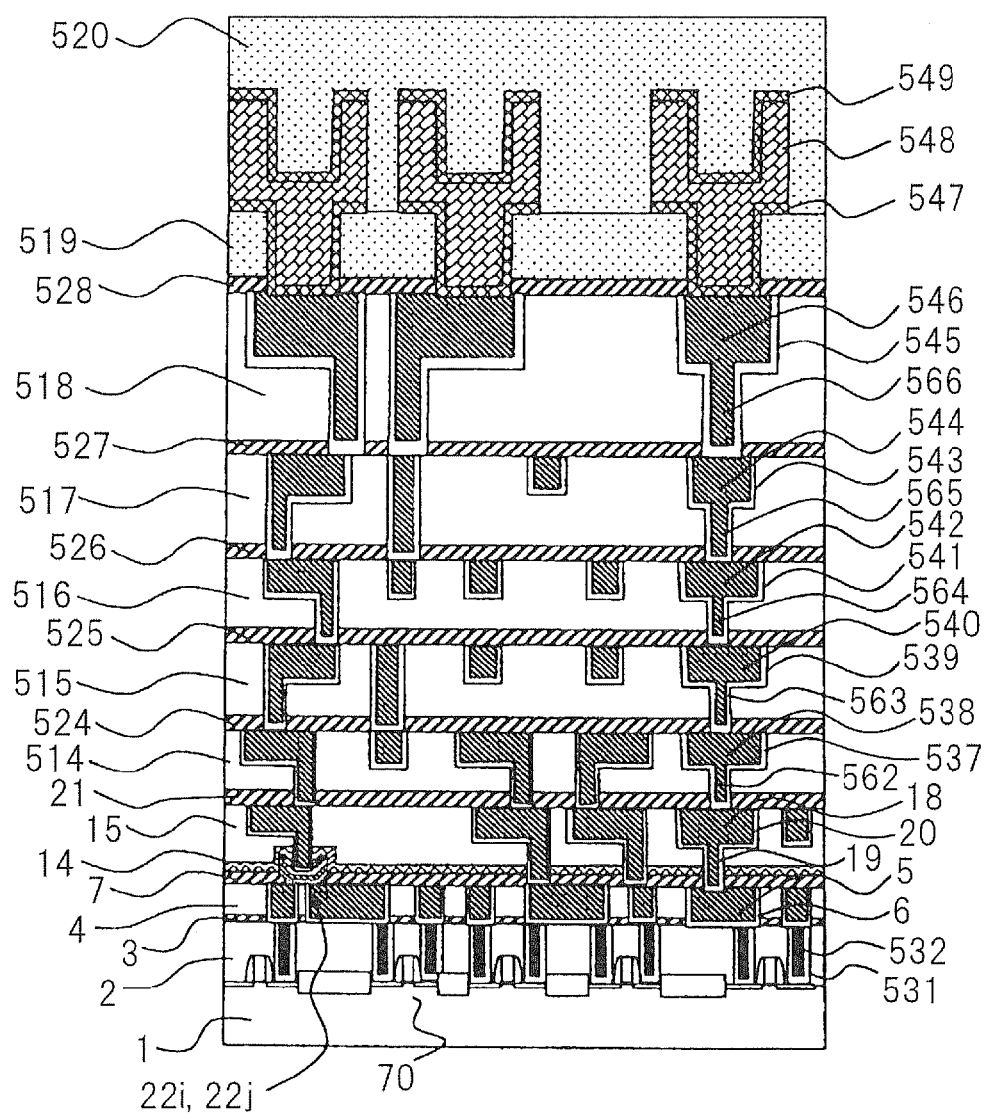
FIG. 34 is a partial sectional view giving a schematic representation of the configuration of the semiconductor device of Working Example 10.

The semiconductor device of the present working example is described with reference to the accompanying figures. FIG. 34 is a partial sectional view giving a schematic representation of the configuration of the semiconductor device of the present working example. Constructions that are the same as in previously described exemplary embodiments or working examples are given the same reference numbers and detailed explanation of these components is here omitted.

The semiconductor device of the present working example is of a configuration that includes a semiconductor element provided on semiconductor substrate 1, multilayer interconnects that include eight interconnect layers, and variable resistance elements 22$i$ and 22$j$ described in Working Example 6. The semiconductor element is, for example, a MOSFET, and in FIG. 34, selection transistor 70 is shown as a transistor for selecting variable resistance elements 22$i$ and 22$j$. The configuration of the multilayer interconnects in the semiconductor device of the present working example is next described.

The multilayer interconnects include an insulation laminated body in which interlayer insulating film 2, barrier insulating film 3, interlayer insulating film 4, insulating barrier film 7, protective insulating film 14, interlayer insulating film 15, barrier insulating film 21, interlayer insulating film 514, barrier insulating film 524, interlayer insulating film 515, barrier insulating film 525, interlayer insulating film 516, barrier insulating film 526, interlayer insulating film 517, barrier insulating film 527, interlayer insulating film 518, barrier insulating film 528, interlayer insulating film 519, and protective insulating film 520 are stacked in order on semiconductor substrate 1.

Contact plug 532 is embedded in an opening provided in interlayer insulating film 2 with a titanium nitride (TiN) film interposed as barrier metal 531. The material of the contact plug 532 is, for example, tungsten. First interconnect 5 is embedded in an interconnect trench provided in barrier insulating film 3 and interlayer insulating film 4 with barrier metal 6 interposed. Plug 19 is embedded in an opening provided in insulating barrier film 7, protective insulating film 14, and interlayer insulating film 15 with barrier metal 20 interposed. Second interconnect 18 is embedded in an interconnect trench provided in interlayer insulating film 15 with barrier metal 20 interposed. Second interconnect 18 and plug 19 are of a unified construction, and the side surfaces and bottom surfaces of this unified construction are covered by barrier metal 20.

Plug 562 is embedded in an opening provided in barrier insulating film 21 and interlayer insulating film 514 with barrier metal 537 interposed. Interconnect 538 is embedded in an interconnect trench provided in interlayer insulating film 514 with barrier metal 537 interposed. Interconnect 538 and plug 562 are of a unified construction, and the side surfaces and bottom surface of this unified construction are covered by barrier metal 537. Plug 563 is embedded in an opening provided in barrier insulating film 524 and interlayer insulating film 515 with barrier metal 539 interposed. Interconnect 540 is embedded in an interconnect trench that is provided in interlayer insulating film 515 with barrier metal 539 interposed. Interconnect 540 and plug 563 are a unified construction, and the side surfaces and bottom surface of this unified construction are covered by barrier metal 539.

Plug 564 is embedded in an opening provided in barrier insulating film 525 and interlayer insulating film 516 with barrier metal 541 interposed. Interconnect 542 is embedded in an interconnect trench provided in interlayer insulating film 516 with barrier metal 541 interposed. Interconnect 542 and plug 564 are a unified construction, and the side surfaces and bottom surfaces of this unified construction are covered by barrier metal 541. Plug 565 is embedded in an opening provided in barrier insulating film 526 and interlayer insulating film 517 with barrier metal 543 interposed. Interconnect 544 is embedded in an interconnect trench provided in interlayer insulating film 517 with barrier metal 543 interposed. Interconnect 544 and plug 565 are a unified construction, and the side surfaces and bottom surfaces of this unified construction are covered by barrier metal 543.

Plug 566 is embedded in an opening provided in barrier insulating film 527 and interlayer insulating film 518 with barrier metal 545 interposed. Interconnect 546 is embedded in an interconnect trench provided in interlayer insulating film 518 with barrier metal 545 interposed. Interconnect 546 and plug 566 are a unified construction, and the side surfaces and bottom surface of this unified construction are covered by barrier metal 545. Interconnect 548 is farmed sandwiched by barrier metal 547 and barrier metal 549 in the opening provided in barrier insulating film 528 and interlayer insulating film 519. Protective insulating film 520 that covers barrier metal 547, barrier metal 549, and interconnect 548 is then formed on interlayer insulating film 519.

The source electrode and drain electrode of selection transistor 70 are electrically connected to uppermost interconnect 548 by way of contact plug 532, plugs 19 and 562-566, first interconnect 5, second interconnect 18, and interconnects 538, 540, 542, 544, and 546.

Insulating barrier film 7 has an opening over first interconnect 5. The wall surfaces of the opening of insulating barrier film 7 are tapered surfaces that widen with increasing distance from first interconnect 5.

Variable resistance elements 22$i$ and 22$j$ are next described. Because the configuration of variable resistance elements 22$i$ and 22$j$ is small in the entire multilayer interconnects shown in FIG. 34, a portion of the reference numbers indicating the configuration have been omitted, and the following explanation is given with reference to the figure of Working Example 6.

In the multilayer interconnects, variable resistance element 22$i$ and 22$j$ are of a configuration in which variable resistance element film 9, first upper electrode 10 and second upper electrode 11 are stacked in order in an opening formed in insulating barrier film 7 on first interconnects 5$a$ and 5$b$ that are the lower electrodes. Hard-mask film 12 is formed on second upper electrode 11, and the upper surface and side surfaces of the laminated body composed of variable resistance element film 9, first upper electrode 10, second upper electrode 11, and hard-mask film 12 are covered by protective insulating film 14.

Variable resistance elements 22$i$ and 22$j$ are of a configuration in which variable resistance element film 9 is interposed between first interconnects 5$a$ and 5$b$ that are the lower electrodes and first upper electrode 10 and second upper electrode 11 that are electrically connected to second interconnect 18 by way of plug 19. Variable resistance element film 9 is formed on the upper surfaces of first interconnects 5$a$ and 5b, the tapered surfaces of the opening of insulating barrier film 7, and the upper surface of insulating barrier film 7. In variable resistance elements 22i and 22j, variable resistance element film 9 and first interconnects 5a and 5b are directly connected in the region of the opening formed in insulating barrier film 7, and plug 19 and second upper electrode 11 are connected by way of barrier metal 20 on second upper electrode 11. Plug 19 is embedded in an opening formed in interlayer insulating film 15, protective insulating film 14, and hard-mask film 12 with barrier metal 20 interposed.

The material of interconnects 538, 540, 542, 544, and 546 is, for example, copper. The material of plugs 562-566 is, for example, copper. Barrier metal 537, 539, 541, 543, and 545 is, for example, a laminated film of tantalum (Ta)/tantalum nitride (TaN). Interlayer insulating films 514-518 are, for example, hydrogenated silicon oxycarbide (SiOCH) films having a relative dielectric constant no greater than 3. A silicon nitride (SiN) film can be used for insulating barrier film 7 on first interconnects 5, and a silicon carbon nitride (SiCN) film having a low relative dielectric constant can be used for barrier insulating films 524-528 other than insulating barrier film 7.

The material of interconnect 548 of the uppermost layer is, for example, aluminum (Al)-copper (Cu). Barrier metal 547 and 549 are laminated films of titanium (Ti)/titanium nitride (TiN). Interlayer insulating film 519 is a silicon oxide film. Protective insulating film 520 is, for example, a silicon oxynitride film.

Variable resistance elements 22i and 22j in the semiconductor device of the present working example can be formed by the same manufacturing method as the manufacturing method described in the fifth exemplary embodiment or Working Example 9, and processes for which explanation is omitted can use typical methods in the technical field of the present invention. In addition, the methods of forming the interconnects from interconnect 538 to interconnect 546 and plugs are the same as for first interconnect 5, plug 19, and second interconnect 18, and detailed explanation is therefore here omitted.

Although a case was described in the present working example in which variable resistance elements 22i and 22j are applied that are of the same configuration as the semiconductor device described in Working Example 6, the present invention is not limited to this form and variable resistance elements that were described in the other exemplary embodiments or working examples may be applied.

According to the present working example, not only can the same effects be exhibited as in the second exemplary embodiment, but by making the construction of the variable resistance elements as the construction in Working Example 6, variable resistance elements can be mounted within multilayer copper interconnects of a leading-edge ULSI logic product.

As one exemplary embodiment of the present invention, if a semiconductor device has an electrical element that has at least two bipolar variable resistance elements inserted in a signal path, the same-polarity electrodes of these variable resistance elements being connected together, and further, that applies input to and receives output from the two unconnected electrodes, the semiconductor device can be applied to any type of device and has no limitations on the potential for its use. In addition, even if the construction of the complementary variable resistance elements uses a laminated construction realized with other films, the present invention is not in any way limited. The configuration of an exemplary embodiment of the present invention has an electrical element that has at least two bipolar variable resistance elements, the same-polarity electrodes of the variable resistance elements being connected together, and that applies input to and receives output from the two unconnected electrodes.

In addition, although the case of bipolar variable resistance elements was described in the above-described exemplary embodiments and working examples, the two variable resistance elements can be miniaturized and a high-density arrangement of variable resistance elements can be realized even when unipolar variable resistance elements are applied.

The above statement is expressed in specific terms below. In the above-described exemplary embodiments and working examples, the manufacturing device technology of semiconductors having CMOS circuits that belong to the technical field that is the background of the invention realized by the inventors of the present application has been described in detail and configurations in which variable resistance elements are formed inside copper multilayer interconnects on a semiconductor substrate have been described as examples of the application of the present invention. However, the present invention is not limited to this technology and can also be applied to, for example, DRAM (Dynamic Random Access Memory), SRAM (Static Random Access Memory), flash memory, FRAM (Ferro Electric Random Access Memory), MRAM (Magnetic Random Access Memory), variable resistance memory, semiconductor products having memory circuits such as bipolar transistors, semiconductor products having logic circuits such as microprocessors, or copper interconnects of boards and packages that simultaneously mount these components. In addition, the present invention can be applied to connecting electronic circuit devices, optical circuit devices, quantum circuit devices, micro-machines, and MEMS (Micro Electro Mechanical Systems) to semiconductor devices. In the above-described exemplary embodiments and working examples, explanation focuses on working examples in switching capabilities, but the present invention can also be used in memory elements that use both nonvolatility and variable resistance characteristics.

In addition, the construction of the variable resistance elements according to the present invention can be verified from the device after manufacture. More specifically, by observing a section of the device that is the object of observation by TEM (Transmission Electron Microscope), the use of copper interconnects in the multilayer interconnects can be verified, and when variable resistance elements are mounted, it can be verified by observation that the lower surfaces of the variable resistance elements are copper interconnects, that the copper interconnects serve as the lower electrodes, and whether there are openings between two different lower-layer interconnects, and it can be verified whether the construction is the construction described in the present invention. Still further, performing a chemical composition analysis by, for example, EDX (Energy Dispersive X-ray Spectroscopy) and EELS (Electron Energy-Loss Spectroscopy) in addition to TEM enables verification of whether these are materials included in the present invention.

As an exemplary advantage according to the invention, when a voltage no greater than the threshold voltage of the variable resistance elements is applied, erroneous writing and malfunctioning of the variable resistance elements can be prevented. In addition, as one example of the effect of the present invention, miniaturizing the construction of the variable resistance elements enables a higher-density arrangement of the variable resistance elements. Accordingly, a semiconductor device having higher performance and greater reliability can be realized.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims. For example, any one of ordinary skill in the art, having read the explanation of the above-described exemplary embodiments and working examples, can easily make numerous modifications and substitutions by constituent elements and technology that are equivalent to the content contained in these exemplary embodiments and working examples, but such modifications and substitutions belong to the scope of the invention of the present application.

Further Exemplary Embodiment 1

A semiconductor device comprising multilayer interconnects and two variable resistance elements that are provided among said multilayer interconnections and that include first electrodes, second electrodes, and a variable resistance element film that is interposed between these electrodes; either the electrode types of said first electrodes or the electrode types of said second electrodes of said two variable resistance elements being unified.

Further Exemplary Embodiment 2

The semiconductor device as described in Further exemplary embodiment 1, wherein: said two variable resistance elements are bipolar variable resistance elements; said first electrodes contain a material that is the supply source of metal ions; said second electrodes are made up of a material that is less prone to ionization than said first electrodes; and said variable resistance element film is an ionic conduction layer capable of conducting said metal ions.

Further Exemplary Embodiment 3

The semiconductor device as described in Further exemplary embodiment 2, wherein: said second electrodes of said two variable resistance elements are of a configuration that is unified; said first electrodes of said two variable resistance elements are formed by one interconnect layer of said multilayer interconnects; an insulating barrier film having one opening is provided between said first electrodes of said two variable resistance elements and said variable resistance element film; and said variable resistance element film is connected to each of said first electrodes of said two variable resistance elements by way of said opening.

Further Exemplary Embodiment 4

The semiconductor device as described in Further exemplary embodiment 3, wherein said variable resistance element film contacts the upper surface and side surface of each of said first electrodes of said two variable resistance elements.

Further Exemplary Embodiment 5

The semiconductor device as described in Further exemplary embodiment 2, wherein said ionic conduction layer contains any one from among SiOxCy, TaSiOx, TaOx, ZrOx, HrOx, SiOx, TiOx, CxHy, CxHySiaOb, and an organic film.

FURTHER Exemplary Embodiment 6

The semiconductor device as described in Further exemplary embodiment 2, wherein the chief component of the material of said first electrode is Cu, and the chief component of the material of said second electrodes is Ru or Pt.

Further Exemplary Embodiment 7

The semiconductor device as described in Further exemplary embodiment 3, wherein the material of said insulating barrier film is any one from among SiC, SiCN, and SiN.

Further Exemplary Embodiment 8

The semiconductor device as described in Further exemplary embodiment 2, wherein said second electrode is of a configuration in which a first upper electrode and a second upper electrode are laminated in order on said variable resistance element film, the material of said first upper electrode being ruthenium or platinum, and the material of said second upper electrode being any from among Ta, Ti, TaN, TiN, W, and Al.

Further Exemplary Embodiment 9

A manufacturing method of a semiconductor device having multilayer interconnects, the manufacturing method including: a step of forming an insulating barrier film on two first interconnects provided in one interconnect layer among the interconnect layers included in said multilayer interconnects; an opening step of forming in said insulating barrier film a first opening that exposes at least a portion of the upper surfaces of these two first interconnects, said opening being provided in its wall surfaces with tapered surfaces that widen as distance increases in a perpendicular direction from said two first interconnects; a variable resistance element film forming step of forming said variable resistance element film on surfaces that include at least the bottom surface and side surfaces of said first opening; a second electrode forming step of forming second electrodes on said variable resistance element film; and a step of forming a second interconnect for connecting said second electrodes by means of, of said multilayer interconnects, an interconnect layer that differs from the interconnect layer in which said two first interconnects are formed.

Further Exemplary Embodiment 10

The manufacturing method of a semiconductor device as described in Further exemplary embodiment 9, wherein said opening forming step comprises: a step of forming a hard-mask film having a second opening on said insulating barrier film; and a step of forming said first opening in said insulating barrier film by subjecting said insulating barrier film that is exposed in said second opening to reactive dry etching with said hard-mask film as a mask.

Further Exemplary Embodiment 11

The manufacturing method of a semiconductor device as described in Further exemplary embodiment 9, wherein: said variable resistance element film forming step includes a plasma CVD method that uses organic silica raw material; said second electrode forming step includes a plasma ALD method that uses organic metal Ru raw material; and at least said variable resistance element film is not exposed to air between said variable resistance element film forming step and said second electrode forming step.

Further Exemplary Embodiment 12

The manufacturing method of a semiconductor device as described in Further exemplary embodiment 11, wherein said variable resistance element film is subjected to a plasma process that uses any one gas from among $H_2$, He, Ar, and $N_2$ between said variable resistance element film forming step and said second electrode forming step.

This application is based upon and claims the benefit of priority from Japanese Patent Application No. 2010-137369 filed on Jun. 16, 2010, the content of which is incorporated by reference.

EXPLANATION OF REFERENCE NUMBERS 2, 4, 15, 17 interlayer insulating film
3, 21 barrier insulating film
5, 5a, 5b first interconnect
6, 6a, 6b, 20 barrier metal
7 insulating barrier film
9, 9a, 9b variable resistance element film
10 first upper electrode (upper electrode)
11 second upper electrode
12 hard-mask film
14, 24 protective insulating film
18 second interconnect
19 plug
22a-22j, 103a, 103b variable resistance element
70 selection transistor
111-116 transistor
131, 132 electrical element

The invention claimed is:

1. A semiconductor device, comprising:
multilayer interconnects; and
two variable resistance elements that are provided among said multilayer interconnects and that include first electrodes, second electrodes, and a variable resistance element film that is interposed between these electrodes, wherein:
electrode types of said first electrodes or electrode types of said second electrodes of said two variable resistance elements are unified,
said two variable resistance elements are bipolar variable resistance elements and are connected in a series,
said two variable resistance elements are made of an electrical element that is provided in a signal path,
same-polarity electrodes of said two variable resistance elements are connected together, and
in the two unconnected electrodes of said two variable resistance elements, one electrode is an input terminal and the other electrode is an output terminal.

2. The semiconductor device according to claim 1, as comprising a crossbar switch that takes said electrical element as a switch element.

3. The semiconductor device according to claim 2, wherein:
said first electrodes comprise a material that serves as a supply source of metal ions,
said second electrodes comprise a material that is less prone to ionization than said first electrodes, and
said variable resistance element film comprises an ionic conduction layer capable of conducting said metal ions.

4. The semiconductor device according to claim 2, wherein a plurality of said electrical elements are arranged in a linear form and said semiconductor device further comprises:
a drain interconnect that is connected to a plurality of said input terminals of said plurality of said electrical elements;
a plurality of source interconnects that are connected to a plurality of said output terminals corresponding to said plurality of electrical elements; and
a plurality of gate interconnects that are connected to a plurality of said portions corresponding to said plurality of electrical elements.

5. The semiconductor device according to claim 2, wherein a plurality of said electrical elements are arranged in a matrix form, and said semiconductor device further comprises:
a drain interconnect that is connected to said input terminals whose first electrical elements are arranged along a first direction, said first electrical elements being selected from among said plurality of said electrical elements;
a source interconnect that is connected to said output terminals whose second electrical elements are arranged along a second direction, said second electrical elements being selected from among said plurality of said electrical elements, said second direction being perpendicular to said first direction; and
a gate interconnect that is connected to said portions whose said first electrical elements.

6. The semiconductor device according to claim 1, wherein:
said first electrodes comprise a material that is serves as a supply source of metal ions,
said second electrodes comprise a material that is less prone to ionization than said first electrodes, and
said variable resistance element film comprises an ionic conduction layer capable of conducting said metal ions.

7. The semiconductor device according to claim 6, wherein:
said first electrodes of said two variable resistance elements are of a construction that is unified and formed by one interconnect layer of any of said multilayer interconnects,
an insulating barrier film having two openings is provided between said first electrodes of said two variable resistance elements and said variable resistance element film, and
said first electrodes of said two variable resistance elements contact said variable resistance element film by way of said two openings.

8. The semiconductor device according to claim 6, wherein:
said second electrodes of said two variable resistance elements are of a configuration that is unified,
said first electrodes of said two variable resistance elements are formed by any one interconnect layer of said multilayer interconnects,
an insulating barrier film having two openings is provided between said first electrodes of said two variable resistance elements and said variable resistance element film, and
each of said first electrodes of said two variable resistance elements contacts said variable resistance element film by way of a respective opening of said two openings.

9. The semiconductor device according to claim 6, wherein:
said second electrodes of said two variable resistance elements are of a configuration that is unified,
said first electrodes of said two variable resistance elements are formed by any one interconnect layer of said multilayer interconnects,
an insulating barrier film having one opening is provided between said first electrodes of said two variable resistance elements and said variable resistance element film, said one opening being shared by said two variable resistance elements, and said variable resistance element film contacts each of said first electrodes of said two variable resistance elements by way of said one opening.

10. The semiconductor device according to claim 1, further comprising:
a first transistor that is connected to said input terminal and that controls a voltage which is applied to said input terminal;
a second transistor that is connected to a portion, in which the same-polarity electrodes of said two variable resistance elements are connected, and that controls a voltage which is applied to said portion; and
a third transistor that is connected to said output terminal and that controls a voltage which is applied to said output terminal.

11. The semiconductor device according to claim 10, wherein:
when said first transistor applies a first voltage to said input terminal and said third transistor applies said first voltage to said output terminal and said second transistor applies a second voltage to said portion, with said second voltage being different from said first voltage and said second voltage being equal to or greater than a predetermined threshold voltage, then said electrical element transitions from a first state to a second state, and
when said first transistor applies said second voltage to said input terminal and said third transistor applies said second voltage to said output terminal and said second transistor applies said first voltage to said portion, then said electrical element transitions from said second state to said first state.

12. The semiconductor device according to claim 1, wherein the same-polarity electrodes of said two variable resistance elements are placed opposite to each other.

13. A semiconductor device, comprising:
two serially-interconnected bipolar variable resistance elements, each said bipolar variable resistance element including a first electrode, a second electrode, and a variable resistance element film interposed between said first and second electrodes,
wherein same-polarity electrodes of said two variable resistance elements are connected together to form a unified common electrode and, of the two remaining electrodes of said two variable resistance elements that are not connected together, one remaining electrode is an input terminal and the other remaining electrode is an output terminal.

14. The semiconductor device according to claim 13, further comprising:
a first transistor that is connected to said input terminal and that controls a voltage which is applied to said input terminal;
a second transistor that is connected to a portion, in which the same-polarity electrodes of said two variable resistance elements are connected, and that controls a voltage which is applied to said portion; and
a third transistor that is connected to said output terminal and that controls a voltage which is applied to said output terminal.

15. The semiconductor device according to claim 14, wherein:
when said first transistor applies a first voltage to said input terminal and said third transistor applies said first voltage to said output terminal and said second transistor applies a second voltage to said portion, with said second voltage being different from said first voltage and said second voltage being equal to or greater than a predetermined threshold voltage, then said electrical element transitions from a first state to a second state, and
when said first transistor applies said second voltage to said input terminal and said third transistor applies said second voltage to said output terminal and said second transistor applies said first voltage to said portion, then said electrical element transitions from said second state to said first state.

16. The semiconductor device according to claim 13, wherein a plurality of said electrical elements are arranged in a linear form and said semiconductor device further comprises:
a drain interconnect that is connected to a plurality of said input terminals of said plurality of said electrical elements;
a plurality of source interconnects that are connected to a plurality of said output terminals corresponding to said plurality of electrical elements; and
a plurality of gate interconnects that are connected to a plurality of said portions corresponding to said plurality of electrical elements.

17. The semiconductor device according to claim 13, wherein a plurality of said electrical elements are arranged in a matrix form, and said semiconductor device further comprises:
a drain interconnect that is connected to said input terminals whose first electrical elements are arranged along a first direction, said first electrical elements being selected from among said plurality of said electrical elements;
a source interconnect that is connected to said output terminals whose second electrical elements are arranged along a second direction, said second electrical elements being selected from among said plurality of said electrical elements, said second direction being perpendicular to said first direction; and
a gate interconnect that is connected to said portions whose said first electrical elements.

18. The semiconductor device according to claim 13, wherein:
said first electrodes comprise a material that serves as a supply source of metal ions,
said second electrodes comprise a material that is less prone to ionization than said first electrodes, and
said variable resistance element film comprises an ionic conduction layer capable of conducting said metal ions.

* * * * *